(12) United States Patent
Sun et al.

(10) Patent No.: US 11,799,554 B2
(45) Date of Patent: Oct. 24, 2023

(54) LASER MODULE FOR OPTICAL DATA COMMUNICATION SYSTEM WITHIN SILICON INTERPOSER

(71) Applicant: Ayar Labs, Inc., Santa Clara, CA (US)

(72) Inventors: Chen Sun, Berkeley, CA (US); Roy Edward Meade, Lafayette, CA (US); Mark Wade, Oakland, CA (US); Alexandra Wright, San Francisco, CA (US); Vladimir Stojanovic, Berkeley, CA (US); Rajeev Ram, San Francisco, CA (US); Milos Popovic, San Francisco, CA (US); Derek Van Orden, San Francisco, CA (US); Michael Davenport, San Francisco, CA (US)

(73) Assignee: Ayar Labs, Inc., Santa Clara, CA (US)

( * ) Notice: Subject to any disclaimer, the term of this patent is extended or adjusted under 35 U.S.C. 154(b) by 0 days.

(21) Appl. No.: 17/866,482

(22) Filed: Jul. 16, 2022

(65) Prior Publication Data
US 2022/0360336 A1 Nov. 10, 2022

Related U.S. Application Data

(60) Continuation of application No. 16/995,816, filed on Aug. 18, 2020, now Pat. No. 11,394,465, which is a
(Continued)

(51) Int. Cl.
*H04B 10/50* (2013.01)
*H01S 5/40* (2006.01)
(Continued)

(52) U.S. Cl.
CPC ......... *H04B 10/504* (2013.01); *H01S 5/0268* (2013.01); *H01S 5/02325* (2021.01);
(Continued)

(58) Field of Classification Search
CPC .. H04B 10/504; H04B 10/506; H04B 10/801; H01S 5/02325; H01S 5/0268;
(Continued)

(56) References Cited

U.S. PATENT DOCUMENTS 9,496,431 B2 * 11/2016 Krasulick .......... G02B 6/12004
11,256,029 B2 * 2/2022 Kannan .................... G02B 6/13
(Continued)

*Primary Examiner* — Ellen E Kim
(74) *Attorney, Agent, or Firm* — Penilla IP, APC

(57) ABSTRACT

An interposer device includes a substrate that includes a laser source chip interface region, a silicon photonics chip interface region, an optical amplifier module interface region. A fiber-to-interposer connection region is formed within the substrate. A first group of optical conveyance structures is formed within the substrate to optically connect a laser source chip to a silicon photonics chip when the laser source chip and the silicon photonics chip are interfaced to the substrate. A second group of optical conveyance structures is formed within the substrate to optically connect the silicon photonics chip to an optical amplifier module when the silicon photonics chip and the optical amplifier module are interfaced to the substrate. A third group of optical conveyance structures is formed within the substrate to optically connect the optical amplifier module to the fiber-to-interposer connection region when the optical amplifier module is interfaced to the substrate.

20 Claims, 31 Drawing Sheets

Related U.S. Application Data division of application No. 16/194,250, filed on Nov. 16, 2018, now Pat. No. 10,749,603, which is a continuation-in-part of application No. 15/650,586, filed on Jul. 14, 2017, now Pat. No. 10,771,160.

(60) Provisional application No. 62/589,520, filed on Nov. 21, 2017, provisional application No. 62/362,551, filed on Jul. 14, 2016.

(51) Int. Cl.
  *H01S 5/026* (2006.01)
  *H04B 10/80* (2013.01)
  *H01S 5/02325* (2021.01)
  *H01S 5/024* (2006.01)
  *H01S 5/50* (2006.01)
  *G02B 6/42* (2006.01)

(52) U.S. Cl.
  CPC .......... *H01S 5/4012* (2013.01); *H01S 5/4087* (2013.01); *H04B 10/506* (2013.01); *H04B 10/801* (2013.01); *G02B 6/42* (2013.01); *H01S 5/02476* (2013.01); *H01S 5/50* (2013.01)

(58) Field of Classification Search
  CPC .. H01S 5/4012; H01S 5/4087; H01S 5/02476; H01S 5/50; G02B 6/42
  See application file for complete search history.

(56) References Cited

U.S. PATENT DOCUMENTS

| | | | |
|---|---|---|---|
| 11,360,278 B2* | 6/2022 | Doerr | G02B 6/4272 |
| 2013/0182996 A1* | 7/2013 | Shastri | G02B 6/3886 29/846 |
| 2014/0010498 A1* | 1/2014 | Verslegers | G02B 6/30 385/37 |
| 2014/0064659 A1* | 3/2014 | Doerr | G02B 6/12 385/14 |
| 2014/0203175 A1* | 7/2014 | Kobrinsky | H04B 10/25 250/214.1 |
| 2015/0063747 A1* | 3/2015 | Chen | G02B 6/3636 385/14 |
| 2016/0011438 A1* | 1/2016 | Reano | G02B 6/12002 385/11 |
| 2017/0207600 A1* | 7/2017 | Klamkin | H01S 5/141 |
| 2018/0013494 A1* | 1/2018 | Young | G02B 6/12 |
| 2019/0331866 A1* | 10/2019 | Mekis | G02B 6/4208 |

* cited by examiner

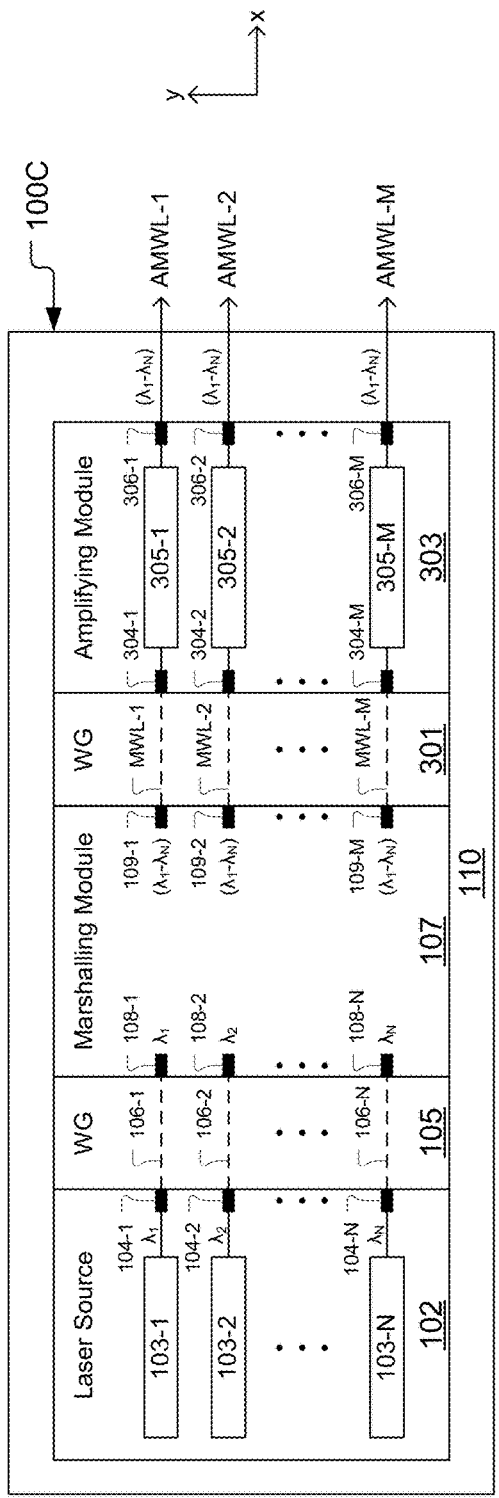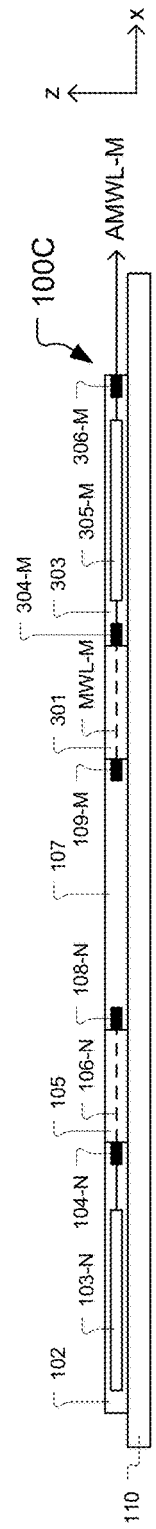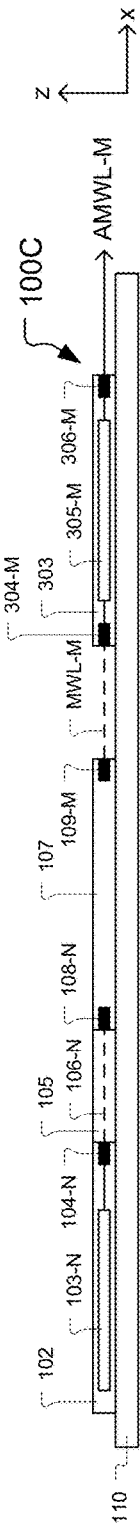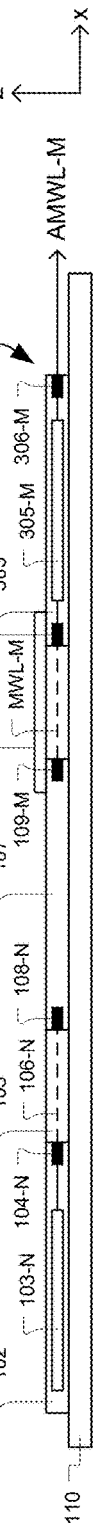
Fig. 3A
Fig. 3B
Fig. 3C
Fig. 3D

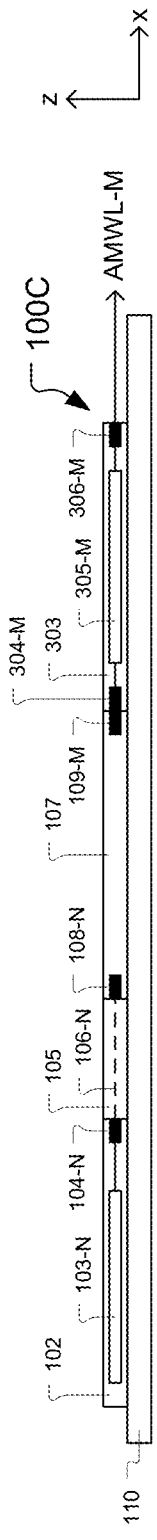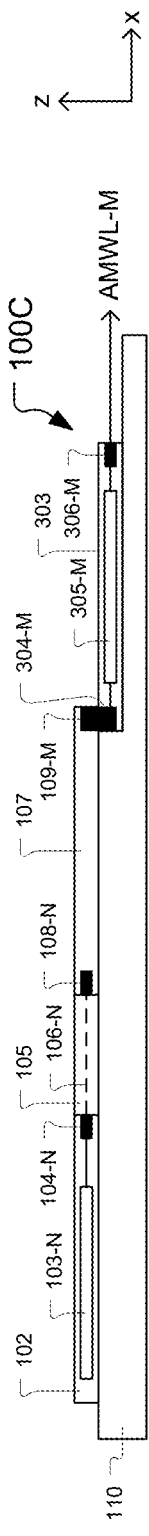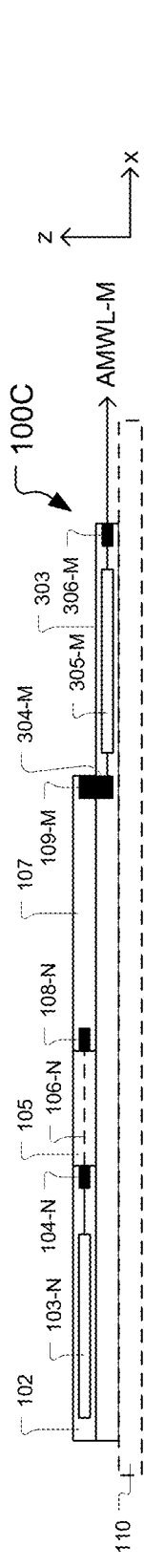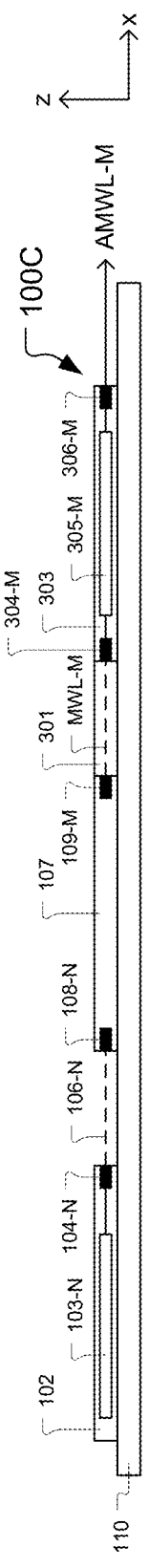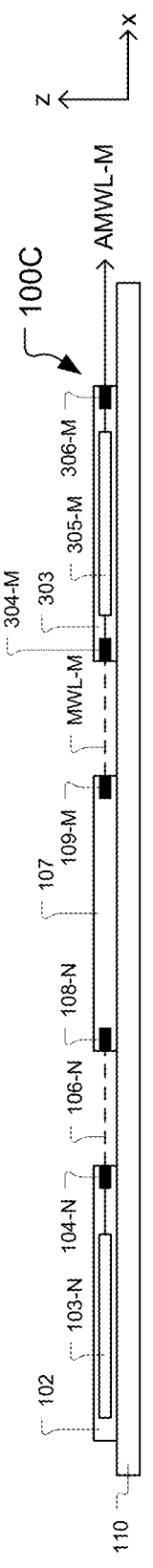

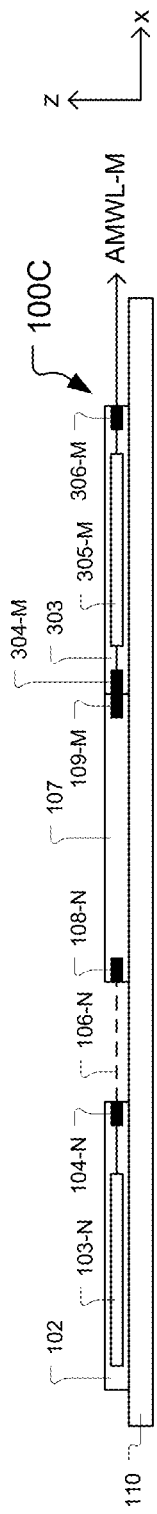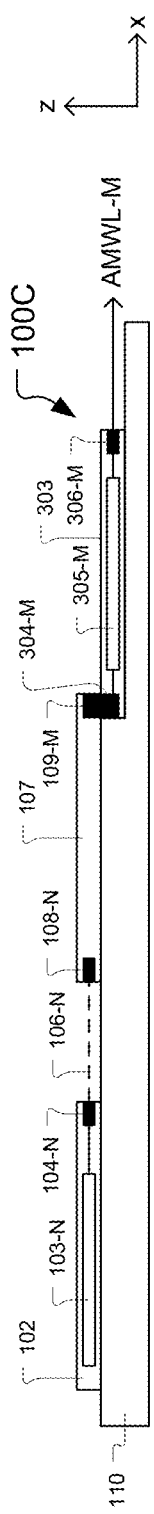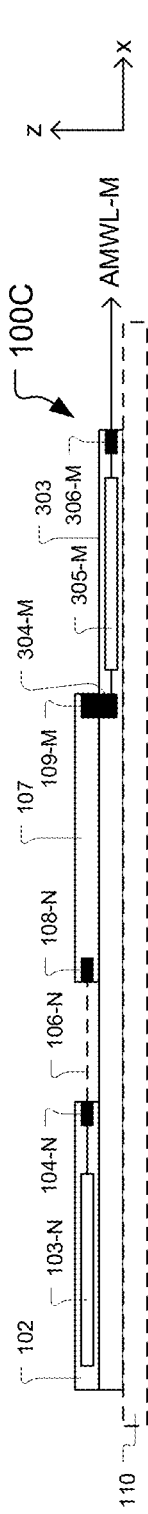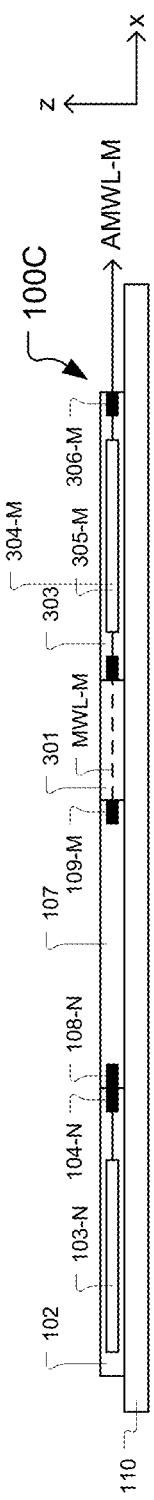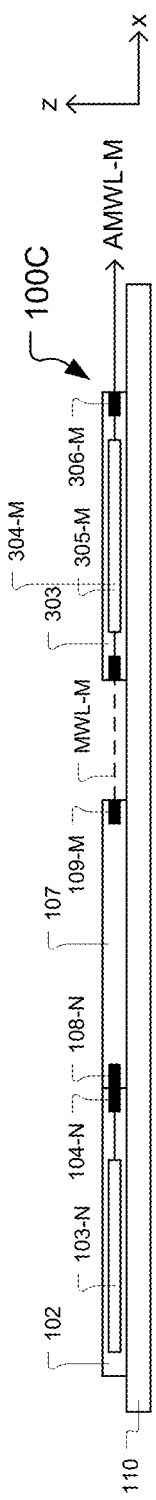

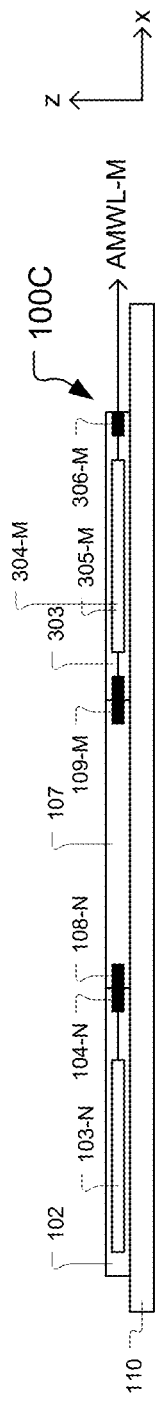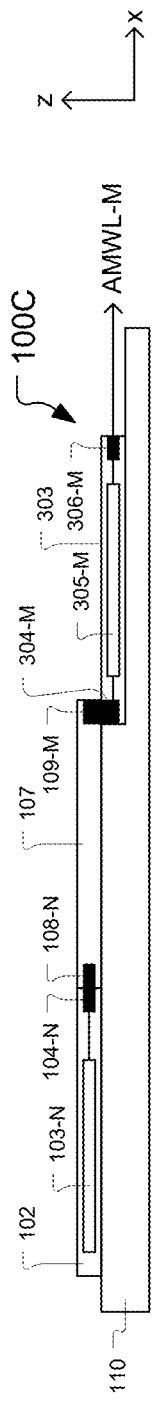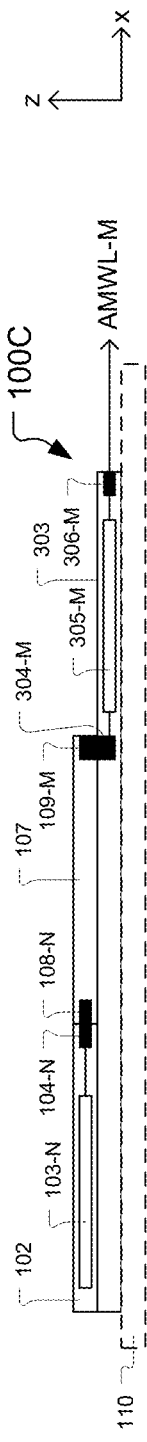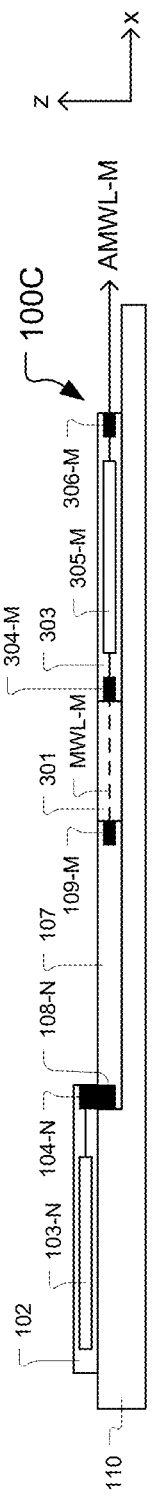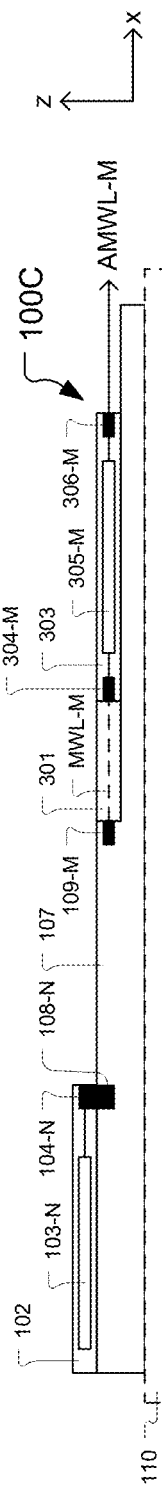

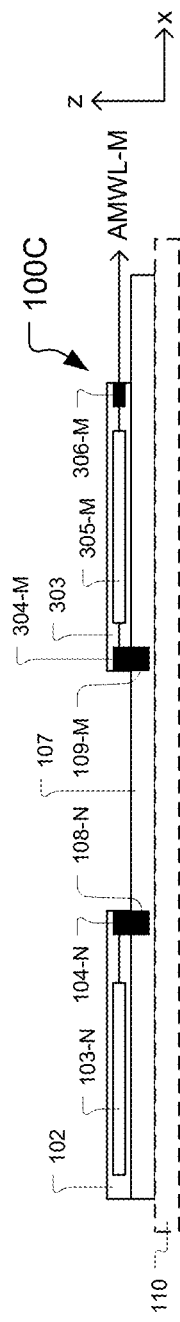
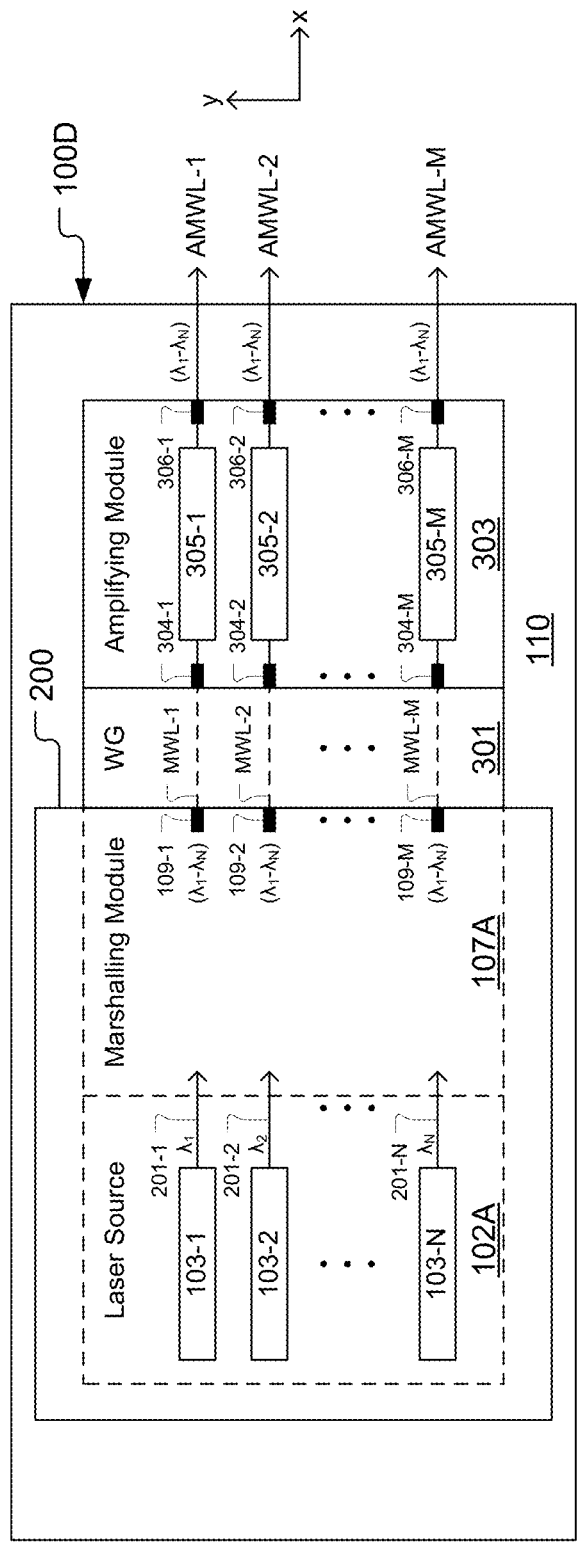
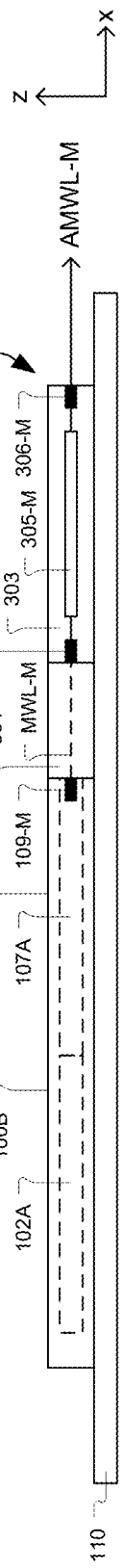
Fig. 3Y
Fig. 4A
Fig. 4B

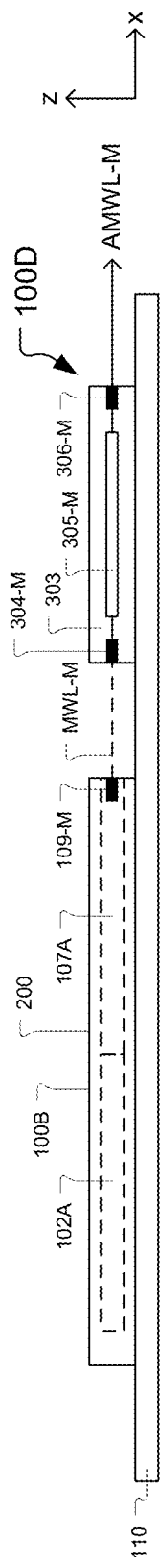
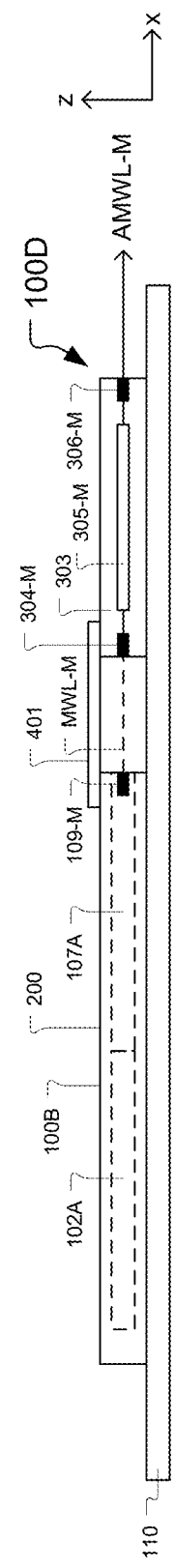
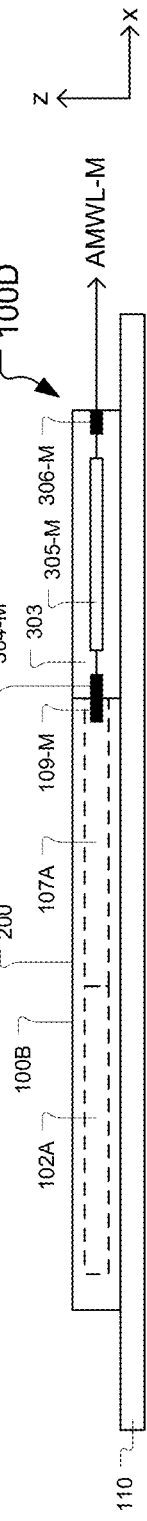
Fig. 4C
Fig. 4D
Fig. 4E

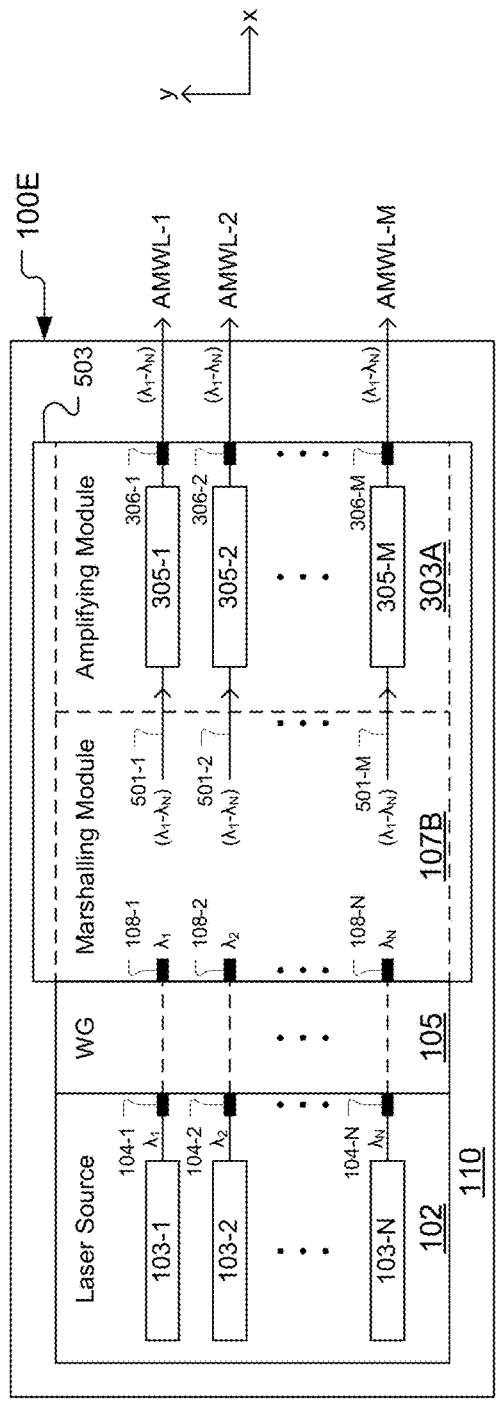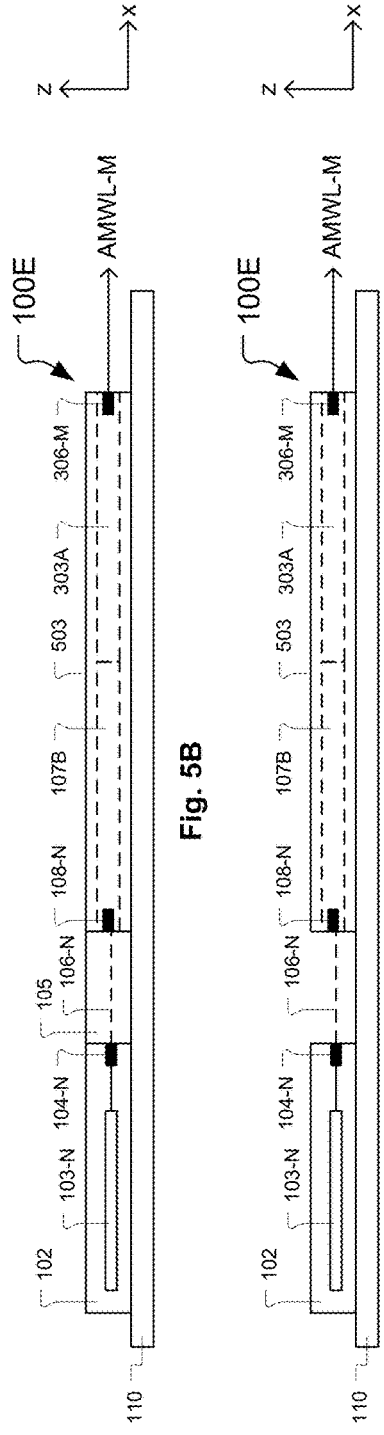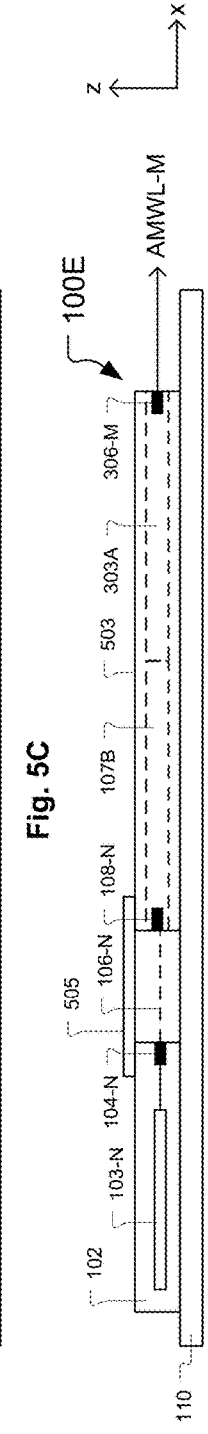
Fig. 5A
Fig. 5B
Fig. 5C
Fig. 5D

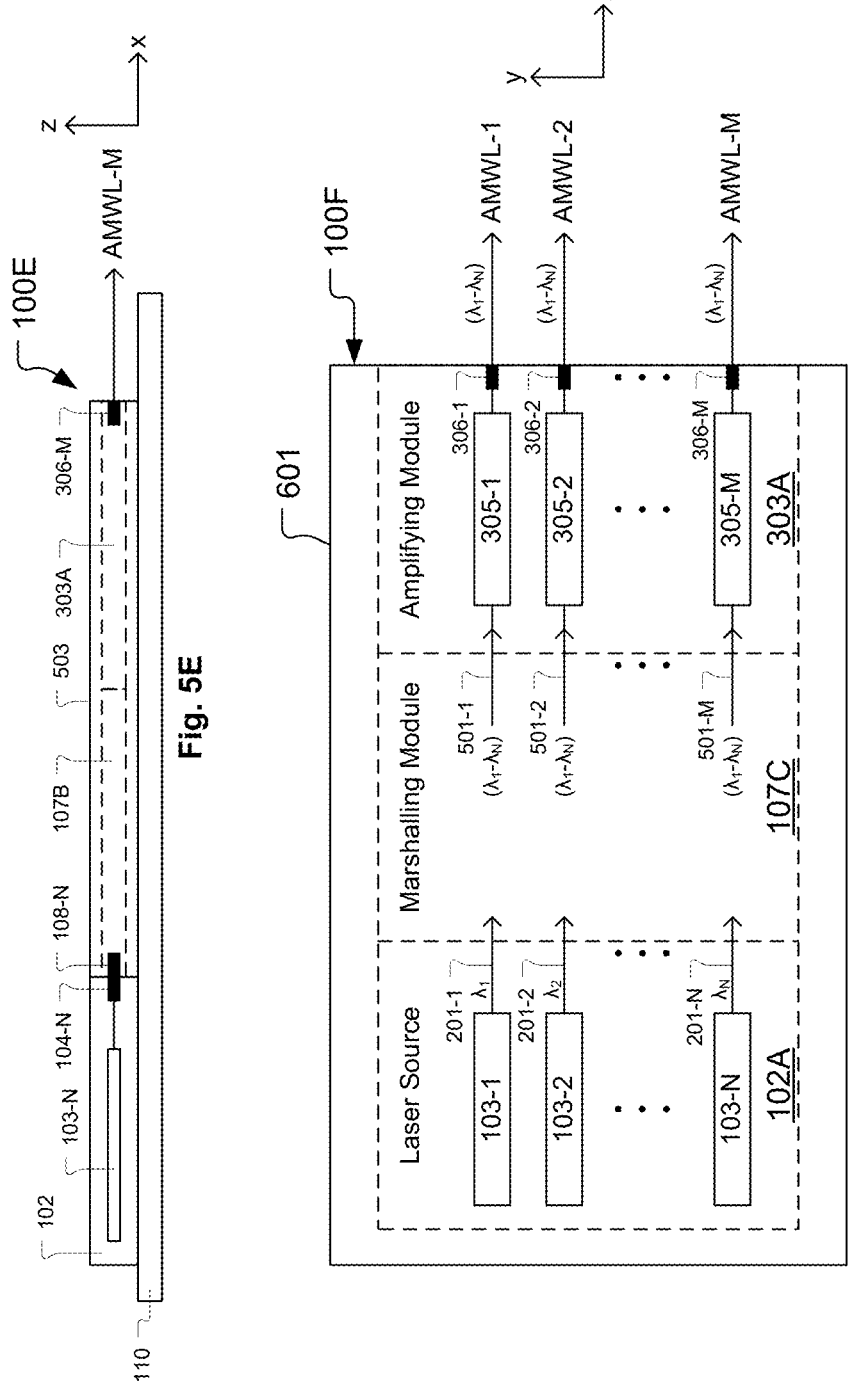
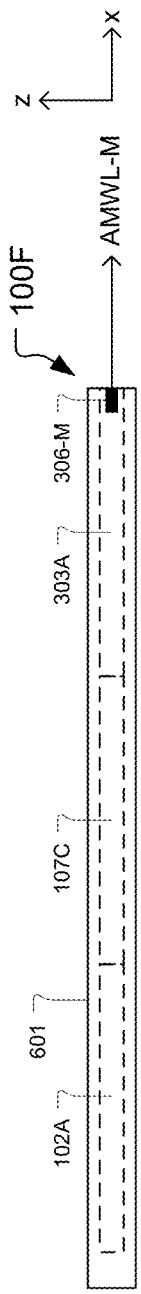
Fig. 5E
Fig. 6A
Fig. 6B (Top View)

(End View)

(Detail A from Fig. 23A)

(Detail B from Fig. 23B)

LASER MODULE FOR OPTICAL DATA COMMUNICATION SYSTEM WITHIN SILICON INTERPOSER

CLAIM OF PRIORITY

This application is a continuation application under 35 U.S.C. 120 of prior U.S. application Ser. No. 16/995,816, filed Aug. 18, 2020, with is a divisional application under 35 U.S.C. 121 of prior U.S. application Ser. No. 16/194,250, filed Nov. 16, 2018, issued as U.S. Pat. No. 10,749,603, on Aug. 18, 2020, which claims priority under 35 U.S.C. 119(e) to U.S. Provisional Patent Application No. 62/589,520, filed Nov. 21, 2017, and which is a continuation-in-part application under 35 U.S.C. 120 of U.S. patent application Ser. No. 15/650,586, filed Jul. 14, 2017, issued as U.S. Pat. No. 10,771,160, on Sep. 8, 2020, which claims priority under 35 U.S.C. 119(e) to U.S. Provisional Patent Application No. 62/362,551, filed Jul. 14, 2016. The disclosure of each above-identified application is incorporated herein by reference in its entirety for all purposes.

BACKGROUND

1. Field of the Invention

The present invention relates to optical data communication.

2. Description of the Related Art

Optical data communication systems operate by modulating laser light to encode digital data patterns. The modulated laser light is transmitted through an optical data network from a sending node to a receiving node. The modulated laser light having arrived at the receiving node is de-modulated to obtain the original digital data patterns. Therefore, implementation and operation of optical data communication systems is dependent upon having reliable and efficient laser light sources and optical processing devices. Also, it is desirable for the laser light sources and optical processing devices of optical data communication systems to have a minimal form factor and be designed as efficiently as possible with regard to expense and energy consumption. It is within this context that the present invention arises.

SUMMARY

In an example embodiment, an interposer device is disclosed. The interposer device includes a substrate that includes a laser source chip interface region configured to receive a laser source chip. The substrate also includes a silicon photonics chip interface region configured to receive a silicon photonics chip. The substrate also includes an optical amplifier module interface region configured to receive an optical amplifier module. A fiber-to-interposer connection region is formed within the substrate. The interposer device also includes a first group of optical conveyance structures formed within the substrate to optically connect the laser source chip to the silicon photonics chip when the laser source chip and the silicon photonics chip are interfaced to the substrate. The interposer device also includes a second group of optical conveyance structures formed within the substrate to optically connect the silicon photonics chip to the optical amplifier module when the silicon photonics chip and the optical amplifier module are interfaced to the substrate. The interposer device also includes a third group of optical conveyance structures formed within the substrate to optically connect the optical amplifier module to the fiber-to-interposer connection region when the optical amplifier module is interfaced to the substrate.

In an example embodiment, a multi-chip module is disclosed. The multi-chip module includes an interposer device. The multi-chip module also includes a laser source chip connected to the interposer device. The multi-chip module also includes a silicon photonics chip connected to the interposer device. The multi-chip module also includes an optical amplifier module connected to the interposer device. The interposer device includes a first group of optical conveyance structures configured to optically connect the laser source chip to the silicon photonics chip. The interposer device also includes a second group of optical conveyance structures configured to optically connect the silicon photonics chip to the optical amplifier module. The interposer device also includes a third group of optical conveyance structures configured to optically connect the optical amplifier module to a fiber-to-interposer connection region formed within the interposer device.

In an example embodiment, a mechanical transfer ferrule is disclosed. The mechanical transfer ferrule includes a top half member that includes a top alignment key. The mechanical transfer ferrule also includes a bottom half member that includes a bottom alignment key. The top and bottom alignment keys are configured to fit together to provide for alignment and fitting of the top half member with the bottom half member. Each of the top half member and the bottom half member is configured to receive a peripheral portion of an interposer device between the top half member and the bottom half member, such that optical waveguides exposed at an edge of the peripheral portion of the interposer device are exposed at a location between the top half member and the bottom member when the top half member is fitted to the bottom half member.

In an example embodiment, a method is disclosed for manufacturing a multi-chip module. The method includes providing an interposer device. The method also includes connecting a laser source chip to the interposer device. The method also includes connecting a silicon photonics chip to the interposer device. The method also includes connecting an optical amplifier module to the interposer device. The interposer device includes a first group of optical conveyance structures that optically connect the laser source chip to the silicon photonics chip. The interposer device also includes a second group of optical conveyance structures that optically connect the silicon photonics chip to the optical amplifier module. The interposer device also includes a third group of optical conveyance structures that optically connect the optical amplifier module to a fiber-to-interposer connection region formed within the interposer device.

BRIEF DESCRIPTION OF THE DRAWINGS

FIG. 3A shows an architectural diagram of a laser module that includes the laser source, the optical marshalling module, and an optical amplifying module, in accordance with some embodiments of the present invention.

FIG. 3B shows a side view of the laser module of FIG. 3A in which the optical waveguide is present and the optical waveguide is present, in accordance with some embodiments of the present invention.

FIG. 3C shows a side view of the laser module of FIG. 3A in which the optical waveguide is present and the optical waveguide is not present, in accordance with some embodiments of the present invention.

FIG. 3D shows a side view of the laser module configuration of FIG. 3C in which the empty space between the optical marshalling module and the optical amplifying module is covered and/or sealed by a member, in accordance with some embodiments of the present invention.

FIG. 3E shows a side view of the laser module of FIG. 3A in which the optical waveguide is present and the optical waveguide is not present and in which the optical marshalling module and the optical amplifying module are positioned in a side-by-side contacting manner, in accordance with some embodiments of the present invention.

FIG. 3F shows a side view of the laser module of FIG. 3A in which the optical waveguide is not present and in which the optical marshalling module and the optical amplifying module are positioned in a vertically overlapping and contacting manner, in accordance with some embodiments of the present invention.

FIG. 3G shows a side view of the laser module configuration of FIG. 3F in which the optical amplifying module is configured to extend across the optical marshalling module, the optical waveguide, and the laser source, such that the optical amplifying module provides physical support for placement of each of the optical marshalling module, the optical waveguide, and the laser source within the laser module, in accordance with some embodiments of the present invention.

FIG. 3H shows a side view of a modification of the laser module configuration of FIG. 3B in which the optical waveguide is not present, in accordance with some embodiments of the present invention.

FIG. 3I shows a side view of a modification of the laser module configuration of FIG. 3C in which the optical waveguide is not present, in accordance with some embodiments of the present invention.

FIG. 3J shows a side view of a modification of the laser module configuration of FIG. 3E in which the optical waveguide is not present, in accordance with some embodiments of the present invention.

FIG. 3K shows a side view of a modification of the laser module configuration of FIG. 3F in which the optical waveguide is not present, in accordance with some embodiments of the present invention.

FIG. 3L shows a side view of a modification of the laser module configuration of FIG. 3G in which the optical waveguide is not present, in accordance with some embodiments of the present invention.

FIG. 3M shows a side view of a modification of the laser module configuration of FIG. 3B in which the laser source and the optical marshalling module are positioned in a side-by-side contacting manner, in accordance with some embodiments of the present invention.

FIG. 3N shows a side view of a modification of the laser module configuration of FIG. 3C in which the laser source and the optical marshalling module are positioned in a side-by-side contacting manner, in accordance with some embodiments of the present invention.

FIG. 3O shows a side view of a modification of the laser module configuration of FIG. 3E in which the laser source and the optical marshalling module are positioned in a side-by-side contacting manner, in accordance with some embodiments of the present invention.

FIG. 3P shows a side view of a modification of the laser module configuration of FIG. 3F in which the laser source and the optical marshalling module are positioned in a side-by-side contacting manner, in accordance with some embodiments of the present invention.

FIG. 3Q shows a side view of a modification of the laser module configuration of FIG. 3G in which the laser source and the optical marshalling module are positioned in a side-by-side contacting manner, in accordance with some embodiments of the present invention.

FIG. 3R shows a side view of a modification of the laser module configuration of FIG. 3B in which the laser source and the optical marshalling module are positioned in a vertically overlapping and contacting manner, in accordance with some embodiments of the present invention.

FIG. 3S shows a side view of a modification of the laser module configuration of FIG. 3R in which the optical marshalling module is configured to extend across the laser source, the optical waveguide, and the optical amplifying module, in accordance with some embodiments of the present invention.

FIG. 3Y shows a side view of a modification of the laser module configuration of FIG. 3X in which the optical marshalling module is configured to extend across the laser source and the optical amplifying module, such that the optical marshalling module provides physical support for placement of each of the laser source and the optical amplifying module within the laser module, in accordance with some embodiments of the present invention.

FIG. 4A shows an architectural diagram of a laser module, in accordance with some embodiments of the present invention.

FIG. 4B shows a side view of the of the laser module configuration of FIG. 4A, in accordance with some embodiments of the present invention.

FIG. 4C shows a side view of the laser module configuration of FIG. 4B in which the optical waveguide is not present, in accordance with some embodiments of the present invention.

FIG. 4D shows a side view of the laser module configuration of FIG. 4C in which the empty space between the PLC and the optical amplifying module is covered and/or sealed by a member, in accordance with some embodiments of the present invention.

FIG. 4E shows a side view of the laser module of FIG. 4A in which the optical waveguide is not present and in which the PLC and the optical amplifying module are positioned in a side-by-side contacting manner, in accordance with some embodiments of the present invention.

FIG. 5A shows an architectural diagram of a laser module in which an optical marshalling module and an optical amplifying module are implemented together within a same PLC, in accordance with some embodiments of the present invention.

FIG. 5B shows a side view of the laser module configuration of FIG. 5A, in accordance with some embodiments of the present invention.

FIG. 5C shows a side view of the laser module configuration of FIG. 5B in which the optical waveguide is not present, in accordance with some embodiments of the present invention.

FIG. 5D shows a side view of the laser module configuration of FIG. 5C in which the empty space between the laser source and the PLC is covered and/or sealed by a member, in accordance with some embodiments of the present invention.

FIG. 5E shows a side view of the laser module of FIG. 5A in which the optical waveguide is not present and in which the laser source and the PLC are positioned in a side-by-side contacting manner, in accordance with some embodiments of the present invention.

FIG. 6A shows an architectural diagram of a laser module in which the laser source, an optical marshalling module, and the amplifying module are implemented together within a same PLC, in accordance with some embodiments of the present invention.

FIG. 6B shows a side view of the laser module configuration of FIG. 6A, in accordance with some embodiments of the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Various embodiments of a laser module and associated methods are disclosed herein. The laser module is designed and configured to supply laser light having one or more wavelengths. It should be understood that the term "wavelength" as used herein refers to the wavelength of electromagnetic radiation. And, the term "light" as used herein refers to electromagnetic radiation within a portion of the electromagnetic spectrum that is usable by optical data communication systems. In some embodiments, the portion of the electromagnetic spectrum includes light having wavelengths within a range extending from about 1100 nanometers to about 1565 nanometers (covering from the O-Band to the C-Band, inclusively, of the electromagnetic spectrum). However, it should be understood that the portion of the electromagnetic spectrum as referred to herein can include light having wavelengths either less than 1100 nanometers or greater than 1565 nanometers, so long as the light is usable by an optical data communication system for encoding, transmission, and decoding of digital data through modulation/de-modulation of the light. In some embodiments, the light used in optical data communication systems has wavelengths in the near-infrared portion of the electromagnetic spectrum. Also, the term "laser beam" as used herein refers to a beam of light generated by a laser device. It should be understood that a laser beam may be confined to propagate in an optical waveguide, such as (but not limited to) an optical fiber or an optical waveguide within a planar lightwave circuit (PLC). In some embodiments, the laser beam is polarized. And, in some embodiments, the light of a given laser beam has a single wavelength, where the single wavelength can refer to either essentially one wavelength or can refer to a narrow band of wavelengths that can be identified and processed by an optical data communication system as if it were a single wavelength.

Figure 1A:
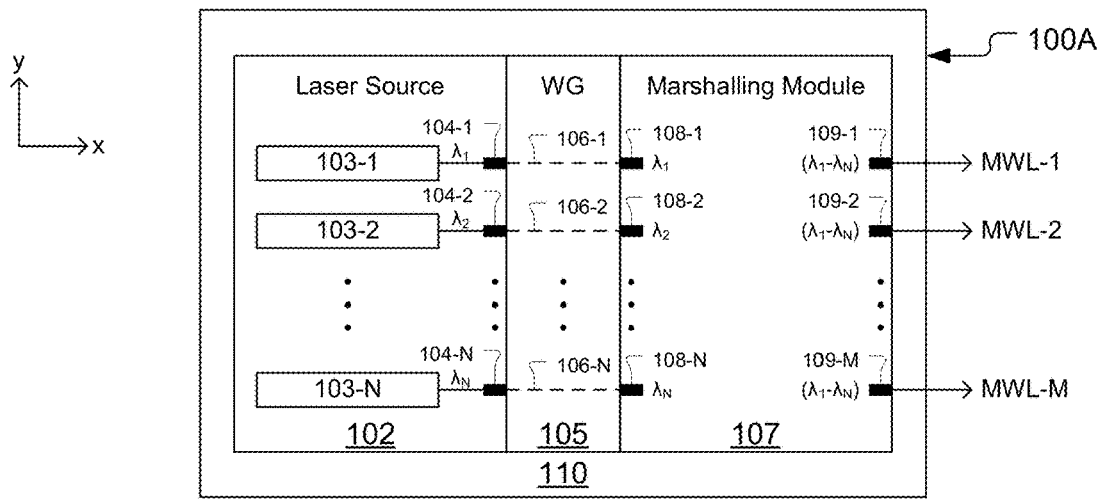
FIG. 1A shows an architectural diagram of a laser module, in accordance with some embodiments of the present invention.

FIG. 1A shows an architectural diagram of a laser module 100A, in accordance with some embodiments of the present invention. The laser module 100A includes a laser source 102 and an optical marshalling module 107. The laser source 102 is configured to generate and output a plurality of laser beams, i.e., (N) laser beams. The plurality of laser beams have different wavelengths ($\lambda_1$-$\lambda_N$) relative to each other, where the different wavelengths ($\lambda_1$-$\lambda_N$) are distinguishable to an optical data communication system. In some embodiments, the laser source 102 includes a plurality of lasers 103-1 to 103-N for respectively generating the plurality (N) of laser beams, where each laser 103-1 to 103-N generates and outputs a laser beam at a respective one of the different wavelengths ($\lambda_1$-$\lambda_N$). Each laser beam generated by the plurality of lasers 103-1 to 103-N is provided to a respective optical output port 104-1 to 104-N of the laser source 102 for transmission from the laser source 102. In some embodiments, each of the plurality of lasers 103-1 to 103-N is a distributed feedback laser configured to generate laser light at a particular one of the different wavelengths ($\lambda_1$-$\lambda_N$). In some embodiments, the laser source 102 can be defined as a separate component, such as a separate chip. However, in other embodiments, the laser source 102 can be integrated within a planar lightwave circuit (PLC) on a chip that includes other components in addition to the laser source 102.

In the example embodiment of FIG. 1A, the laser source 102 is defined as a separate component attached to a substrate 110, such as an electronic packaging substrate. In various embodiments, the substrate 110 can be an organic substrate or a ceramic substrate, or essentially any other type of substrate upon which electronic devices and/or optical-electronic devices and/or optical waveguides and/or optical fiber(s)/fiber ribbon(s) can be mounted. For example, in some embodiments, the substrate 110 can be an Indium-Phosphide (III-V) substrate. Or, in another example, the substrate 110 can be an $Al_2O_3$ substrate. It should be understood that in various embodiments the laser source 102 can be attached/mounted to the substrate 110 using essentially any known electronic packaging process, such as flip-chip bonding, which can optionally include disposition of a ball grid array (BGA), bumps, solder, under-fill, and/or other component(s), between the laser source 102 and the substrate 110, and include bonding techniques such as mass reflow, thermal-compression bonding (TCB), or essentially any other suitable bonding technique. In various embodiments, the substrate 110 can be silicon, a silicon interposer device, glass, or other suitable substrate.

The optical marshalling module 107 is configured to receive the plurality of laser beams of the different wavelengths ($\lambda_1$-$\lambda_N$) from the laser source 102 at a corresponding plurality of optical input ports 108-1 to 108-N of the optical marshalling module 107. The optical marshalling module 107 is also configured to distribute a portion of each of the plurality of laser beams to each of a plurality of optical output ports 109-1 to 109-M of the optical marshalling module 107, where (M) is the number of optical output ports of the optical marshalling module 107. The optical marshalling module 107 operates to distribute the plurality of laser beams such that all of the different wavelengths ($\lambda_1$-$\lambda_N$) of the plurality of laser beams are provided to each of the plurality of optical output ports 109-1 to 109-M of the optical marshalling module 107. Therefore, it should be understood that the optical marshalling module 107 operates to provide light at all of the different wavelengths ($\lambda_1$-$\lambda_N$) of the plurality of laser beams to each one of the optical output ports 109-1 to 109-M of the optical marshalling module 107, as indicated in FIG. 1A. In this manner, for the laser module 100A, each one of the optical output ports 109-1 to 109-M of the optical marshalling module 107 provides a corresponding one of a plurality of multi-wavelength laser outputs MWL-1 to MWL-M.

In some embodiments, the optical marshalling module 107 is configured to maintain a polarization of each of the plurality of laser beams between the plurality of optical input ports 108-1 to 108-N of the optical marshalling module 107 and the plurality of optical output ports 109-1 to 109-M of the optical marshalling module 107. Also, in some embodiments, the optical marshalling module 107 is configured such that each of the plurality of optical output ports 109-1 to 109-M of the optical marshalling module 107 receives a similar amount of optical power of any given one of the plurality of laser beams within a factor of five. In other words, in some embodiments, the amount of light of a given wavelength, i.e., one of the different wavelengths ($\lambda_1$-$\lambda_N$), that is provided by the optical marshalling module 107 to a particular one of the optical output ports 109-1 to 109-M is the same within a factor of five to the amount of light of the given wavelength that is provided by the optical marshalling module 107 to others of the optical output ports 109-1 to 109-M. It should be understood that the factor of five mentioned above is an example embodiment. In other embodiments, the factor of five mentioned above can be changed to a factor of another value, such as to a factor of two, or three, or four, or six, etc., or to any other value in between or less than or greater than. The point to be understood is that the optical marshalling module 107 can be configured to control the amount of light of a given wavelength that is provided to each of the optical output ports 109-1 to 109-M of the optical marshalling module 107, and in turn can be configured to control a uniformity of the amount of light of a given wavelength provided to each of the optical output ports 109-1 to 109-M of the optical marshalling module 107.

In the example embodiment, of FIG. 1A, the optical marshalling module 107 is defined as a separate component attached to the substrate 110. Therefore, it should be understood that in the example embodiment of the laser module 100A, the laser source 102 and the optical marshalling module 107 are physically separate components. It should be understood that in various embodiments the optical marshalling module 107 can be attached/mounted to the substrate 110 using essentially any known electronic packaging process. Also, in some embodiments, the optical marshalling module 107 is configured as a non-electrical component, i.e., as a passive component, and can be attached/mounted to the substrate 110 using techniques that do not involve establishment of electrical connections between the optical marshalling module 107 and the substrate 110, such as by use of an epoxy or other type of adhesive material. In some embodiments, rather than being defined as a separate component, the optical marshalling module 107 can be integrated within a PLC on a chip that includes other components in addition to the optical marshalling module 107. In some embodiments, both the optical marshalling module 107 and the laser source 102 are implemented together within a same PLC.

The laser source 102 is aligned with the optical marshalling module 107 to direct the plurality of laser beams transmitted from the optical outputs 104-1 to 104-N of the laser source 102 into respective ones of the optical input ports 108-1 to 108-N of the optical marshalling module 107. In some embodiments, the optical marshalling module 107 is positioned spaced apart from the laser source 102. In some embodiments, the optical marshalling module 107 is positioned in contact with the laser source 102. And, in some embodiments, a portion of the optical marshalling module 107 is positioned to overlap a portion of the laser source 102. In the example embodiment of the laser module 100A as shown in FIG. 1A, the optical marshalling module 107 is positioned spaced apart from the laser source 102, and an optical waveguide 105 is positioned between the laser source 102 and the optical marshalling module 107. The optical waveguide 105 is configured to direct the plurality of laser beams from the laser source 102 into respective ones of the plurality of optical input ports 108-1 to 108-N of the optical marshalling module 107, as indicated by lines 106-1 to 106-N.

In various embodiments, the optical waveguide 105 can be formed of essentially any material through which light can be channeled from an entry location on the optical waveguide 105 to an exit location on the optical waveguide 105. For example, in various embodiments, the optical waveguide 105 can be formed of glass, SiN, SiO2, germanium-oxide, and/or silica, among other materials. In some embodiments, the optical waveguide 105 is configured to maintain a polarization of the plurality of laser beams between the laser source 102 and the optical marshalling module 107. In some embodiments, the optical waveguide 105 includes (N) optical conveyance channels, where each optical conveyance channel extends from a respective one of the optical output ports 104-1 to 104-N of the laser source 102 to a respective one of the optical input ports 108-1 to 108-N of the optical marshalling module 107. In some embodiments, each of the (N) optical conveyance channels of the optical waveguide 105 has a substantially rectangular cross-section in a plane normal to a direction of propagation of the laser beam, i.e., normal to the x-direction as shown in FIG. 1A, which serves to maintain a polarization of the laser beam as it propagates from the laser source 102 to the optical marshalling module 107.

In the example embodiment of FIG. 1A, the optical waveguide 105 is defined as a separate component attached to the substrate 110. Therefore, it should be understood that in the example embodiment of the laser module 100A, the laser source 102, the optical waveguide 105, and the optical marshalling module 107 are physically separate components. It should be understood that in various embodiments the optical waveguide 105 can be attached/mounted to the substrate 110 using essentially any known electronic packaging process. Also, in some embodiments, the optical waveguide 105 is configured as a non-electrical component, i.e., as a passive component, and can be attached/mounted to the substrate 110 using techniques that do not involve establishment of electrical connections between the optical waveguide 105 and the substrate 110, such as by use of an epoxy or other type of adhesive material. In some embodiments, rather than being defined as a separate component, the optical waveguide 105 can be integrated within a PLC on a chip that includes other components in addition to the optical waveguide 105. In some embodiments, laser source 102, the optical waveguide 105, and the optical marshalling module 107 are implemented together within a same PLC.

In some embodiments, the laser module 100A includes a thermal spreader component disposed proximate to the laser source 102. The thermal spreader component is configured to spread a thermal output of the plurality of lasers 103-1 to 103-N to provide substantial uniformity in temperature-dependent wavelength drift among the plurality of lasers 103-1 to 103-N. In some embodiments, the thermal spreader component is included within the laser source 102. In some embodiments, the thermal spreader component is included within the substrate 110. In some embodiments, the thermal spreader component is defined separate from each of the laser source 102, the optical marshalling module 107, and the substrate 110. In some embodiments, the thermal spreader component is included within the optical marshalling module 107, with the thermal spreader component portion of the optical marshalling module 107 physically overlapping the laser source 102. In some embodiments, the thermal spreader component is included within the optical waveguide 105, with the thermal spreader component portion of the optical waveguide 105 physically overlapping the laser source 102. In various embodiments, the thermal spreader component is formed of a thermally conductive material, such as a metallic material by way of example. In some embodiments, the thermal spreader component can incorporate an element configured to actively transfer heat away from the plurality of lasers 103-1 to 103-N, such as a thermoelectric cooler by way of example. Also, in some embodiments, the thermal spreader component is formed to have a sufficient bulk mass so as to function as a heat sink for heat emanating from the plurality of lasers 103-1 to 103-N of the laser source 102.

Figure 1B:
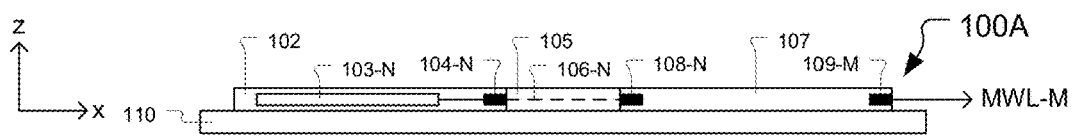
FIG. 1B shows a side view of the laser module of FIG. 1A in which the optical waveguide is present, in accordance with some embodiments of the present invention.

FIG. 1B shows a side view of the laser module 100A in which the optical waveguide 105 is present, in accordance with some embodiments of the present invention. In the embodiment of FIG. 1B, the laser source 102 and the optical marshalling module 107 are positioned in a substantially co-planar manner on the substrate 110 such that the optical output ports 104-1 to 104-N of the laser source 102 are horizontally aligned with the optical input ports 108-1 to 108-N, respectively, of the optical marshalling module 107, such that turning of the laser beams is not required at either the optical output ports 104-1 to 104-N of the laser source 102 or the optical input ports 108-1 to 108-N of the optical marshalling module 107.

Figure 1C:
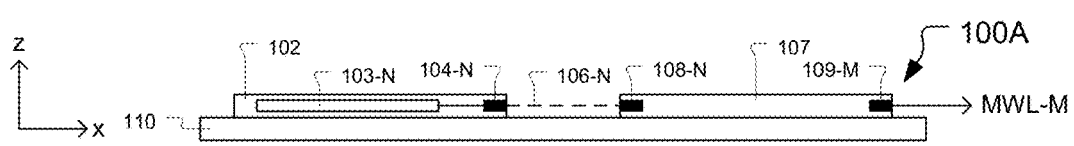
FIG. 1C shows a side view of the laser module of FIG. 1A in which the optical waveguide is not present, in accordance with some embodiments of the present invention.

FIG. 1C shows a side view of the laser module 100A in which the optical waveguide 105 is not present, in accordance with some embodiments of the present invention. In the embodiment of FIG. 1C, the laser source 102 and the optical marshalling module 107 are positioned in a substantially co-planar manner on the substrate 110 such that the optical output ports 104-1 to 104-N of the laser source 102 are horizontally aligned with the optical input ports 108-1 to 108-N, respectively, of the optical marshalling module 107, such that turning of the laser beams is not required at either the optical output ports 104-1 to 104-N of the laser source 102 or the optical input ports 108-1 to 108-N of the optical marshalling module 107. In the embodiment of FIG. 1C, an empty space is present between the optical output ports 104-1 to 104-N of the laser source 102 and the optical input ports 108-1 to 108-N of the optical marshalling module 107. Therefore, in the embodiment of FIG. 1C, the laser beams output from the laser source 102 travel along respective straight line paths through the empty space between the laser source 102 and the optical marshalling module 107.

Figure 1D:
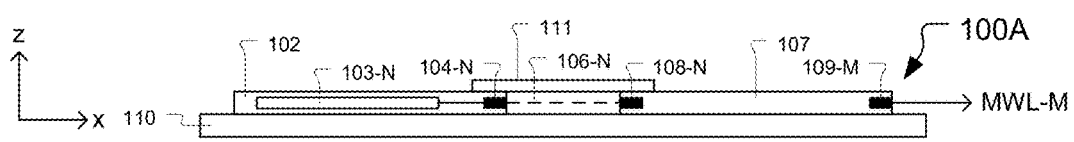
FIG. 1D shows a side view of the laser module configuration of FIG. 1C in which the empty space between the laser source and the optical marshalling module is covered and/or sealed by a member, in accordance with some embodiments of the present invention.

FIG. 1D shows a side view of the laser module 100A configuration of FIG. 1C in which the empty space between the laser source 102 and the optical marshalling module 107 is covered and/or sealed by a member 111, in accordance with some embodiments of the present invention. In various embodiments, the member 111 can be another chip placed during packaging, or can be another material placed during packaging, or can be an integral part of the laser source 102, or can be an integral part of the optical marshalling module 107.

Figure 1E:
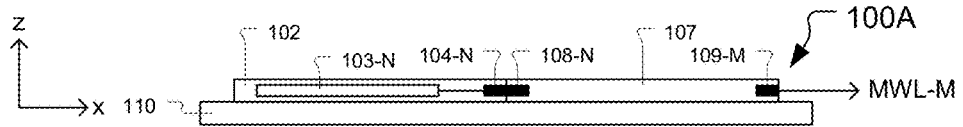
FIG. 1E shows a side view of the laser module of FIG. 1A in which the optical waveguide is not present and in which the laser source and the optical marshalling module are positioned in a side-by-side contacting manner, in accordance with some embodiments of the present invention.

FIG. 1E shows a side view of the laser module 100A in which the optical waveguide 105 is not present and in which the laser source 102 and the optical marshalling module 107 are positioned in a side-by-side contacting manner, in accordance with some embodiments of the present invention. In the example laser module 100A configuration of FIG. 1E, laser source 102 and the optical marshalling module 107 are positioned in a substantially co-planar manner on the substrate 110 such that the optical output ports 104-1 to 104-N of the laser source 102 are horizontally aligned with the optical input ports 108-1 to 108-N, respectively, of the optical marshalling module 107, such that turning of the laser beams is not required at either the optical output ports 104-1 to 104-N of the laser source 102 or the optical input ports 108-1 to 108-N of the optical marshalling module 107.

Figure 1F:
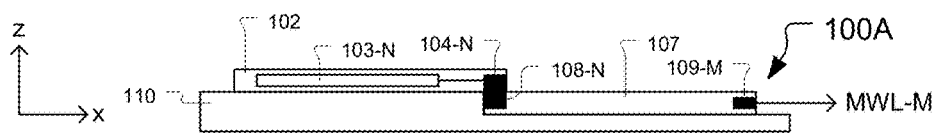
FIG. 1F shows a side view of the laser module of FIG. 1A in which the optical waveguide is not present and in which the laser source and the optical marshalling module are positioned in a vertically overlapping and contacting manner, in accordance with some embodiments of the present invention.
Figure 1G:
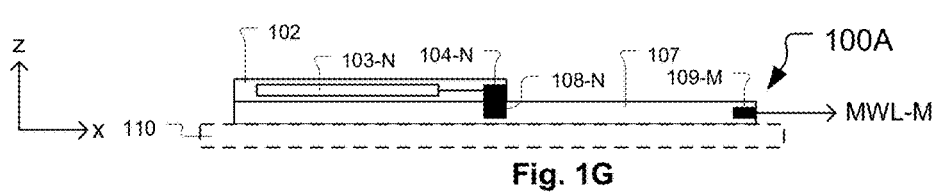
FIG. 1G shows a side view of the laser module configuration of FIG. 1F in which the optical marshalling module is configured to extend across the laser source, such that the optical marshalling module provides physical support for placement of the laser source within the laser module, in accordance with some embodiments of the present invention.

FIG. 1F shows a side view of the laser module 100A in which the optical waveguide 105 is not present and in which the laser source 102 and the optical marshalling module 107 are positioned in a vertically overlapping and contacting manner, in accordance with some embodiments of the present invention. In the example laser module 100A configuration of FIG. 1F, the substrate 110 is configured to support both the laser source 102 and the optical marshalling module 107. In the example laser module 100A configuration of FIG. 1F, the optical output ports 104-1 to 104-N of the laser source 102 are vertically aligned with the optical input ports 108-1 to 108-N, respectively, of the optical marshalling module 107, such that turning of the laser beams is done at both the optical output ports 104-1 to 104-N of the laser source 102 and the optical input ports 108-1 to 108-N of the optical marshalling module 107. FIG. 1G shows a side view of the laser module 100A configuration of FIG. 1F in which the optical marshalling module 107 is configured to extend across the laser source 102, such that the optical marshalling module 107 provides physical support for placement of the laser source 102 within the laser module 100A, in accordance with some embodiments of the present invention. In the example laser module 100A configuration of FIG. 1G, the substrate 110 may be omitted if the optical marshalling module 107 is formed to have sufficient mechanical strength for physically supporting itself and the laser source 102.

Figure 2A:
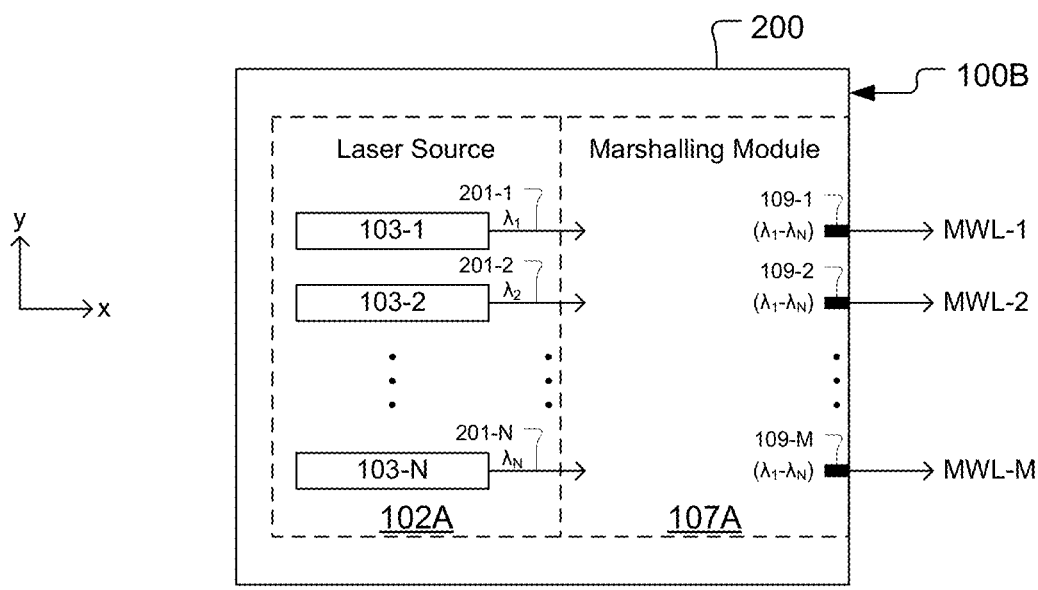
FIG. 2A shows an architectural diagram of a laser module, in accordance with some embodiments of the present invention.

FIG. 2A shows an architectural diagram of a laser module 100B, in accordance with some embodiments of the present invention. The laser module 100B includes a laser source 102A and an optical marshalling module 107A implemented within a same PLC 200. The laser source 102A is configured to function in essentially the same manner as the laser source 102 described above with regard to the laser module 100A.

Figure 2B:
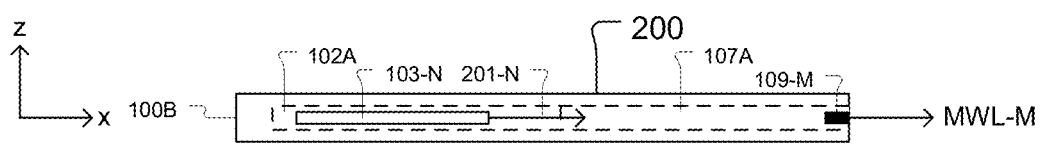
FIG. 2B shows a side view of the of PLC, in accordance with some embodiments of the present invention.

The optical marshalling module 107A is configured to function in essentially the same manner as the optical marshalling module 107 described above with regard to the laser module 100A. FIG. 2B shows a side view of the of PLC 200, in accordance with some embodiments of the present invention. In the PLC 200, the laser source 102A and the optical marshalling module 107A are implemented in an integral manner with each other such that laser beams 201-1 to 201-N generated by the plurality of lasers 103-1 to 103-N are directed into the optical marshalling module 107A without having to travel through optical output ports and optical input ports, respectively. Also, in the PLC 200, the separate optical waveguide 105 is not needed due to the optical integration between the laser source 102A and the optical marshalling module 107A.

In some embodiments, the laser source 102 generates laser beams of sufficient power at the different wavelengths ($\lambda_1$-$\lambda_N$) such that the multi-wavelength laser outputs MWL-1 to MWL-M are output from the optical marshalling module 107/107A with sufficient power for use in optical data communication. However, in some embodiments, due to limitations in the laser source 102 output power and/or due to optical losses in the optical waveguide 105 and/or optical marshalling module 107, the multi-wavelength laser outputs MWL-1 to MWL-M are not output from the optical marshalling module 107/107A with sufficient power for use in optical data communication. Therefore, in some embodiments, the multi-wavelength laser outputs MWL-1 to MWL-M that are output from the optical marshalling module 107/107A need to be optically amplified prior to use in optical data communication. Each of the multi-wavelength laser outputs MWL-1 to MWL-M can be optically amplified using an optical amplifier. In various embodiments, the optical amplifiers can be implemented directly within the laser module.

FIG. 3A shows an architectural diagram of a laser module 100C that includes the laser source 102, the optical marshalling module 107, and an optical amplifying module 303, in accordance with some embodiments of the present invention. The laser source 102 is configured in the same manner as previously described with regard to the laser module 100A. Also, the optical marshalling module 107 is configured in the same manner as previously described with regard to the laser module 100A. And, in some embodiments, the laser module 100C can include the optical waveguide 105 positioned between the laser source 102 and the optical marshalling module 107, where the optical waveguide 105 is configured in the same manner as previously described with regard to the laser module 100A.

The optical amplifying module 303 is configured to receive the plurality of multi-wavelength laser outputs MWL-1 to MWL-M from the plurality of optical output ports 109-1 to 109-M of the optical marshalling module 107 at a corresponding plurality of optical input ports 304-1 to 304-M of the optical amplifying module 303. The optical amplifying module 303 includes a plurality of optical amplifiers 305-1 to 305-M for respectively amplifying the plurality of multi-wavelength laser outputs MWL-1 to MWL-M received at the plurality of optical input ports 304-1 to 304-M of the optical amplifying module 303. In various embodiments, the plurality of optical amplifiers 305-1 to 305-M can be defined as one or more of semiconductor optical amplifiers, erbium/ytterbium-doped fiber amplifiers, raman amplifiers, among others. The optical amplifiers 305-1 to 305-M are configured and optically connected to provide amplified versions of the plurality of multi-wavelength laser outputs AMWL-1 to AMWL-M to a plurality of optical output ports 306-1 to 306-M, respectively, of the optical amplifying module 303. In this manner, for the laser module 100C, each one of the optical output ports 306-1 to 306-M of the optical amplifying module 303 provides a corresponding one of a plurality of amplified multi-wavelength laser outputs AMWL-1 to AMWL-M. In some embodiments, the optical amplifying module 303 is configured to maintain a polarization of each of the plurality of laser beams between the plurality of optical input ports 304-1 to 304-M of the optical amplifying module 303 and the plurality of optical output ports 306-1 to 306-M of the optical amplifying module 303.

In the example embodiment, of FIG. 3A, the optical amplifying module 303 is defined as a separate component attached to the substrate 110. Therefore, it should be understood that in the example embodiment of the laser module 100C, the laser source 102, the optical marshalling module 107, and the optical amplifying module 303 are physically separate components. It should be understood that in various embodiments the optical amplifying module 303 can be attached/mounted to the substrate 110 using essentially any known electronic packaging process, such as flip-chip bonding, which can optionally include disposition of a ball grid array (BGA), bumps, solder, under-fill, and/or other component(s), between the optical amplifying module 303 and the substrate 110, and include bonding techniques such as mass reflow, thermal-compression bonding (TCB), or essentially any other suitable bonding technique.

The optical marshalling module 107 is aligned with the optical amplifying module 303 to direct the multi-wavelength laser outputs MWL-1 to MWL-M into respective ones of the optical input ports 304-1 to 304-M of the optical amplifying module 303. In some embodiments, the optical amplifying module 303 is positioned spaced apart from the optical marshalling module 107. In some embodiments, the optical amplifying module 303 is positioned in contact with the optical marshalling module 107. And, in some embodiments, a portion of the optical amplifying module 303 is positioned to overlap a portion of the optical marshalling module 107 and/or a portion of the laser source 102. In the example embodiment of the laser module 100C as shown in FIG. 3A, the optical amplifying module 303 is positioned spaced apart from the optical marshalling module 107, and an optical waveguide 301 is positioned between the optical marshalling module 107 and the optical amplifying module 303. The optical waveguide 301 is configured to direct the plurality of multi-wavelength laser outputs MWL-1 to MWL-M from the optical marshalling module 107 into respective ones of the plurality of optical input ports 304-1 to 304-M of the optical amplifying module 303.

In various embodiments, the optical waveguide 301 can be formed of essentially any material through which light can be channeled from an entry location on the optical waveguide 301 to an exit location on the optical waveguide 301. For example, in various embodiments, the optical waveguide 301 can be formed of glass, SiN, SiO2, germanium-oxide, and/or silica, among other materials. In some embodiments, the optical waveguide 301 is configured to maintain a polarization of the plurality of multi-wavelength laser outputs MWL-1 to MWL-M between the optical marshalling module 107 and the optical amplifying module 303. In some embodiments, the optical waveguide 301 includes (M) optical conveyance channels, where each optical conveyance channel extends from a respective one of the optical output ports 109-1 to 109-M of the optical marshalling module 107 to a respective one of the optical input ports 304-1 to 304-M of the optical amplifying module 303. In some embodiments, each of the (M) optical conveyance channels of the optical waveguide 301 has a substantially rectangular cross-section in a plane normal to a direction of propagation of the multi-wavelength laser output, i.e., normal to the x-direction as shown in FIG. 3A, which serves to maintain a polarization of the multi-wavelength laser output as it propagates from the optical marshalling module 107 to the optical amplifying module 303.

In the example embodiment of FIG. 3A, the optical waveguide 301 is defined as a separate component attached to the substrate 110. Therefore, it should be understood that in the example embodiment of the laser module 100C, the laser source 102, the optical waveguide 105, the optical marshalling module 107, the optical waveguide 301, and the optical amplifying module 303 are physically separate components. It should be understood that in various embodiments the optical waveguide 301 can be attached/mounted to the substrate 110 using essentially any known electronic packaging process. Also, in some embodiments, the optical waveguide 301 is configured as a non-electrical component, i.e., as a passive component, and can be attached/mounted to the substrate 110 using techniques that do not involve establishment of electrical connections between the optical waveguide 301 and the substrate 110, such as by use of an epoxy or other type of adhesive material. In some embodiments, rather than being defined as a separate component, the optical waveguide 301 can be integrated within a PLC on a chip that includes other components in addition to the optical waveguide 301. In some embodiments, two or more of the laser source 102, the optical waveguide 105, the optical marshalling module 107, the optical waveguide 301, and the optical amplifying module 303 are implemented together within a same PLC.

FIG. 3B shows a side view of the laser module 100C in which the optical waveguide 105 is present and the optical waveguide 301 is present, in accordance with some embodiments of the present invention. In the embodiment of FIG. 3B, the laser source 102 and the optical marshalling module 107 and the optical amplifying module 303 are positioned in a substantially co-planar manner on the substrate 110, such that the optical output ports 104-1 to 104-N of the laser source 102 are horizontally aligned with the optical input ports 108-1 to 108-N, respectively, of the optical marshalling module 107, and such that the optical output ports 109-1 to 109-M of the optical marshalling module 107 are horizontally aligned with the optical input ports 304-1 to 304-M, respectively, of the optical amplifying module 303. In this manner, in the example embodiment of FIG. 3B, turning of the laser beams is not required at either the optical output ports 104-1 to 104-N of the laser source 102 or the optical input ports 108-1 to 108-N of the optical marshalling module 107 or at the optical output ports 109-1 to 109-M of the optical marshalling module 107 or at the optical input ports 304-1 to 304-M of the optical amplifying module 303.

FIG. 3C shows a side view of the laser module 100C in which the optical waveguide 105 is present and the optical waveguide 301 is not present, in accordance with some embodiments of the present invention. In the embodiment of FIG. 3C, the laser source 102 and the optical marshalling module 107 and the optical amplifying module 303 are positioned in a substantially co-planar manner on the substrate 110, such that the optical output ports 104-1 to 104-N of the laser source 102 are horizontally aligned with the optical input ports 108-1 to 108-N, respectively, of the optical marshalling module 107, and such that the optical output ports 109-1 to 109-M of the optical marshalling module 107 are horizontally aligned with the optical input ports 304-1 to 304-M, respectively, of the optical amplifying module 303. In this manner, in the example embodiment of FIG. 3C, turning of the laser beams is not required at either the optical output ports 104-1 to 104-N of the laser source 102 or the optical input ports 108-1 to 108-N of the optical marshalling module 107 or at the optical output ports 109-1 to 109-M of the optical marshalling module 107 or at the optical input ports 304-1 to 304-M of the optical amplifying module 303. In the embodiment of FIG. 3C, an empty space is present between the optical output ports 109-1 to 109-M of the optical marshalling module 107 and the optical input ports 304-1 to 304-M of the optical amplifying module 303. Therefore, in the embodiment of FIG. 3C, the multi-wavelength laser outputs MWL-1 to MWL-M travel along respective straight line paths through the empty space between the optical marshalling module 107 and the optical amplifying module 303. FIG. 3D shows a side view of the laser module 100C configuration of FIG. 3C in which the empty space between the optical marshalling module 107 and the optical amplifying module 303 is covered and/or sealed by a member 307, in accordance with some embodiments of the present invention. In various embodiments, the member 307 can be another chip placed during packaging, or can be another material placed during packaging, or can be an integral part of the laser source 102, or can be an integral part of the optical marshalling module 107, or can be an integral part of the optical waveguide 105, or can be an integral part of the optical amplifying module 303.

FIG. 3E shows a side view of the laser module 100C in which the optical waveguide 105 is present and the optical waveguide 301 is not present and in which the optical marshalling module 107 and the optical amplifying module 303 are positioned in a side-by-side contacting manner, in accordance with some embodiments of the present invention. In the example laser module 100C configuration of FIG. 3E, the optical marshalling module 107 and the optical amplifying module 303 are positioned in a substantially co-planar manner on the substrate 110 such that the optical output ports 109-1 to 109-M of the optical marshalling module 107 are horizontally aligned with the optical input ports 304-1 to 304-M, respectively, of the optical amplifying module 303, such that turning of the laser beams is not required at either the optical output ports 109-1 to 109-M of the optical marshalling module 107 or the optical input ports 304-1 to 304-M of the optical amplifying module 303.

FIG. 3F shows a side view of the laser module 100C in which the optical waveguide 301 is not present and in which the optical marshalling module 107 and the optical amplifying module 303 are positioned in a vertically overlapping and contacting manner, in accordance with some embodiments of the present invention. In the example laser module 100C configuration of FIG. 3F, the substrate 110 is configured to support each of the laser source 102, the optical waveguide 105, the optical marshalling module 107, and the optical amplifying module 303. In the example laser module 100C configuration of FIG. 3F, the optical output ports 109-1 to 109-M of the optical marshalling module 107 are vertically aligned with the optical input ports 304-1 to 304-M, respectively, of the optical amplifying module 303, such that turning of the laser beams is done at both the optical output ports 109-1 to 109-M of the optical marshalling module 107 and the optical input ports 304-1 to 304-M of the optical amplifying module 303.

FIG. 3G shows a side view of the laser module 100C configuration of FIG. 3F in which the optical amplifying module 303 is configured to extend across the optical marshalling module 107, the optical waveguide 105, and the laser source 102, such that the optical amplifying module 303 provides physical support for placement of each of the optical marshalling module 107, the optical waveguide 105, and the laser source 102 within the laser module 100C, in accordance with some embodiments of the present invention. In the example laser module 100C configuration of FIG. 3G, the substrate 110 may be omitted if the optical amplifying module 303 is formed to have sufficient mechanical strength for physically supporting itself and each of the optical marshalling module 107, the optical waveguide 105, and the laser source 102.

FIG. 3H shows a side view of a modification of the laser module 100C configuration of FIG. 3B in which the optical waveguide 105 is not present, in accordance with some embodiments of the present invention. In this manner, the laser module 100C configuration of FIG. 3H represents the laser module 100C of FIG. 3B modified to have the features discussed above with regard to the laser module 100A of FIG. 1C concerning the absence of the optical waveguide 105.

FIG. 3I shows a side view of a modification of the laser module 100C configuration of FIG. 3C in which the optical waveguide 105 is not present, in accordance with some embodiments of the present invention. In this manner, the laser module 100C configuration of FIG. 3I represents the laser module 100C of FIG. 3C modified to have the features discussed above with regard to the laser module 100A of FIG. 1C concerning the absence of the optical waveguide 105.

FIG. 3J shows a side view of a modification of the laser module 100C configuration of FIG. 3E in which the optical waveguide 105 is not present, in accordance with some embodiments of the present invention. In this manner, the laser module 100C configuration of FIG. 3J represents the laser module 100C of FIG. 3E modified to have the features discussed above with regard to the laser module 100A of FIG. 1C concerning the absence of the optical waveguide 105.

FIG. 3K shows a side view of a modification of the laser module 100C configuration of FIG. 3F in which the optical waveguide 105 is not present, in accordance with some embodiments of the present invention. In this manner, the laser module 100C configuration of FIG. 3K represents the laser module 100C of FIG. 3F modified to have the features discussed above with regard to the laser module 100A of FIG. 1C concerning the absence of the optical waveguide 105.

FIG. 3L shows a side view of a modification of the laser module 100C configuration of FIG. 3G in which the optical waveguide 105 is not present, in accordance with some embodiments of the present invention. In this manner, the laser module 100C configuration of FIG. 3L represents the laser module 100C of FIG. 3G modified to have the features discussed above with regard to the laser module 100A of FIG. 1C concerning the absence of the optical waveguide 105.

FIG. 3M shows a side view of a modification of the laser module 100C configuration of FIG. 3B in which the laser source 102 and the optical marshalling module 107 are positioned in a side-by-side contacting manner, in accordance with some embodiments of the present invention. In this manner, the laser module 100C configuration of FIG. 3M represents the laser module 100C of FIG. 3B modified to have the features discussed above with regard to the laser module 100A of FIG. 1E concerning the positioning of the laser source 102 and the optical marshalling module 107 in the side-by-side contacting manner.

FIG. 3N shows a side view of a modification of the laser module 100C configuration of FIG. 3C in which the laser source 102 and the optical marshalling module 107 are positioned in a side-by-side contacting manner, in accordance with some embodiments of the present invention. In this manner, the laser module 100C configuration of FIG. 3N represents the laser module 100C of FIG. 3C modified to have the features discussed above with regard to the laser module 100A of FIG. 1E concerning the positioning of the laser source 102 and the optical marshalling module 107 in the side-by-side contacting manner.

FIG. 3O shows a side view of a modification of the laser module 100C configuration of FIG. 3E in which the laser source 102 and the optical marshalling module 107 are positioned in a side-by-side contacting manner, in accordance with some embodiments of the present invention. In this manner, the laser module 100C configuration of FIG. 3O represents the laser module 100C of FIG. 3E modified to have the features discussed above with regard to the laser module 100A of FIG. 1E concerning the positioning of the laser source 102 and the optical marshalling module 107 in the side-by-side contacting manner.

FIG. 3P shows a side view of a modification of the laser module 100C configuration of FIG. 3F in which the laser source 102 and the optical marshalling module 107 are positioned in a side-by-side contacting manner, in accordance with some embodiments of the present invention. In this manner, the laser module 100C configuration of FIG. 3P represents the laser module 100C of FIG. 3F modified to have the features discussed above with regard to the laser module 100A of FIG. 1E concerning the positioning of the laser source 102 and the optical marshalling module 107 in the side-by-side contacting manner.

FIG. 3Q shows a side view of a modification of the laser module 100C configuration of FIG. 3G in which the laser source 102 and the optical marshalling module 107 are positioned in a side-by-side contacting manner, in accordance with some embodiments of the present invention. In this manner, the laser module 100C configuration of FIG. 3Q represents the laser module 100C of FIG. 3G modified to have the features discussed above with regard to the laser module 100A of FIG. 1E concerning the positioning of the laser source 102 and the optical marshalling module 107 in the side-by-side contacting manner.

FIG. 3R shows a side view of a modification of the laser module 100C configuration of FIG. 3B in which the laser source 102 and the optical marshalling module 107 are positioned in a vertically overlapping and contacting manner, in accordance with some embodiments of the present invention. In this manner, the laser module 100C configuration of FIG. 3R represents the laser module 100C of FIG. 3B modified to have the features discussed above with regard to the laser module 100A of FIG. 1F concerning the positioning of the laser source 102 and the optical marshalling module 107 in the vertically overlapping and contacting manner.

FIG. 3S shows a side view of a modification of the laser module 100C configuration of FIG. 3R in which the optical marshalling module 107 is configured to extend across the laser source 102, the optical waveguide 301, and the optical amplifying module 303, in accordance with some embodiments of the present invention. In the laser module 100C configuration of FIG. 3S, the optical marshalling module 107 provides physical support for placement of the laser source 102, the optical waveguide 301, and the optical amplifying module 303. In the example laser module 100C configuration of FIG. 1S, the substrate 110 may be omitted if the optical marshalling module 107 is formed to have sufficient mechanical strength for physically supporting itself and each of the laser source 102, the optical waveguide 301, and the optical amplifying module 303.

Figure 3T:
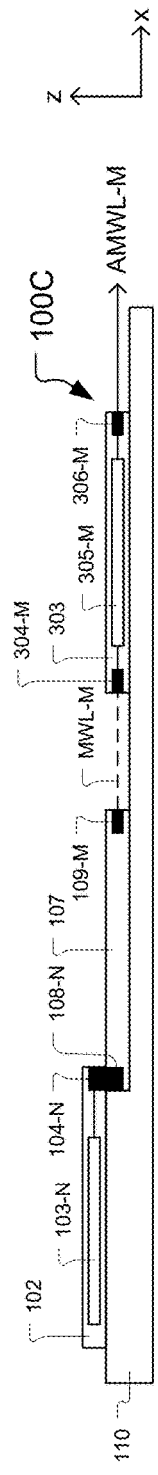
FIG. 3T shows a side view of a modification of the laser module configuration of FIG. 3R in which the optical waveguide is not present, in accordance with some embodiments of the present invention.

FIG. 3T shows a side view of a modification of the laser module 100C configuration of FIG. 3R in which the optical waveguide 301 is not present, in accordance with some embodiments of the present invention. In this manner, the laser module 100C configuration of FIG. 3T represents the laser module 100C of FIG. 3R modified to have the features discussed above with regard to the laser module 100A of FIG. 3C concerning the absence of the optical waveguide 301.

Figure 3U:
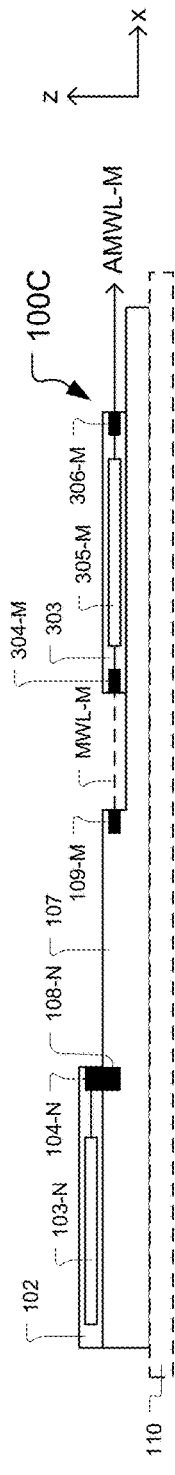
FIG. 3U shows a side view of a modification of the laser module configuration of FIG. 3S in which the optical waveguide is not present, in accordance with some embodiments of the present invention.

FIG. 3U shows a side view of a modification of the laser module 100C configuration of FIG. 3S in which the optical waveguide 301 is not present, in accordance with some embodiments of the present invention. In this manner, the laser module 100C configuration of FIG. 3U represents the laser module 100C of FIG. 3S modified to have the features discussed above with regard to the laser module 100A of FIG. 3C concerning the absence of the optical waveguide 301.

Figure 3V:
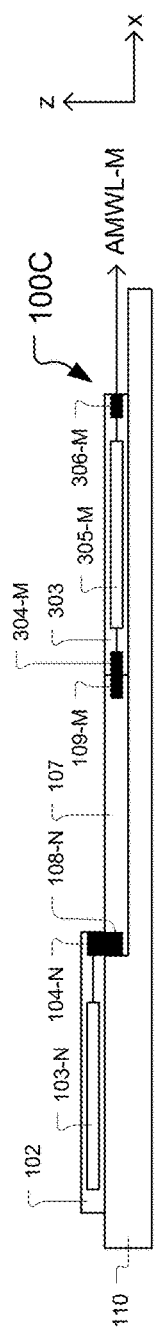
FIG. 3V shows a side view of a modification of the laser module configuration of FIG. 3T in which the optical waveguide is not present and in which the optical marshalling module and the optical amplifying module are positioned in a side-by-side contacting manner, in accordance with some embodiments of the present invention.

FIG. 3V shows a side view of a modification of the laser module 100C configuration of FIG. 3T in which the optical waveguide 301 is not present and in which the optical marshalling module 107 and the optical amplifying module 303 are positioned in a side-by-side contacting manner, in accordance with some embodiments of the present invention. In this manner, the laser module 100C configuration of FIG. 3V represents the laser module 100C of FIG. 3T modified to have the features discussed above with regard to the laser module 100A of FIG. 3E concerning the absence of the optical waveguide 301 and the positioning of the optical marshalling module 107 and the optical amplifying module 303 in the side-by-side contacting manner.

Figure 3W:
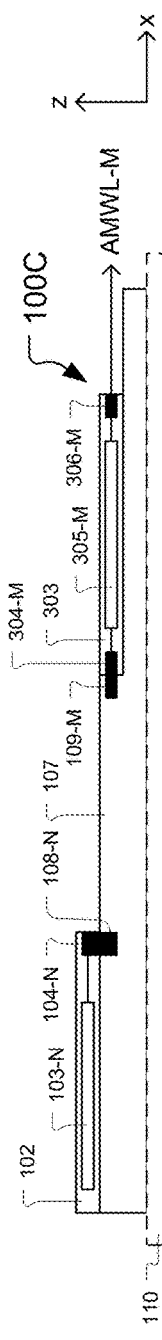
FIG. 3W shows a side view of a modification of the laser module configuration of FIG. 3S in which the optical waveguide is not present and in which the optical marshalling module and the optical amplifying module are positioned in a side-by-side contacting manner, in accordance with some embodiments of the present invention.

FIG. 3W shows a side view of a modification of the laser module 100C configuration of FIG. 3S in which the optical waveguide 301 is not present and in which the optical marshalling module 107 and the optical amplifying module 303 are positioned in a side-by-side contacting manner, in accordance with some embodiments of the present invention. In this manner, the laser module 100C configuration of FIG. 3W represents the laser module 100C of FIG. 3S modified to have the features discussed above with regard to the laser module 100A of FIG. 3E concerning the absence of the optical waveguide 301 and the positioning of the optical marshalling module 107 and the optical amplifying module 303 in the side-by-side contacting manner.

Figure 3X:
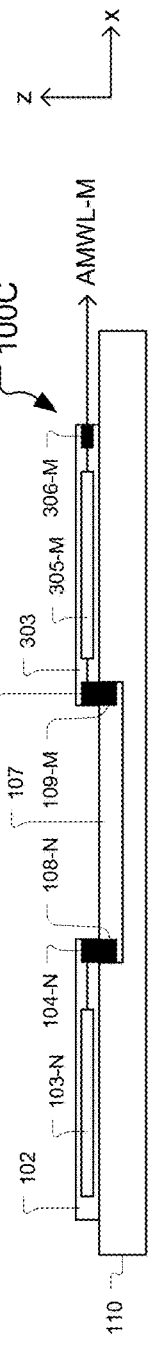
FIG. 3X shows a side view of a modification of the laser module configuration of FIG. 3R in which the optical waveguide is not present and in which the optical marshalling module and the optical amplifying module are positioned in a vertically overlapping and contacting manner, in accordance with some embodiments of the present invention.

FIG. 3X shows a side view of a modification of the laser module 100C configuration of FIG. 3R in which the optical waveguide 301 is not present and in which the optical marshalling module 107 and the optical amplifying module 303 are positioned in a vertically overlapping and contacting manner, in accordance with some embodiments of the present invention. In this manner, the laser module 100C configuration of FIG. 3X represents the laser module 100C of FIG. 3R modified to have the features discussed above with regard to the laser module 100A of FIG. 3F concerning the absence of the optical waveguide 301 and the positioning of the optical marshalling module 107 and the optical amplifying module 303 in the vertically overlapping and contacting manner.

FIG. 3Y shows a side view of a modification of the laser module 100C configuration of FIG. 3X in which the optical marshalling module 107 is configured to extend across the laser source 102 and the optical amplifying module 303, such that the optical marshalling module 107 provides physical support for placement of each of the laser source 102 and the optical amplifying module 303 within the laser module 100C, in accordance with some embodiments of the present invention. In the example laser module 100C configuration of FIG. 3Y, the substrate 110 may be omitted if the optical marshalling module 107 is formed to have sufficient mechanical strength for physically supporting itself and each of the laser source 102 and the optical amplifying module 303.

FIG. 4A shows an architectural diagram of a laser module 100D, in accordance with some embodiments of the present invention. The laser module 100D includes the laser source 102A and the optical marshalling module 107A implemented within the same PLC 200, as described with regard to FIG. 2A. The laser module 100D also includes the optical waveguide 301 and the optical amplifying module 303, as described with regard to FIG. 3A. In some embodiments, the PLC 200, the optical waveguide 301, and the optical amplifying module 303 are disposed on the substrate 110. It should be understood that the laser module 100D is configured such that the plurality of multi-wavelength laser outputs MWL-1 to MWL-M are directed from the optical output ports 109-1 to 109-M of the optical marshalling module 107A within the PLC 200 into respective ones of the plurality of optical input ports 304-1 to 304-M of the optical amplifying module 303.

FIG. 4B shows a side view of the of the laser module 100D configuration of FIG. 4A, in accordance with some embodiments of the present invention. In the laser module 100D configuration of FIG. 4B, the PLC 200 and the optical amplifying module 303 are positioned in a substantially co-planar manner on the substrate 110 such that the optical output ports 109-1 to 109-M of the optical marshalling module 107A are horizontally aligned with the optical input ports 304-1 to 304-M, respectively, of the optical amplifying module 303, such that turning of the laser beams is not required at either the optical output ports 109-1 to 109-M of the optical marshalling module 107A or the optical input ports 304-1 to 304-M of the optical amplifying module 303.

FIG. 4C shows a side view of the laser module 100D configuration of FIG. 4B in which the optical waveguide 301 is not present, in accordance with some embodiments of the present invention. In the embodiment of FIG. 4C, the PLC 200 and the optical amplifying module 303 are positioned in a substantially co-planar manner on the substrate 110 such that the optical output ports 109-1 to 109-M of the optical marshalling module 107A are horizontally aligned with the optical input ports 304-1 to 304-M, respectively, of the optical amplifying module 303, such that turning of the laser beams is not required at either the optical output ports 109-1 to 109-M of the optical marshalling module 107A or the optical input ports 304-1 to 304-M of the optical amplifying module 303. In the embodiment of FIG. 4C, an empty space is present between the optical output ports 109-1 to 109-M of the optical marshalling module 107A and the optical input ports 304-1 to 304-M of the optical amplifying module 303. Therefore, in the embodiment of FIG. 4C, the laser beams output from the PLC 200 travel along respective straight line paths through the empty space between the PLC 200 and the optical amplifying module 303. FIG. 4D shows a side view of the laser module 100D configuration of FIG. 4C in which the empty space between the PLC 200 and the optical amplifying module 303 is covered and/or sealed by a member 401, in accordance with some embodiments of the present invention. In various embodiments, the member 401 can be another chip placed during packaging, or can be another material placed during packaging, or can be an integral part of the PLC 200, or can be an integral part of the optical amplifying module 303.

FIG. 4E shows a side view of the laser module 100D in which the optical waveguide 301 is not present and in which the PLC 200 and the optical amplifying module 303 are positioned in a side-by-side contacting manner, in accordance with some embodiments of the present invention. In the embodiment of FIG. 4E, the PLC 200 and the optical amplifying module 303 are positioned in a substantially co-planar manner on the substrate 110 such that the optical output ports 109-1 to 109-M of the optical marshalling module 107A are horizontally aligned with the optical input ports 304-1 to 304-M, respectively, of the optical amplifying module 303, such that turning of the laser beams is not required at either the optical output ports 109-1 to 109-M of the optical marshalling module 107A or the optical input ports 304-1 to 304-M of the optical amplifying module 303.

FIG. 5A shows an architectural diagram of a laser module 100E in which an optical marshalling module 107B and an optical amplifying module 303A are implemented together within a same PLC 503, in accordance with some embodiments of the present invention. The optical marshalling module 107B is configured to function in essentially the same manner as the optical marshalling module 107 described above with regard to the laser module 100A. The optical amplifying module 303A is configured to function in essentially the same manner as the optical amplifying module 303 described above with regard to the laser module 100C. In the PLC 503, the optical marshalling module 107B and the optical amplifying module 303A are implemented in an integral manner with each other such that the plurality of multi-wavelength laser outputs MWL-1 to MWL-M provided by the optical marshalling module 107B are directed into the optical amplifying module 303A without having to travel through optical output ports and optical input ports, respectively, as indicated by lines 501-1 to 501-M. Also, in the PLC 503, the separate optical waveguide 301 is not needed due to the optical integration between the optical marshalling module 107B and the optical amplifying module 303A. In some embodiments of the laser module 100E, the laser source 102, the optical waveguide 105, and the PLC 503 are disposed on the substrate 110. It should be understood that the laser module 100E is configured such that the plurality of laser beams are directed from the optical output ports 104-1 to 104-N of the laser source 102 into respective ones of the plurality of optical input ports 108-1 to 108-N of the optical marshalling module 107B within the PLC 503.

FIG. 5B shows a side view of the laser module 100E configuration of FIG. 5A, in accordance with some embodiments of the present invention. In the laser module 100E configuration of FIG. 5B, the PLC 503 and the laser source 102 are positioned in a substantially co-planar manner on the substrate 110 such that the optical output ports 104-1 to 104-N of the laser source 102 are horizontally aligned with the optical input ports 108-1 to 108-N, respectively, of the optical marshalling module 107B, such that turning of the laser beams is not required at either the optical output ports 104-1 to 104-N of the laser source 102 or the optical input ports 108-1 to 108-N of the optical marshalling module 107B.

FIG. 5C shows a side view of the laser module 100E configuration of FIG. 5B in which the optical waveguide 105 is not present, in accordance with some embodiments of the present invention. In the embodiment of FIG. 5C, the PLC 503 and the laser source 102 are positioned in a substantially co-planar manner on the substrate 110 such that the optical output ports 104-1 to 104-N of the laser source 102 are horizontally aligned with the optical input ports 108-1 to 108-N, respectively, of the optical marshalling module 107B, such that turning of the laser beams is not required at either the optical output ports 104-1 to 104-N of the laser source 102 or the optical input ports 108-1 to 108-N of the optical marshalling module 107B. In the embodiment of FIG. 5C, an empty space is present between the optical output ports 104-1 to 104-N of the laser source 102 and the optical input ports 108-1 to 108-N of the optical marshalling module 107B. Therefore, in the embodiment of FIG. 5C, the laser beams output from the laser source 102 travel along respective straight line paths through the empty space between the laser source 102 and the PLC 503. FIG. 5D shows a side view of the laser module 100E configuration of FIG. 5C in which the empty space between the laser source 102 and the PLC 503 is covered and/or sealed by a member 505, in accordance with some embodiments of the present invention. In various embodiments, the member 505 can be another chip placed during packaging, or can be another material placed during packaging, or can be an integral part of the PLC 503, or can be an integral part of the laser source 102.

FIG. 5E shows a side view of the laser module 100E in which the optical waveguide 105 is not present and in which the laser source 102 and the PLC 503 are positioned in a side-by-side contacting manner, in accordance with some embodiments of the present invention. In the embodiment of FIG. 5E, the laser source 102 and the PLC 503 are positioned in a substantially co-planar manner on the substrate 110 such that the optical output ports 104-1 to 104-N of the laser source 102 are horizontally aligned with the optical input ports 108-1 to 108-N, respectively, of the optical marshalling module 107B, such that turning of the laser beams is not required at either the optical output ports 104-1 to 104-N of the laser source 102 or the optical input ports 108-1 to 108-N of the optical marshalling module 107B.

FIG. 6A shows an architectural diagram of a laser module 100F in which the laser source 102A, an optical marshalling module 107C, and the amplifying module 303A are implemented together within a same PLC 601, in accordance with some embodiments of the present invention. The laser source 102A is configured to function in essentially the same manner as the laser source 102 as described above with regard to the laser module 100A. The optical marshalling module 107C is configured to function in essentially the same manner as the optical marshalling module 107 described above with regard to the laser module 100A. The optical amplifying module 303A is configured to function in essentially the same manner as the optical amplifying module 303 described above with regard to the laser module 100C. In the PLC 601, the laser source 102A and the optical marshalling module 107C are implemented in an integral manner with each other such that laser beams 201-1 to 201-N generated by the plurality of lasers 103-1 to 103-N are directed into the optical marshalling module 107C without having to travel through optical output ports and optical input ports, respectively. Also, in the PLC 601, the separate optical waveguide 105 is not needed due to the optical integration between the laser source 102A and the optical marshalling module 107C. Also, in the PLC 601, the optical marshalling module 107C and the optical amplifying module 303A are implemented in an integral manner with each other such that the plurality of multi-wavelength laser outputs MWL-1 to MWL-M provided by the optical marshalling module 107C are directed into the optical amplifying module 303A without having to travel through optical output ports and optical input ports, respectively, as indicated by lines 501-1 to 501-M. Also, in the PLC 601, the separate optical waveguide 301 is not needed due to the optical integration between the optical marshalling module 107C and the optical amplifying module 303A. FIG. 6B shows a side view of the laser module 100F configuration of FIG. 6A, in accordance with some embodiments of the present invention.

It should be understood that the geometric depictions of each of the laser source 102/102A, the optical waveguides 105/301, the optical marshalling modules 107/107A/107B/107C, and the optical amplifying modules 303/303A as disclosed herein are provided by way of example for ease of description of the present invention. In various embodiments, each of the laser source 102/102A, the optical waveguides 105/301, the optical marshalling modules 107/107A/107B/107C, and the optical amplifying modules 303/303A can have essentially any geometric shape as necessary to form an optical-electronic device of a desired shape and size. In some embodiments, one or more of the laser source 102/102A, the optical waveguides 105/301, the optical marshalling modules 107/107A/107B/107C, and the optical amplifying modules 303/303A can be configured to have a substantially planar geometric shape. In some embodiments, one or more of the laser source 102/102A, the optical waveguides 105/301, the optical marshalling modules 107/107A/107B/107C, and the optical amplifying modules 303/303A can be configured to have a three-dimensionally varying geometric shape, i.e., a shape that is other than a simple rectangular prism. Also, it should be understood that in various embodiments each of the laser source 102/102A, the optical waveguides 105/301, the optical marshalling modules 107/107A/107B/107C, and the optical amplifying modules 303/303A can have different sizes as measured in any reference direction of a related coordinate system, i.e., in any of the x-direction, y-direction, and z-direction of the Cartesian coordinate system.

Figure 7:
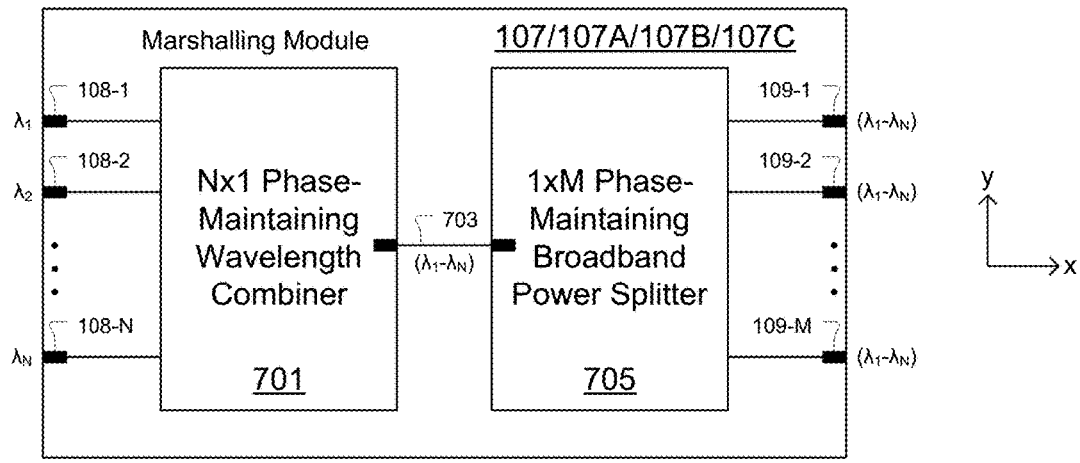
FIG. 7 shows an example implementation of the optical marshalling module that includes an N×1 (polarization-maintaining) wavelength combiner and a 1×M (polarization-maintaining) broadband power splitter, in accordance with some embodiments of the present invention.

FIG. 7 shows an example implementation of the optical marshalling module 107/107A/107B/107C that includes an N×1 (polarization-maintaining) wavelength combiner 701 and a 1×M (polarization-maintaining) broadband power splitter 705, in accordance with some embodiments of the present invention. The wavelength combiner 701 is configured to combine the plurality of laser beams received at the optical input ports 108-1 to 108-N into a multi-wavelength laser beam which is transmitted through an optical waveguide 703 from the wavelength combiner 701 to the broadband power splitter 705. The broadband power splitter 705 is configured to distribute portions of a total power of the multi-wavelength laser beam to each of the plurality of optical output ports 109-1 to 109-M of the optical marshalling module 107/107A/107B/107C.

Figure 8:
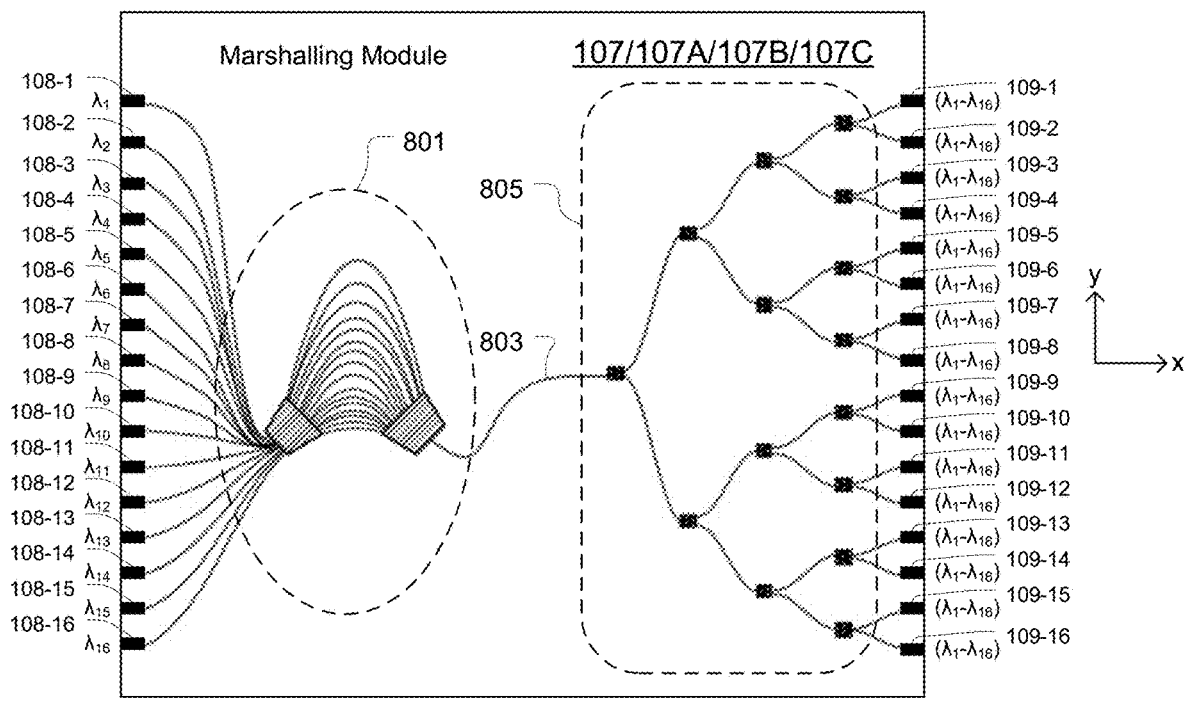
FIG. 8 shows an example implementation of the optical marshalling module that includes an arrayed waveguide and a broadband power splitter, in accordance with some embodiments of the present invention.

FIG. 8 shows an example implementation of the optical marshalling module 107/107A/107B/107C that includes an arrayed waveguide 801 and a broadband power splitter 805, in accordance with some embodiments of the present invention. In the example of FIG. 8, the arrayed waveguide 801 is a 16-to-1 arrayed waveguide. However, it should be understood that in various embodiments the arrayed waveguide 801 can be configured to receive any number (N) of optical inputs. Also, in the example of FIG. 8, the broadband power splitter 805 is a 1-to-16 broadband power splitter. However, it should be understood that in various embodiments the broadband power splitter 805 can be configured to output any number (M) of optical outputs. The arrayed waveguide 801 is configured to combine the plurality of laser beams received at the optical input ports 108-1 to 108-16 into a multi-wavelength laser beam which is transmitted through an optical waveguide 803 from the arrayed waveguide 801 to the broadband power splitter 805. The broadband power splitter 805 is configured to distribute portions of a total power of the multi-wavelength laser beam to each of the plurality of optical output ports 109-1 to 109-16 of the optical marshalling module 107/107A/107B/107C.

Figure 9:
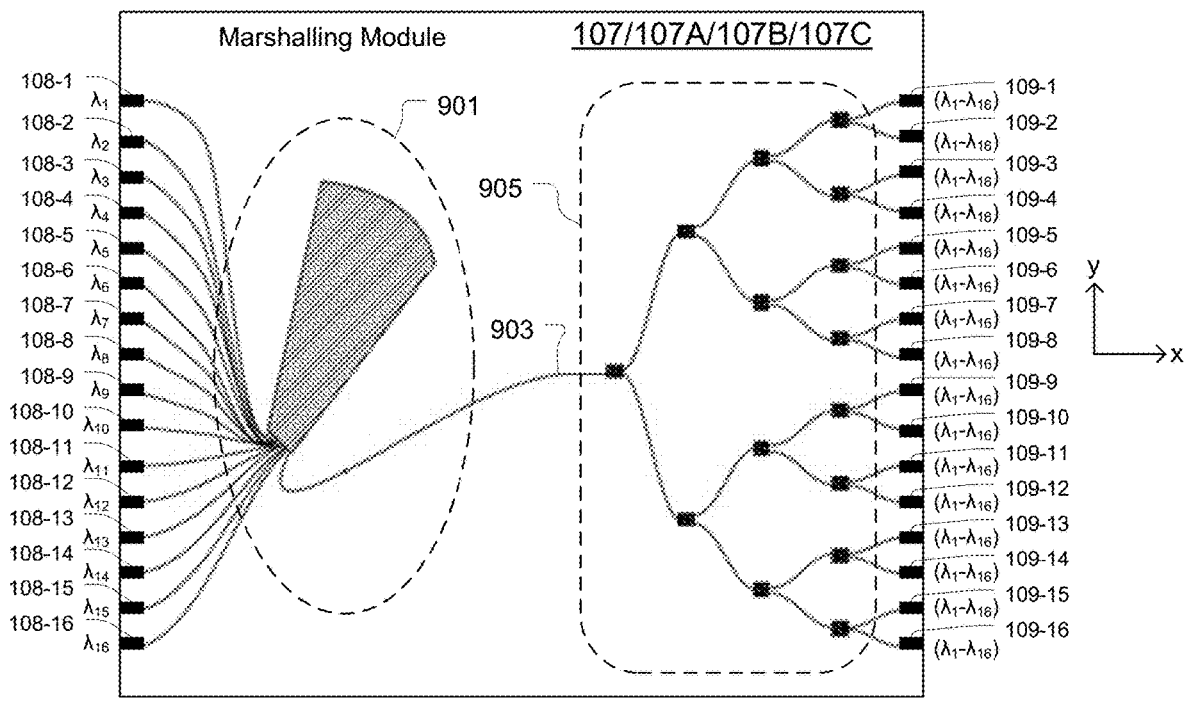
FIG. 9 shows an example implementation of the optical marshalling module that includes an Echelle grating and a broadband power splitter, in accordance with some embodiments of the present invention.

FIG. 9 shows an example implementation of the optical marshalling module 107/107A/107B/107C that includes an Echelle grating 901 and a broadband power splitter 905, in accordance with some embodiments of the present invention. In the example of FIG. 8, the Echelle grating 901 is a 16-to-1 grating. However, it should be understood that in various embodiments the Echelle grating 901 can be configured to receive any number (N) of optical inputs. Also, in the example of FIG. 9, the broadband power splitter 905 is a 1-to-16 broadband power splitter. However, it should be understood that in various embodiments the broadband power splitter 905 can be configured to output any number (M) of optical outputs. The Echelle grating 901 is configured to combine the plurality of laser beams received at the optical input ports 108-1 to 108-16 into a multi-wavelength laser beam which is transmitted through an optical waveguide 903 from the Echelle grating 901 to the broadband power splitter 905. The broadband power splitter 905 is configured to distribute portions of a total power of the multi-wavelength laser beam to each of the plurality of optical output ports 109-1 to 109-16 of the optical marshalling module 107/107A/107B/107C.

Figure 10:
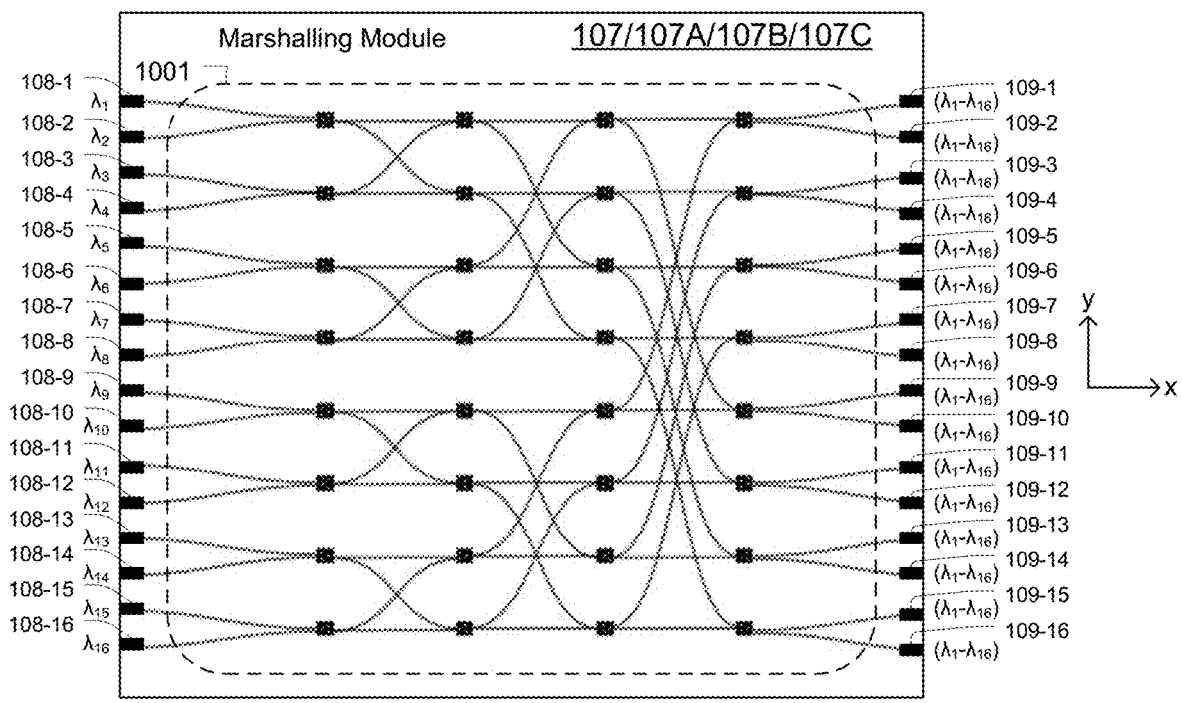
FIG. 10 shows an example implementation of the optical marshalling module that includes a butterfly waveguide network, in accordance with some embodiments of the present invention.

FIG. 10 shows an example implementation of the optical marshalling module 107/107A/107B/107C that includes a butterfly waveguide network 1001, in accordance with some embodiments of the present invention. In the example of FIG. 10, the butterfly waveguide network 1001 is a 16 input-to-16 output network. However, it should be understood that in various embodiments the butterfly waveguide network 1001 can be configured to receive any number (N) of optical inputs and provide any number (M) of optical outputs. The butterfly waveguide network 1001 is configured to receive the (N) laser beams from the optical input ports 108-1 to 108-N and distribute portions of each of the (N) laser beams to each of the (M) optical output ports of the optical marshalling module 107/107A/107B/107C.

Figure 11:
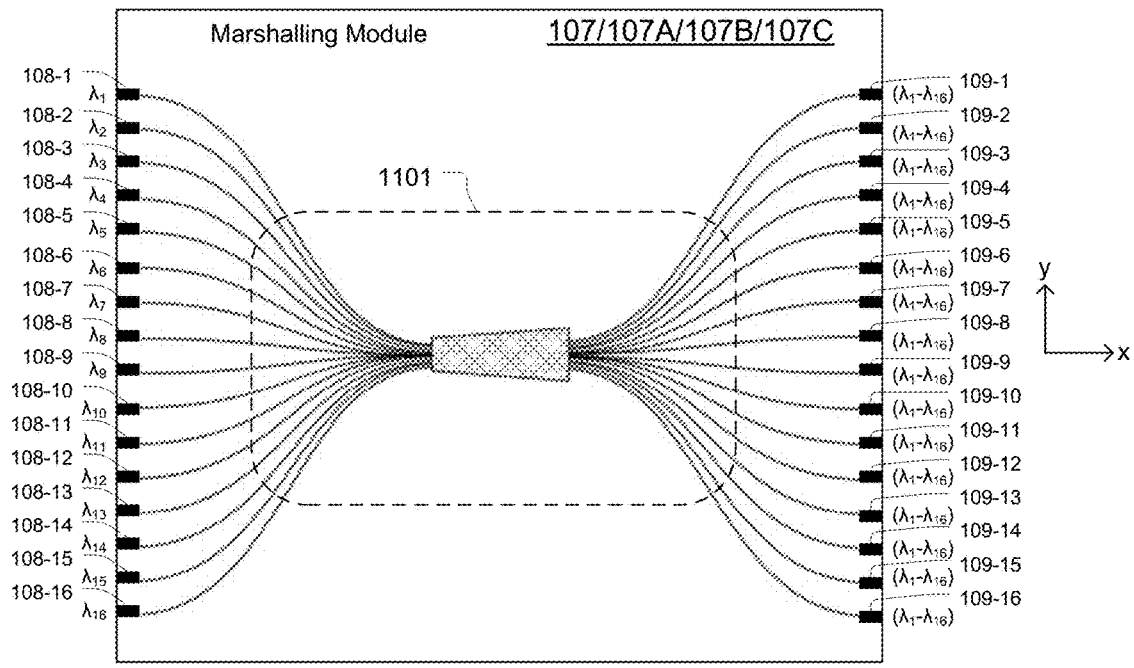
FIG. 11 shows an example implementation of the optical marshalling module that includes a star coupler, in accordance with some embodiments of the present invention.

FIG. 11 shows an example implementation of the optical marshalling module 107/107A/107B/107C that includes a star coupler 1101, in accordance with some embodiments of the present invention. In the example of FIG. 11, the star coupler 1101 is a 16 input-to-16 output star coupler. However, it should be understood that in various embodiments the star coupler 1101 can be configured to receive any number (N) of optical inputs and provide any number (M) of optical outputs. The star coupler 1101 is configured to receive the (N) laser beams from the optical input ports 108-1 to 108-N and distribute portions of each of the (N) laser beams to each of the (M) optical output ports of the optical marshalling module 107/107A/107B/107C.

Figure 12A:
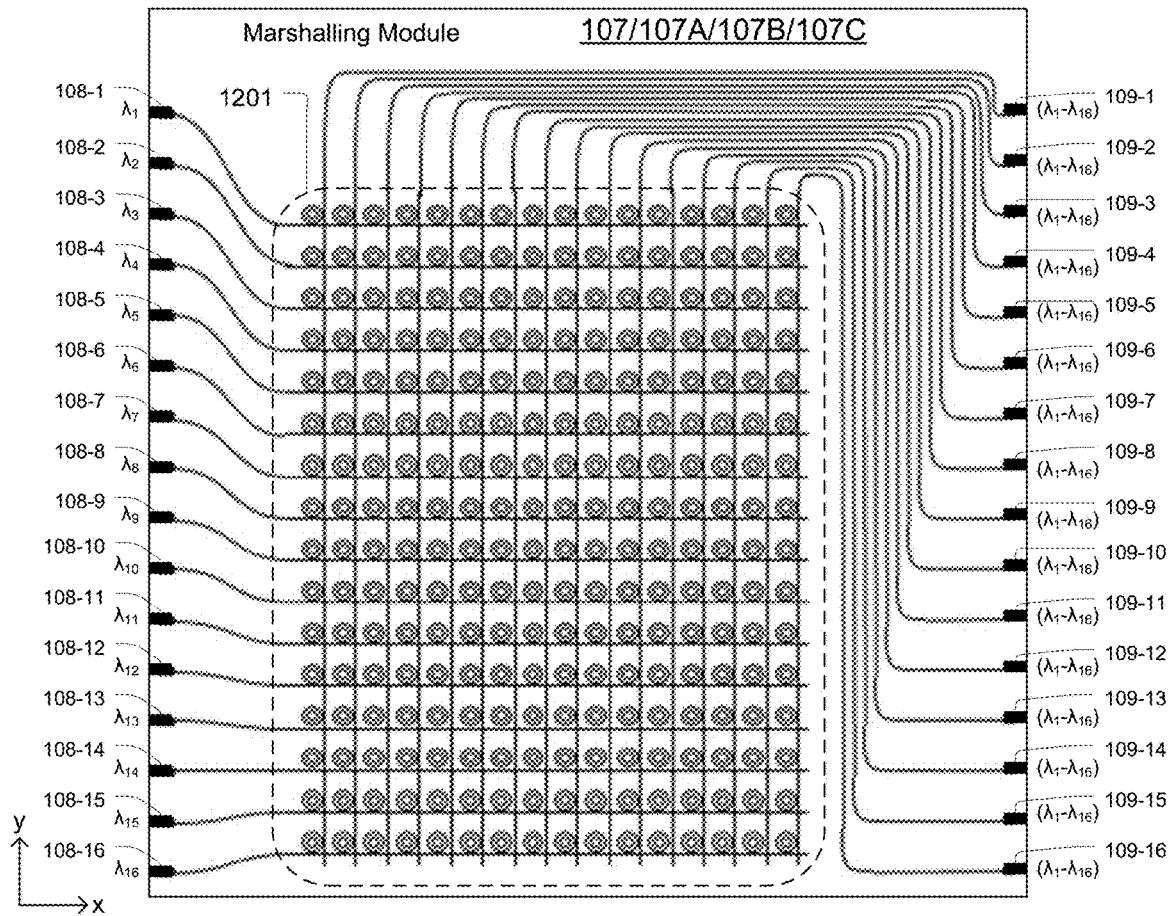
FIG. 12A shows an example implementation of the optical marshalling module that includes a resonator ring array, in accordance with some embodiments of the present invention.

FIG. 12A shows an example implementation of the optical marshalling module 107/107A/107B/107C that includes a resonator ring array 1201, in accordance with some embodiments of the present invention. In the example of FIG. 12A, the resonator ring array 1201 is a 16 input-to-16 output resonator ring array. However, it should be understood that in various embodiments the resonator ring array 1201 can be configured to receive any number (N) of optical inputs and provide any number (M) of optical outputs. The resonator ring array 1201 is configured to receive the (N) laser beams from the optical input ports 108-1 to 108-N and distribute portions of each of the (N) laser beams to each of the (M) optical output ports of the optical marshalling module 107/107A/107B/107C.

Figure 12B:
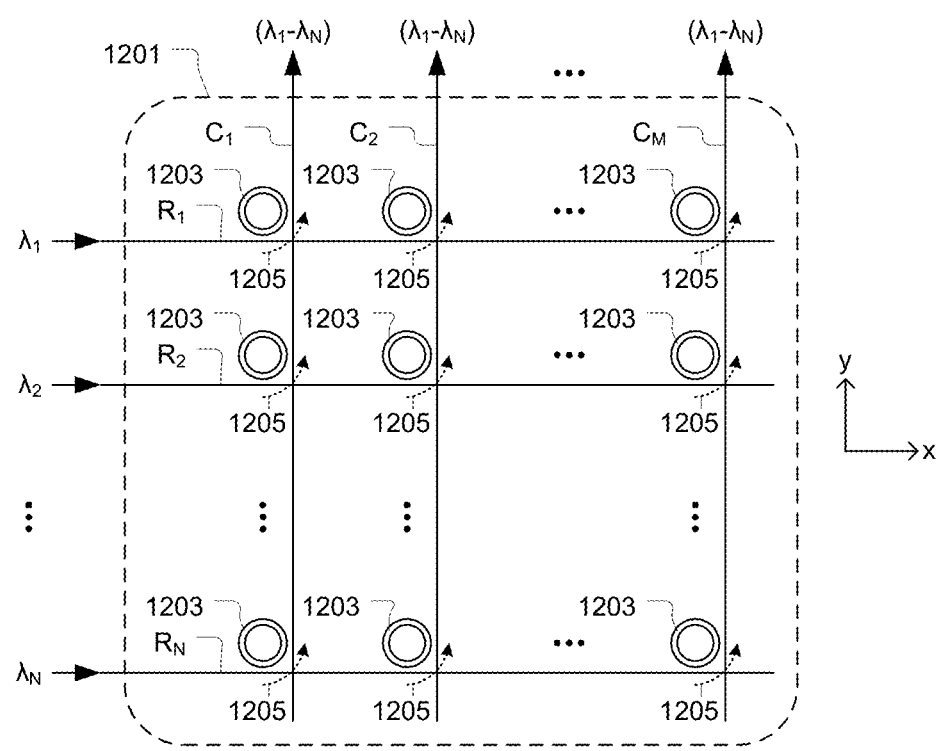
FIG. 12B shows a detailed diagram of the resonator ring array, in accordance with some embodiments of the present invention.

FIG. 12B shows a detailed diagram of the resonator ring array 1201, in accordance with some embodiments of the present invention. The resonator ring array 1201 includes a number of resonator ring rows $R_1$ to $R_N$ equal to a number (N) of the plurality of laser beams respectively received at the (N) optical input ports 108-1 to 108-N. Each resonator ring row $R_1$ to $R_N$ includes a number of resonator rings 1203 equal to a number (M) of the plurality of optical output ports 109-1 to 109-M of the optical marshalling module 107/107A/107B/107C. Each of the resonator ring rows $R_1$ to $R_N$ is configured to receive a different one of the plurality of laser beams as a corresponding input laser beam. Therefore, each of the resonator ring rows $R_1$ to $R_N$ receives a different one of the wavelengths $(Xi-\lambda_N)$ of the (N) laser beams provided by the laser source 102/102A. And, for this reason, each resonator ring 1203 of a given one of the resonator ring rows $R_1$ to $R_N$ can be optimized for operation with the particular laser beam wavelength that the given resonator ring row is to receive. And, correspondingly, the resonator rings 1203 of different resonator ring rows $R_1$ to $R_N$ can be optimized for operation with different laser beam wavelengths. Each resonator ring 1203 in a given resonator ring row $R_1$ to $R_N$ is configured to redirect a portion of the corresponding input laser beam of the given resonator ring row to a different one of the plurality of optical output ports 109-1 to 109-M of the optical marshalling module 107/107A/107B/107C, as indicated by arrows 1205. In some embodiments, the resonator rings 1203 of a given resonator ring row $R_1$ to $R_N$ are positioned to receive the corresponding input laser beam of the given resonator ring row in a successive manner, where successively positioned resonator rings 1203 of the given resonator ring row relative to the laser source 102/102A are configured to progressively redirect larger portions of the corresponding input laser beam of the given resonator ring row. In this manner, the resonator rings 1203 of a given resonator ring row $R_1$ to $R_N$ can provide a substantially equal amount of laser light to each of the optical output ports 109-1 to 109-M of the optical marshalling module 107/107A/107B/107C.

Figure 13:
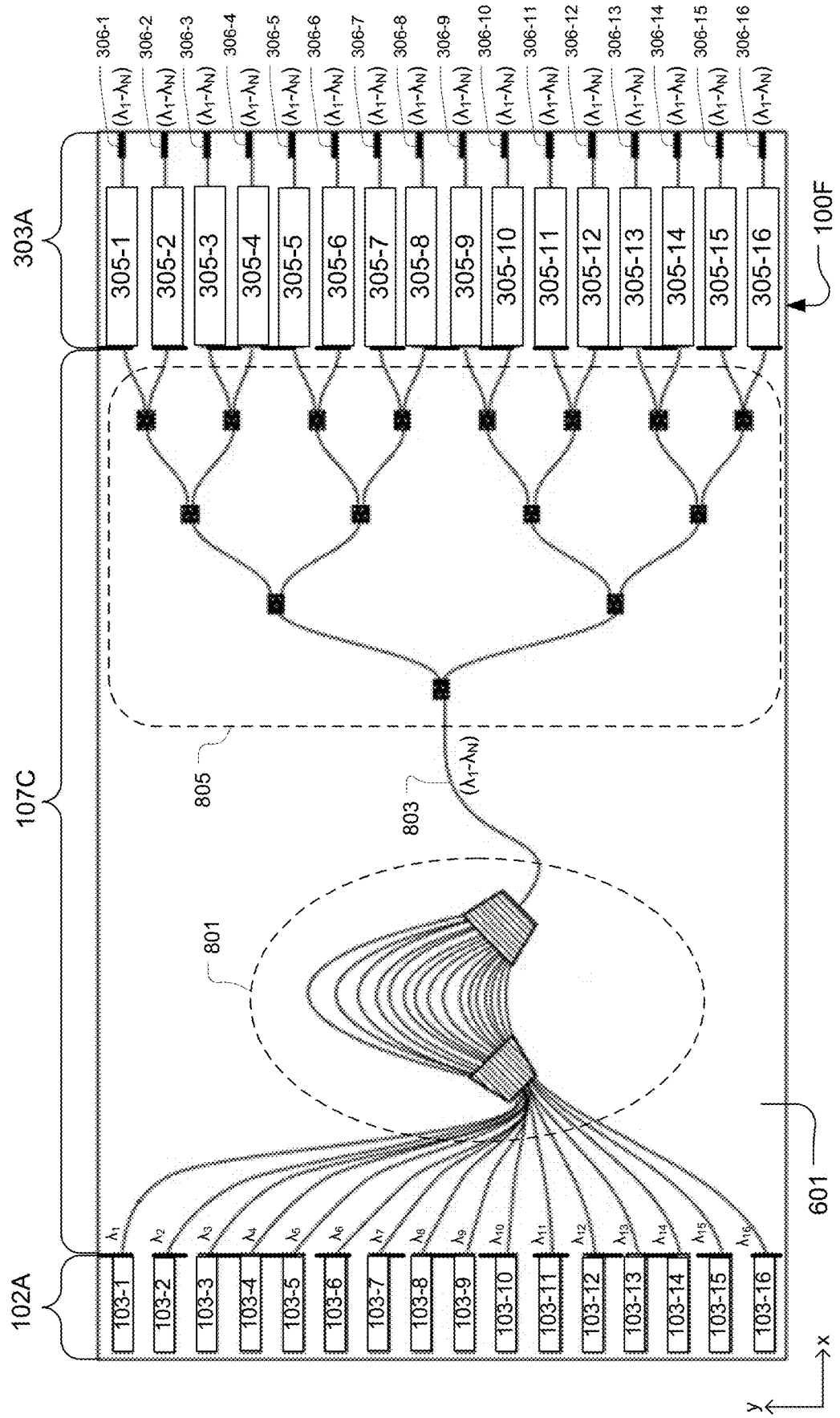
FIG. 13 shows an example implementation of the laser module of FIG. 6A on the PLC in which the marshalling module is implemented to include the arrayed waveguide and the broadband power splitter, in accordance with some embodiments of the present invention.
Figure 14:
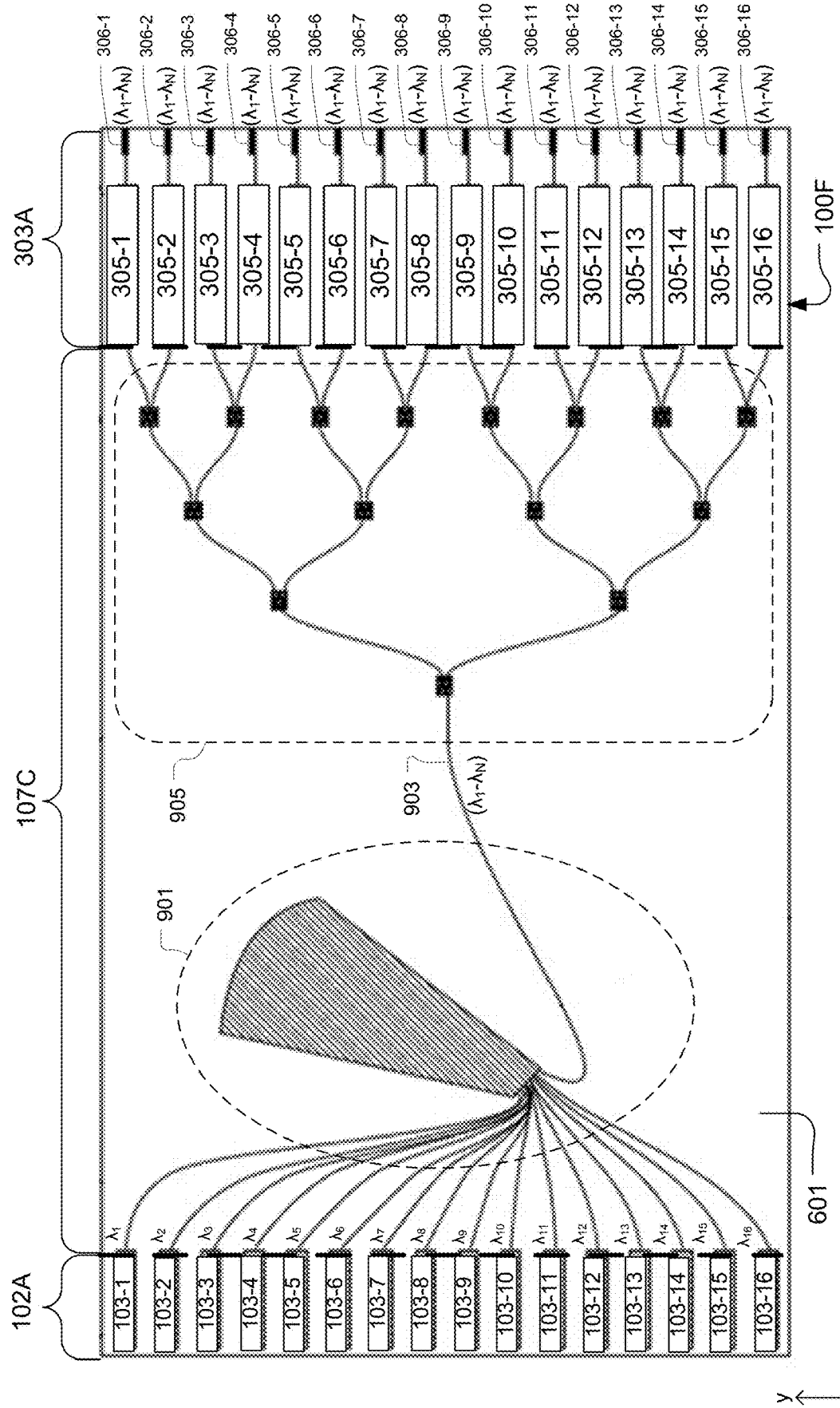
FIG. 14 shows an example implementation of the laser module of FIG. 6A on the PLC in which the marshalling module is implemented to include the Echelle grating and the broadband power splitter, in accordance with some embodiments of the present invention.
Figure 15:
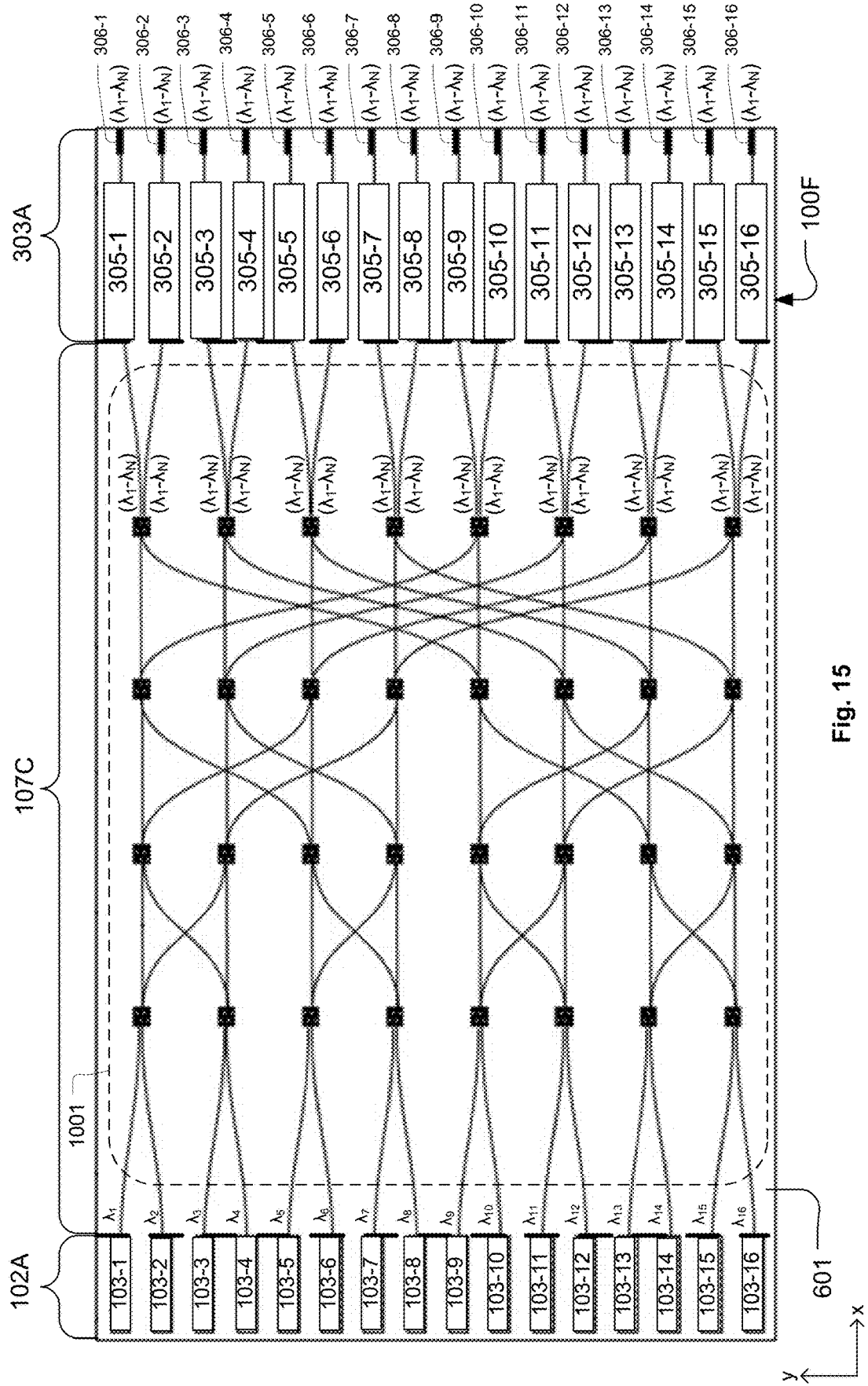
FIG. 15 shows an example implementation of the laser module of FIG. 6A on the PLC in which the marshalling module is implemented to include the butterfly waveguide network, in accordance with some embodiments of the present invention.
Figure 16:
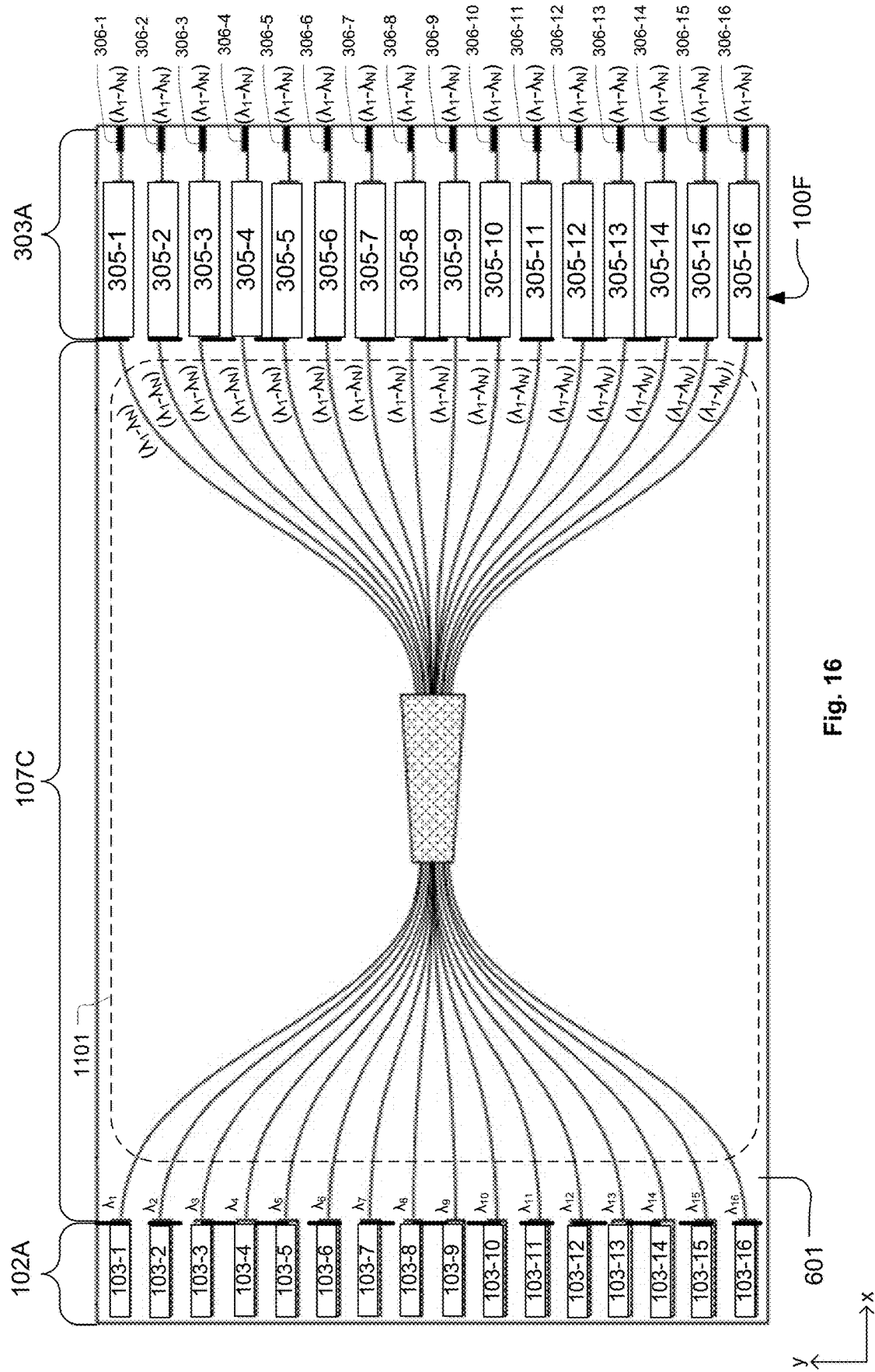
FIG. 16 shows an example implementation of the laser module of FIG. 6A on the PLC in which the marshalling module is implemented to include the star coupler, in accordance with some embodiments of the present invention.

FIG. 13 shows an example implementation of the laser module 100F on the PLC 601 in which the marshalling module 107C is implemented to include the arrayed waveguide 801 and the broadband power splitter 805, in accordance with some embodiments of the present invention. FIG. 14 shows an example implementation of the laser module 100F on the PLC 601 in which the marshalling module 107C is implemented to include the Echelle grating 901 and the broadband power splitter 905, in accordance with some embodiments of the present invention. FIG. 15 shows an example implementation of the laser module 100F on the PLC 601 in which the marshalling module 107C is implemented to include the butterfly waveguide network 1001, in accordance with some embodiments of the present invention. FIG. 16 shows an example implementation of the laser module 100F on the PLC 601 in which the marshalling module 107C is implemented to include the star coupler 1101, in accordance with some embodiments of the present invention.

Figure 17:
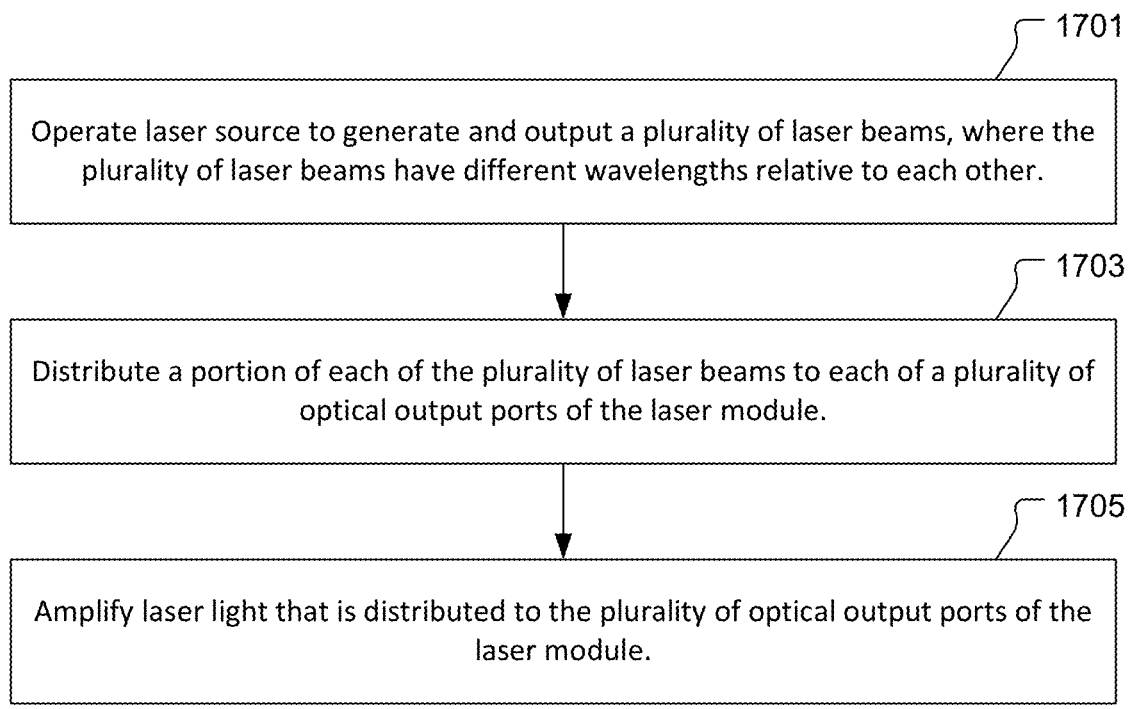
FIG. 17 shows a flowchart of a method for operating a laser module, in accordance with some embodiments of the present invention.

FIG. 17 shows a flowchart of a method for operating a laser module 100A-100F, in accordance with some embodiments of the present invention. The method includes an operation 1701 for operating a laser source to generate and output a plurality of laser beams, where the plurality of laser beams have different wavelengths relative to each other. The different wavelengths of the plurality of laser beams are distinguishable to an optical data communication system. The method also includes an operation 1703 for distributing a portion of each of the plurality of laser beams to each of a plurality of optical output ports of the laser module 100A-100F. The operation 1703 is performed such that all of the different wavelengths of the plurality of laser beams are provided to each of the plurality of optical output ports of the laser module 100A-100F. In some embodiments, the method optionally includes an operation 1705 for amplifying laser light that is distributed to the plurality of optical output ports of the laser module 100A-100F. In some embodiments, the operation 1701 is performed by the laser source 102/102A, and the operation 1703 is performed by the optical marshalling module 107/107A/107B/107C, and the operation 1705 is performed by the optical amplifying module 303/303A. In some embodiments, any two or more of the laser source 102/102A and the optical marshalling module 107/107A/107B/107C and the optical amplifying module 303/303A are operated as physically separate components. Also, in some embodiments, any two or more of the laser source 102/102A and the optical marshalling module 107/107A/107B/107C and the optical amplifying module 303/303A are disposed on a common substrate 110 and/or in a same PLC.

In some embodiments, the method includes directing the plurality of laser beams from the laser source 102/102A into the optical marshalling module 107/107A/107B/107C. In some embodiments, the plurality of laser beams are directed from the laser source 102/102A through an empty space and from the empty space into the optical marshalling module 107/107A/107B/107C. In some embodiments, the method includes transmitting the plurality of laser beams through the optical waveguide 105 in order to direct the plurality of laser beams from the laser source 102/102A into the optical marshalling module 107/107A/107B/107C. In some embodiments, the method includes transmitting the plurality of laser beams through one or more optical vertical coupling device(s) in order to direct the plurality of laser beams from the laser source 102/102A into the optical marshalling module 107/107A/107B/107C. In some embodiments, the method includes maintaining a polarization of the plurality of laser beams as the portions thereof are distributed to each of the plurality of optical output ports of the laser module 100A-100F.

In some embodiments, each of the plurality of laser beams is generated using a respective distributed feedback laser. In some embodiments, the method includes controlling temperatures of the different distributed feedback lasers so as to provide substantial uniformity in temperature-dependent wavelength drift among the different distributed feedback lasers. Also, in some embodiments, the method includes controlling distribution of the portion of each of the plurality of laser beams to each of the plurality of optical output ports of the laser module 100A-100F such that each of the plurality of optical output ports receives a similar amount of optical power of any given one of the plurality of laser beams within a specified factor. In some embodiments, the specified factor is a factor of five. In some embodiments, the specified factor is a factor one, two, three, four, six, or another factor between any of these factors.

It should be further understood, that the present invention also includes methods for manufacturing each of the laser modules 100A-100F as disclosed herein. And, these methods for manufacturing laser modules 100A-100F can include essentially any known established processes and/or techniques for manufacturing semiconductor devices and for manufacturing components/substrates for interfacing with one or more semiconductor devices.

In some embodiments, a laser module 100A-100F is designed to supply laser light having of one or more wavelengths. The laser module 100A-100F can be organized into a number of main components, including:
- a laser source 102/102A, including multiple lasers, e.g., laser diodes, which each produces a subset of the wavelengths output by the laser source 102/102A;
- an optical marshalling module 107/107A/107B/107C that provides a combiner, coupler, and/or splitter network (CCSN), whose inputs are the output wavelengths from the laser source 102/102A;
- an optical amplifier module 303/303A including multiple optical amplifiers which operate to increase the amount of optical power output by the laser module 100A-100F, potentially at a cost of signal-to-noise ratio;
- a fiber coupling array connected to bringing light out of the laser module 100A-100F;
- optical waveguides 105, 301 (that can include couplers, reflective surfaces, and/or lenses) for directing, collimating, and/or coupling light to/from the optical marshalling module 107/107A/107B/107C, from the laser source 102/102A, to/from the fiber coupling array, and to/from the optical amplifier module 303/303A;
- a thermal spreader component, e.g., a thermally-conductive substrate, that thermally links together all of the lasers within the laser source 102/102A (such as copper attaching all the laser diodes together), so that temperature differences between laser diodes are minimized— where, in some embodiments, the thermal spreader component can be the same substrate 110 on which the laser source 102/102A, the optical marshalling module 107/107A/107B/107C, and the optical amplifier module 303/303A are constructed and/or attached.

In various embodiments, the optical marshalling module 107/107A/107B/107C can be constructed in several ways, including using discrete components or as an integrated device, such as a planar lightwave circuit (PLC). Various embodiments of the optical marshalling module 107/107A/107B/107C can include the following features:
- A PLC implementation that provides the advantage that polarization is maintained for light propagating through the optical marshalling module 107/107A/107B/107C.
- A PLC implementation wherein the laser source 102/102A and/or the optical amplifier module 303/303A can be constructed using the same substrate as the optical marshalling module 107/107A/107B/107C— where the substrate of the optical marshalling module 107/107A/107B/107C supports the construction of the laser source 102/102A (such as specific III-V or group IV substrates).
- A PLC implementation wherein the laser source 102/102A and/or the optical amplifier module 303/303A can be attached to the optical marshalling module 107/107A/107B/107C, such as by flip-chip bonding.
- A PLC implementation in which the laser source 102/102A can couple light to and from the structures in the PLC—where the optical marshalling module 107/107A/107B/107C can provide the lasing cavity of the laser source 102/102A and/or one or more optical waveguide(s) from which the output laser light couples into/through coupling devices.
- A PLC implementation in which the optical amplifying module 303/303A can couple light to and from the structures in the PLC—where the optical marshalling module 107/107A/107B/107C can provide one or more optical waveguide(s) from which the input and output light of the optical amplifiers couple to and from the amplifier, such as through appropriate coupling devices including grating couplers, edge couplers, and/or evanescently coupled waveguides, among others.

In some embodiments, a glass substrate may not have sufficient thermal conductivity to provide thermal coupling for the laser source 102/102A. In such embodiments, a silicon substrate (such as using silicon photonics) can be used to provide thermal conductivity, provided that a low-index cladding material (buried oxide or deep trench layer) is also thermally conductive or is not too thick. Alternatively, III-V substrates such as GaAs or InP also have high thermal conductivity and can similarly serve as an appropriate material for thermal coupling for the laser source 102/102A.

In various embodiments, there are multiple possible configurations for the optical marshalling module 107/107A/107B/107C, including the following, among others:
- The optical marshalling module 107/107A/107B/107C can be constructed as a fan-in, fan-out N-to-N symmetric star coupler, which both combines N wavelengths and splits the power N ways.
- The optical marshalling module 107/107A/107B/107C can be constructed as a fan-in, fan-out N-to-M asymmetric star coupler, which both combines N wavelengths and splits the power M ways.
- The optical marshalling module 107/107A/107B/107C can be constructed as an N-to-N star coupler using $N/2*\log_2 N$ of 2×2 splitters/couplers. Such a configuration has sum from n=1 to $\log_2 N-1$ of $(2^n-1)$ waveguide crossings in the most straightforward implementation.
- The optical marshalling module 107/107A/107B/107C can be constructed as a 1-to-N splitter, used in the reverse direction. This configuration outputs ½" of the total input laser power and drops the rest.
- The optical marshalling module 107/107A/107B/107C can be constructed as an Arrayed Waveguide (AWG) plus a splitter.

In some embodiments, the optical amplifier module 303/303A is used to increase the output power of the laser module 100C-100F. In some embodiments, the optical amplifier module 303/303A can include the following features:
- Optical amplifiers can take multiple forms, such as semiconductor optical amplifiers, erbium/ytterbium-doped fiber amplifiers, raman amplifiers, among others.
- Optical amplifiers can be used to amplify input light of only a single wavelength or of a plurality of wavelengths.
- When amplifying a plurality of wavelengths, each optical amplifier can have sufficient optical bandwidth to amplify all the input wavelengths.
- If the wavelengths are broadband enough to exceed the bandwidth of an individual optical amplifier, multiple optical amplifiers can be used to amplify all wavelengths, with each optical amplifier amplifying only the subset of wavelengths falling under its amplification bandwidth. In this scenario, the optical amplifiers can be added to intermediate points within the optical marshalling module 107/107A/107B/107C, with the input to each optical amplifier defined to have the subset of wavelengths that the optical amplifier amplifies.

Figure 18A:
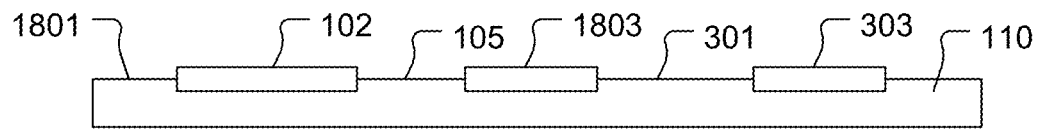
FIG. 18A shows an example interposer device in which the functions of the substrate and waveguides are combined, in accordance with some embodiments of the present invention.

In some embodiments, an interposer device can be configured to provide the combined functions of the substrate 110 and one or more of the optical components (such as the waveguides 105 and 301 and the marshalling modules 107, 107A, 107B, 107C, among others). In some embodiments, the interposer device is implemented within an integrated silicon photonics and/or III-V photonically enabled multi-chip module (MCM), system in package (SiP), heterogeneous integrated product. FIG. 18A shows an example interposer device 1801 in which the functions of the substrate 110 and waveguides 105 and 301 are combined, in accordance with some embodiments of the present invention. In the example of FIG. 18A, the interposer device 1801 serves as the substrate 110 and includes the waveguides 105 and 301. The laser source 102 is interfaced with the interposer device 1801. Also, the optical amplifying module 303 is interfaced with the interposer device 1801.

A silicon photonics die/chip 1803 is also interfaced with the interposer device 1801. In some embodiments, another device that performs the same function as the silicon photonics die/chip 1803 can be substituted for the silicon photonics die/chip 1803. In some embodiments, the silicon photonics die/chip 1803 is configured to have optical interfaces on more than one side. Also, the silicon photonics die/chip 1803 can be configured to have optical interfaces on any combination of sides. However, in some embodiments, the silicon photonics die/chip 1803 is configured to have optical interfaces on just one side. In some embodiments, the silicon photonics die/chip 1803 is a CMOS driver die, with the required silicon photonics devices formed within the interposer device 1801. In these embodiments, the silicon photonics die/chip 1803 configured as the CMOS driver die functions to drive/interact with silicon photonics devices formed within the interposer device 1801.

In some embodiments, the interposer device 1801 combines local metal routing and through-silicon-vias (TSV's) with photonic components. Also, it should be appreciated that the interposer device 1801 includes optical waveguides, which enables creation of various optical devices within the interposer device 1801, such as optical coupler(s), optical splitter(s), optical waveguide(s), optical arrayed waveguide(s) (AWG), optical star coupler(s), among others. For example, with reference to FIG. 3A, in some embodiments the waveguides 105 and 301 and the substrate 110 can be integrated together within a same interposer device and can be formed using the same assembly, material, fabrication process, etc. Also, it should be understood that essentially any one or more optical devices, or portion(s) thereof, can be integrated with the substrate 110 to form an interposer device. For example, with reference to FIG. 3A, in some embodiments the waveguide 105 can be integrated with the substrate 110 within an interposer device, with the waveguide 301 configured as a separate structure that interfaces with the interposer device.

In some embodiments, the interposer device 1801 can also include the silicon photonics die/chip 1803, along with one or more of the substrate 110 and the waveguides 105 and 301. For example, in some embodiments, the interposer device can be configured as a large silicon photonics die/chip 1803 that includes one or more optical waveguides or other types of optical devices. In some embodiments the waveguides 105 and 301, the substrate 110, and the silicon photonics die/chip 1803 can be formed within a same interposer device and can be formed using the same assembly, material, fabrication process, etc. In various embodiments, the interposer device can be fabricated from silicon, glass, and/or other suitable optical-electronic device materials. In some embodiments, optical waveguide structures can be formed within the interposer device using silicon, oxide(s), polymer(s), silicon nitride(s), and/or any other material suitable to form optical waveguides.

Figure 18B:
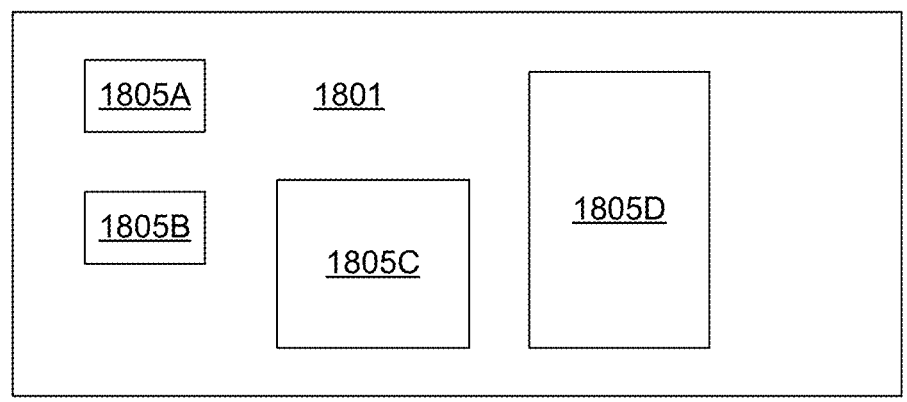
FIG. 18B shows a top architectural view of the interposer device to illustrate flexibility in placement of die/chips relative to the interposer device, in accordance with some embodiments of the present invention.

FIG. 18B shows a top architectural view of the interposer device 1801 to illustrate flexibility in placement of die/chips 1805A-1805D relative to the interposer device 1801, in accordance with some embodiments of the present invention. The die/chips 1805A-1805D can be any electrical and/or opto-electrical device. It should be understood that the four die/chips 1805A-1805D are shown as an example for description purposes. In various embodiments, one or more die/chip(s) (e.g., 1805A-1805D) can be placed on the interposer device 1801 in essentially any position and configuration necessary. Also, it should be understood that multiple die/chips (e.g., 1805A-1805D) can be placed on the interposer device, as needed. In some embodiments, multiple die/chips (e.g., 1805A-1805D) are positioned on the interposer device in a substantially symmetrical configuration within an overall footprint of the interposer device. However, it should be understood that in some embodiments multiple die/chips (e.g., 1805A-1805D) are positioned on the interposer device is a non-symmetrical configuration within an overall footprint of the interposer device.

The interposer device, e.g., 1801, can include metallization for local routing, TSV's, and/or through-glass-vias (TGV's) as needed to provide required electrical connectivity between die/chip(s) and/or other electronic devices that interface with the interposer device. In some embodiments, die/chip(s) can be electrically connected to electrically conductive structures within the interposer device by attaching the die/chip(s) to the interposer device using flip-chip connection technology and/or wire bond connection technology and/or essentially any other type of die/chip connection technology. Also, in various embodiments, optical waveguide structures within die/chip(s) that are interfaced with the interposer device can be edge-coupled (butt-coupled) and/or vertically coupled to optical structures within the interposer device.

Figure 19:
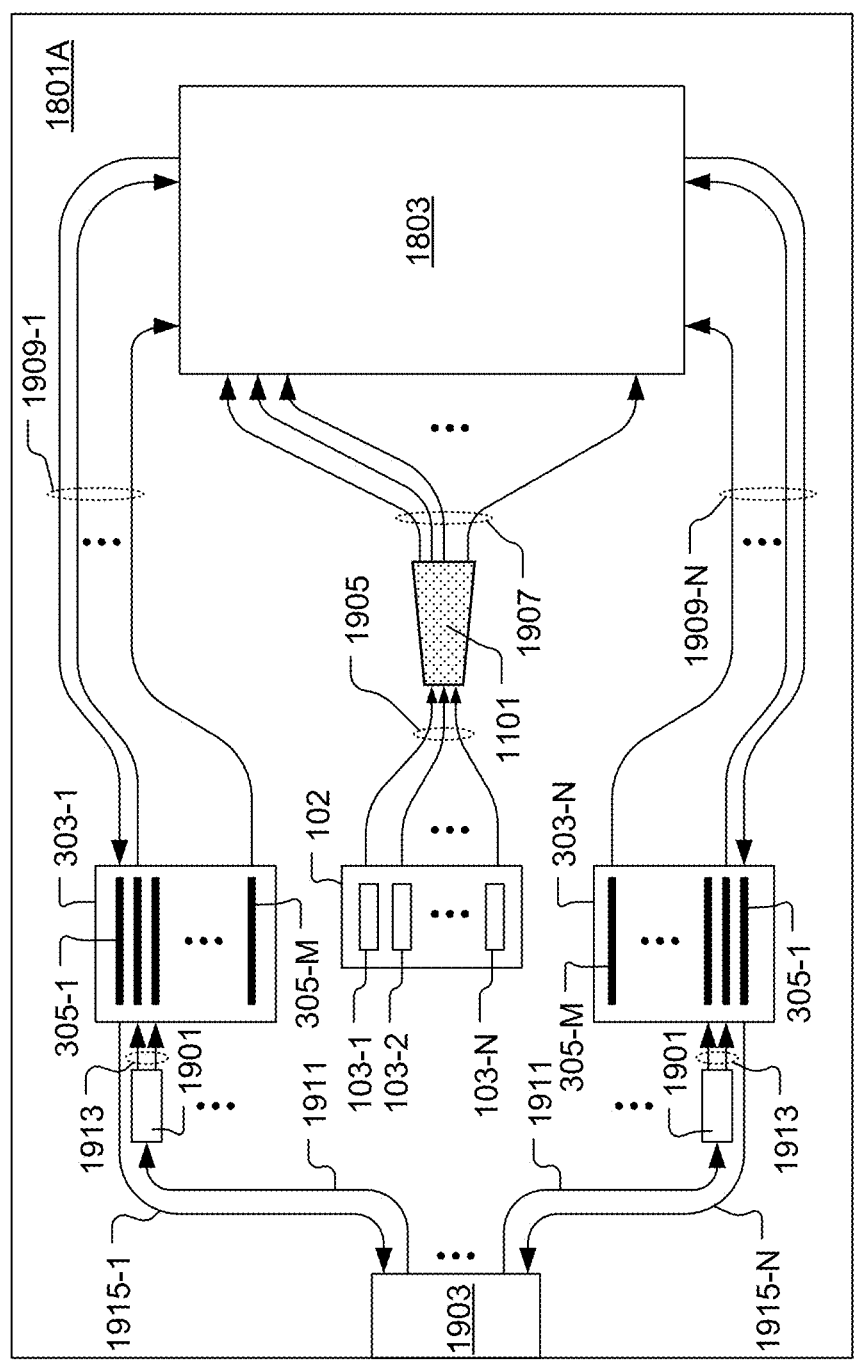
FIG. 19 shows a plan view block diagram of an example interposer device as part of an MCM integrated product, in accordance with some embodiments of the present invention.

FIG. 19 shows a plan view block diagram of an example interposer device 1801A as part of an MCM integrated product, in accordance with some embodiments of the present invention. The interposer device 1801A includes both electrical and optical features/structures. In various embodiments, the interposer device 1801A can be formed of one or more of silicon, glass, ceramic, epoxy composite(s), polymer(s), and combinations thereof, among other materials. The interposer device 1801A functions as both an optical bench, an electrical interposer, and includes/supports integrated photonics, such as the star coupler 1101. It should be understood that the star coupler 1101 is shown in FIG. 19 by way of example. In various embodiments, the star coupler 1101 of FIG. 19 can be replaced with essentially any other suitable type of photonic device, such as one or more of a butterfly network of optical splitters, an Echelle Grating, and/or essentially any other suitable photonic circuit, such as the photonic circuits described herein with regard to the marshalling modules 107, 107A, 107B, 107C.

Also, the interposer device 1801A enables flip-chip connection and/or wire bond connection of electrical, optical, and electro-optic die/chip(s). In the example of FIG. 19, a number (N) of optical amplifier modules 303-1 through 303-N are interfaced with the interposer device 1801A, where N can be one or more. In some embodiments, the optical amplifier modules 303-1 through 303-N are discrete die/chips that are connected to the interposer device 1801A by either flip-chip connection, wire bond connection, or another type of connection. Each optical amplifier module 303-1 through 303-N includes a number (M) of optical amplifiers 305-1 through 305-M. In various embodiments, each optical amplifier module 303-1 through 303-N includes a separate optical amplifier, e.g., one of 305-1 through 305-M, for each optical waveguide that is connected to the optical amplifier module, such that each light signal for data reception is amplified by a corresponding optical amplifier, and such that each light signal for data transmission is amplified by a corresponding optical amplifier. Each of the optical amplifier modules 303-1 through 303-N is optically connected to a fiber-to-interposer connection 1903 through a corresponding optical waveguide 1915-1 through 1915-N. The direction of the arrows that represent the optical waveguide structures 1915-1 through 1915-N indicate the direction of light propagation through the optical waveguide structures 1915-1 through 1915-N.

Also, in the example of FIG. 19, the laser source 102 is interfaced with the interposer device 1801A. In some embodiments, the laser source 102 is a discrete die/chip that is connected to the interposer device 1801A by either flip-chip connection, wire bond connection, or another type of connection. The laser source 102 includes (N) lasers 103-1 through 103-N. The interposer device 1801A includes optical waveguide structures 1905 to direct laser light from the laser source 102 to the star coupler 1101 (or other photonic device). The star coupler 1101 (or other photonic device) is formed within the interposer device 1801A. In other words, the star coupler 1101 (or other photonic device) is a photonics device formed as part of the interposer device 1801A. The interposer device 1801A also includes optical waveguide structures 1907 to direct laser light from the star coupler 1101 (or other photonic device) to the silicon photonics die/chip 1803. The optical waveguide structures 1905 and 1907 are formed within the interposer device 1801A. The direction of the arrows that represent the optical waveguide structures 1905 and 1907 indicate the direction of light propagation through the optical waveguide structures 1905 and 1907. In some embodiments, the silicon photonics die/chip 1803 is a discrete die/chip that is connected to the interposer device 1801A by either flip-chip connection, wire bond connection, or another type of connection. Also, the silicon photonics die/chip 1803 is optically connected to each of the optical amplifying modules 303-1 through 303-N through a corresponding set of optical waveguides 1909-1 through 1909-N. The direction of the arrows that represent the optical waveguide structures 1909-1 through 1909-N indicate the direction of light propagation through the optical waveguide structures 1909-1 through 1909-N. In some embodiments, the interposer device 1801A can include one or more integrated isolator(s) to support optimization of optical waveguide structures (e.g., 1905, 1907, 1909-1 through 1909-N, etc.) and corresponding architectural layout of the MCM integrated product. In some embodiments, the integrated isolator(s) can be discrete isolators integrated within the interposer device 1801A.

The example of FIG. 19 shows one fiber-to-interposer connection 1903. However, it should be understood that in some embodiments multiple fiber-to-interposer connections 1903 can be provided to receive light signals into the interposer device 1801A. In some embodiments, the fiber-to-interposer connection 1903 can be configured to include a v-groove array that aligns optical fibers to spot size converters on the interposer device 1801A. However, it should be understood that in various embodiments essentially any configuration of fiber-to-interposer connection 1903 can be used so long as the fiber-to-interposer connection 1903 is configured to direct light from one or more optical fiber(s) to one or more corresponding optical waveguide(s) within the interposer device 1801A, vice-versa.

Light coming into the fiber-to-interposer connection 1903 may not have controlled polarization. Also, it can be more efficient to implement optical amplifier modules 303-1 through 303-N that amplify in only one polarization. Therefore, a plurality of polarization rotators 1901 are provided to receive the input light from the fiber-to-interposer connection 1903 and split both TE and TM polarizations of that input light into TE polarization. In various embodiments, each of the polarization rotators 1901 can be either a discrete component bonded to the interposer device 1801A or can be integrated within the interposer device 1801A. In some embodiments, all of the polarization rotators 1901 are discrete components bonded to the interposer device 1801A. In some embodiments, all of the polarization rotators 1901 are integrated within the interposer device 1801A. In some embodiments, a portion of the polarization rotators 1901 are discrete components bonded to the interposer device 1801A, and a portion of the polarization rotators 1901 are integrated within the interposer device 1801A. Each polarization rotator 1901 is optically connected to a corresponding optical waveguide 1911 that functions as an input waveguide to direct light from the fiber-to-interposer connection 1903 to the polarization rotator 1901. Also, each polarization rotator 1901 is optically connected to two corresponding optical waveguides 1913 that function as output waveguides to direct light from the polarization rotator 1901 to one of the optical amplifier modules 303-1 through 303-N which in turn function to amplify the light signal.

It should be understood that the polarization rotator 1901 along with its corresponding input optical waveguide 1911 and along with its corresponding two output optical waveguides 1913 collectively form a set of structures that is replicated (y) times on/within the interposer device 1801A for each optical amplifier module 303-1 through 303-N. For example, consider that the fiber-to-interposer connection 1903 supports connection of 12 optical fibers. Also, for this example, consider that there are two optical amplifier modules 303-1 and 303-2 on/within the interposer device 1801A. So, for this example, each of the two optical amplifier modules 303-1 and 303-2 will service 6 optical fibers, i.e., half, of the 12 optical fibers connected to the fiber-to-interposer connection 1903. And, in this example, of the 6 optical fibers serviced by a given one of the two optical amplifier modules 303-1 and 303-2, 3 optical fibers will be for data transmission (TX) and 3 optical fibers will be for data reception (RX). Therefore, in this example, there will be 3 (y=3) polarization rotators 1901, along with their corresponding input optical waveguides 1911 and output optical waveguides 1913, connected to service the optical amplifier module 303-1. And, in this example, there will be 3 (y=3) polarization rotators 1901, along with their corresponding input optical waveguides 1911 and output optical waveguides 1913, connected to service the optical amplifier module 303-2. It should be understood that the number (y) of polarization rotators 1901 that are optically connected to a given optical amplifier module 303-1 through 303-N can increase linearly with an increase in the number of optical fiber connections to the interposer device 1801A. In various embodiments, the number of optical fiber connections to the interposer device 1801A can be increased by replicating the fiber-to-interposer connection 1903 and/or by increasing the number of optical fibers per fiber-to-interposer connection 1903.

With regard to fabrication of the polarization rotators 1901, it can be beneficial to have low temperature processing when forming the optical waveguide structures on the interposer device 1801A. Within this context, low temperature processing means less than about 450° C. An example polarization rotator that is compatible with Front End Of Line (FEOL) SOI (Silicon on Insulator) wafers is described in "Polarization rotator-splitters and controllers in a Si 3 N 4-on-SOI integrated photonics platform," by Sacher, Wesley D., et al., Optics express 22.9 (2014): 11167-11174 ("Sacher" hereafter), which is incorporated herein by reference in its entirety for all purposes. However, the polarization rotator of Sacher limits the polarization rotator-splitter to FEOL and SOI interposer devices. In order to make the polarization rotator of Sacher more functional, the polarization rotator can be implemented using low temperature processing in the Back End of Line (BEOL). One challenge in this regard is use of BEOL compatible films. Low temperature amorphous silicon (a-Si and/or a-Si—H) is known as a low attenuation film, such as described in "Use of amorphous silicon for active photonic devices," by Della Corte, Francesco Giuseppe, and Sandro Ra, IEEE Transactions on Electron Devices 60.5 (2013): 1495-1505 ("Corte" hereafter), which is incorporated herein by reference in its entirety for all purposes. Additionally, low temperature and low loss PECVD SiNx been demonstrated, such as described in "Material and optical properties of low-temperature NH3-free PECVD SiNx layers for photonic applications," by Bucio, Thalía Domínguez, et al., Journal of Physics D: Applied Physics 50.2 (2016): 025106 ("Bucio" hereafter), which is incorporated herein by reference in its entirety for all purposes.

Consider the following example structure: a SiNx layer having a thickness between about 200 nanometers (nm) and about 400 nm, that can be patterned and etched to form an optical waveguide in the O to C-band. Below this optical waveguide layer of SiNx, a layer of silicon dioxide is placed having a thickness between about 50 nm and about 200 nm. Below this layer of silicon dioxide, a layer of a-Si—H (or a-Si) is placed having a thickness between about 150 nm to about 300 nm. This layer of a-Si—H (or a-Si) is another optical waveguide layer and can be patterned and etched as described in Sacher. In some embodiments, the a-Si—H (or a-Si) layer can be fabricated over the SiNx layer, rather than below as described above. It should be understood that the above-mentioned layers of the example structure enable a polarization rotator-splitter to be fabricated in a BEOL interposer device flow, thereby making it compatible with high-volume and low-cost interposer device fabrication objectives.

Figure 20A:
FIG. 20A shows a vertical cross-section view block diagram of the interposer device as part of the MCM integrated product, in accordance with some embodiments of the present invention.

FIG. 20A shows a vertical cross-section view block diagram of the interposer device 1801A as part of the MCM integrated product, in accordance with some embodiments of the present invention. In the example of FIG. 20A, the laser source 102, the optical amplifier modules 303-1 through 303-N, and the silicon photonics die/chip 1803 are recessed into the interposer device 1801A. This type of recessed interfacing with the interposer device 1801A enables edge coupling of optical waveguides within interposer device 1801A with optical waveguides within each of the laser source 102, the optical amplifier modules 303-1 through 303-N, and the silicon photonics die/chip 1803, such as previous discussed with regard to FIG. 5B by way of example. Also, it should be understood that the interposer device 1801A and any of the laser source 102, the optical amplifier modules 303-1 through 303-N, and the silicon photonics die/chip 1803 can include spot size converters, as appropriate. The inclusion of spot size converters can be useful given that the placement accuracy of die/chips (e.g., the laser source 102, the optical amplifier modules 303-1 through 303-N, and the silicon photonics die/chip 1803) on the interposer device 1801A can be within about one micrometer of a target position.

Figure 20B:
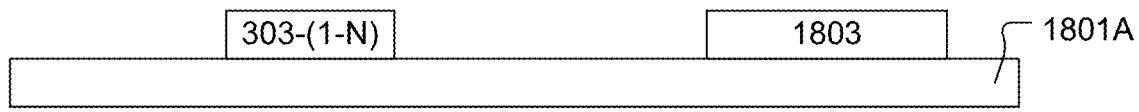
FIG. 20B shows another vertical cross-section view block diagram of the interposer device as part of the MCM integrated product, in accordance with some embodiments of the present invention.

FIG. 20B shows another vertical cross-section view block diagram of the interposer device 1801A as part of the MCM integrated product, in accordance with some embodiments of the present invention. In the example of FIG. 20B, the laser source 102, the optical amplifier modules 303-1 through 303-N, and the silicon photonics die/chip 1803 are positioned and mounted on top of the interposer device 1801A. This type of top-mount interfacing with the interposer device 1801A enables vertical coupling of optical waveguides within interposer device 1801A with optical waveguides within each of the laser source 102, the optical amplifier modules 303-1 through 303-N, and the silicon photonics die/chip 1803, such as previous discussed with regard to FIG. 3Y by way of example.

Figure 20C:
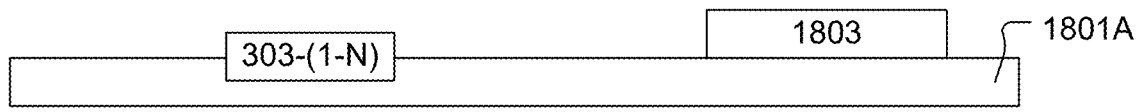
FIG. 20C shows another vertical cross-section view block diagram of the interposer device as part of the MCM integrated product, in accordance with some embodiments of the present invention.

FIG. 20C shows another vertical cross-section view block diagram of the interposer device 1801A as part of the MCM integrated product, in accordance with some embodiments of the present invention. In the example of FIG. 20C, the optical amplifier modules 303-1 through 303-N are recessed into the interposer device 1801A to enable edge coupling of optical waveguides within interposer device 1801A with optical waveguides within the optical amplifier modules 303-1 through 303-N. And, in the example of FIG. 20C, the silicon photonics die/chip 1803 is positioned on top of the interposer device 1801A to enable vertical coupling of optical waveguides within interposer device 1801A with optical waveguides within the silicon photonics die/chip 1803. It should be understood that in various embodiments the interposer device 1801A can be configured to provide essentially any combination of edge coupling and vertical coupling between optical waveguides within the interposer device 1801A and optical waveguides within any die/chip that interfaces with the interposer device 1801A. Therefore, in some embodiments, such as the example of FIG. 20C, some die/chip(s) can be interfaced with the interposer device 1801A in a recessed configuration, and some die/chip(s) can be interfaced with the interposer device 1801A in a top-mount, i.e., surface-mount, configuration. Also, in some embodiments, both the top and bottom surfaces of the interposer device 1801A can have one or more interfacing die/chip(s) that are recess-mounted and/or surface-mounted.

Figure 21:
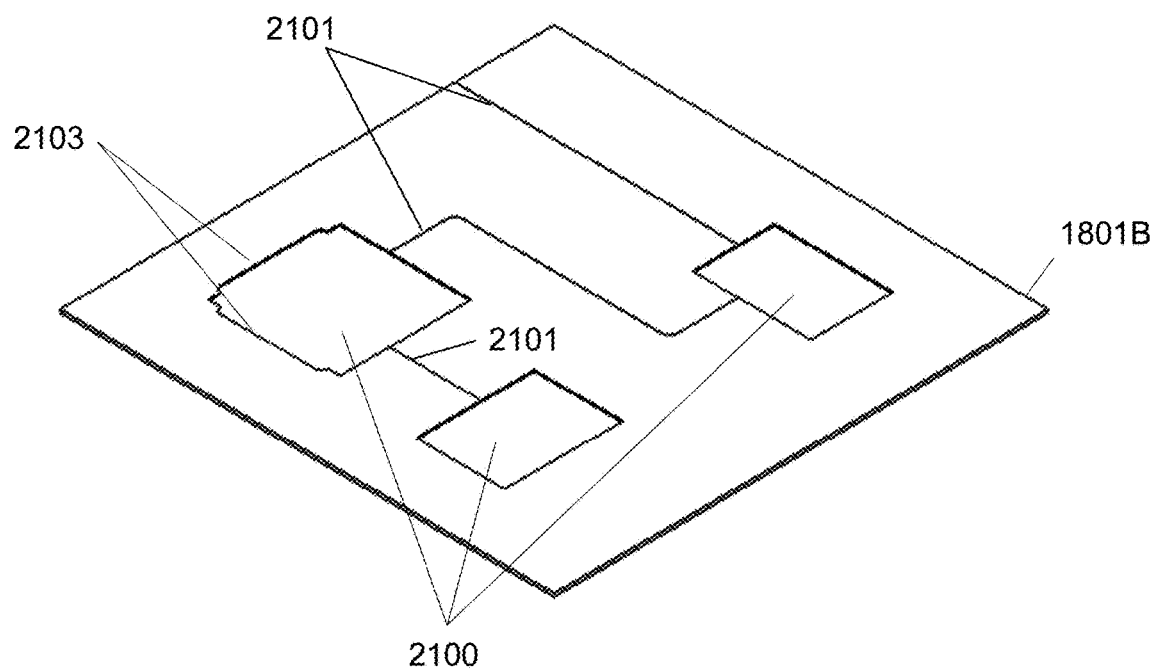
FIG. 21 shows an isometric view of a top surface of an example interposer device, in accordance with some embodiments of the present invention.

FIG. 21 shows an isometric view of a top surface of an example interposer device 1801B, in accordance with some embodiments of the present invention. The interposer device 1801B includes cavities/recesses 2100 formed within its top surface. The cavities/recesses 2100 are formed to receive die/chips to enable optical edge coupling of the die/chips to optical waveguides within the interposer device 1801B. Each of the die/chips can be essentially any type of die/chip, including a photonic die/chip, an electronic die/chip, a silicon photonic die/chip, among others. When an optical waveguide within a die/chip is to be edge coupled to a corresponding optical waveguide within the interposer device 1801B, it can be beneficial to place the optical waveguide within the die/chip in close proximity to the optical waveguide within the interposer device 1801B, where close proximity is considered less than about 10 micrometers along an axis of light propagation between the connecting optical waveguides. Therefore, it should be appreciated that the cavity/recess 2100 is formed so that sidewall(s) of the cavity/recess 2100 where edge coupling is to be done is/are in very close proximity to the die/chip when the die/chip is positioned within the cavity/recess 2100. The example interposer device 1801B is shown to include optical waveguides 2101 to illustrate that the optical waveguides 2101 can have an arbitrary routing path within the interposer device 1801B and to illustrate that the optical waveguides 2101 can optically connect with the die/chip(s) at more than one edge of the die/chip(s). It should be understood that each of the cavities/recesses 2100 can be configured to have any size, peripheral shape, and depth as needed to accommodate receipt of a die/chip. Also, each of the cavities/recesses 2100 can be configured to have either a uniform depth or a non-uniform depth, i.e., multiple depths, as needed to accommodate receipt of a die/chip. Also, the example of FIG. 21 shows that in some embodiments one or more of the cavities/recesses 2100 can be configured to have side protrusions (or pockets) 2103 to serve as epoxy reservoirs for capillary underfill.

Figure 22:
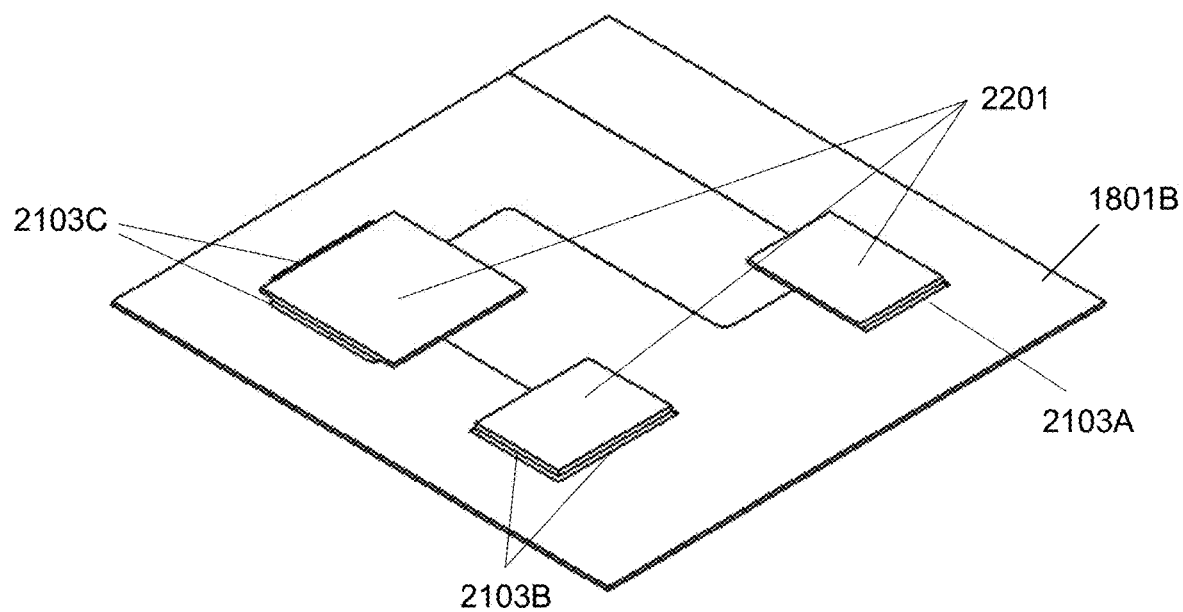
FIG. 22 shows the example interposer device of FIG. 21 with die/chips positioned within the cavities/recesses, in accordance with some example embodiments of the present invention.

FIG. 22 shows the example interposer device 1801B of FIG. 21 with die/chips 2201 positioned within the cavities/recesses 2100, in accordance with some example embodiments of the present invention. FIG. 22 shows a side protrusion 2103A on one side of a die/chip 2201 where the cavity/recess 2100 is larger than the die/chip 2201. Epoxy can be disposed within the side protrusion 2103A to create an epoxy reservoir. The epoxy is disposed within the side protrusion 2103A so as to not cover the top of the die/chip 2201. In some situations, epoxy present on the top of the die/chip 2201 can cause adverse effects such as creation of a higher thermal resistance path and/or cause stress fractures. For example, if epoxy is present on the top of the die/chip 2201 and a lid is placed over the die/chip 2201, the epoxy can cause stress fractures. The epoxy present within the side protrusion 2103A serves to fill voids between the die/chip 2201 and the interposer device 1801B, including between the sidewalls of the cavities/recesses 2100 and the die/chips 2201. This process is referred to as capillary underfill. FIG. 22 also shows how a given die/chip 2201 can be positioned within a cavity/recess 2100 that has two or more side protrusions 2103B. Also, FIG. 22 also shows how a given die/chip 2201 can be positioned within a cavity/recess 2100 that has side protrusions 2103C of different shape.

FIGS. 23A through 23F show an integrated mechanical transfer (MT) ferrule for connection to an interposer device 1801C, in accordance with some embodiments of the present invention. In some embodiments, the MT ferrule can be used as the fiber-to-interposer connection 1903. The MT ferrule includes a top half 2301 and a bottom half 2303. The top half 2301 and bottom half 2303 of the MT ferrule can be formed of silicon, glass, plastic, or other material that is chemically compatible with surrounding/interfacing materials and that is capable of providing required thermal and mechanical performance. The top half 2301 and bottom half 2303 of the MT ferrule can be configured to include one or more alignment keys 2305 to provide for alignment and fitting of the top half 2301 with the bottom half 2303. For example, in the example MT ferrule of FIGS. 23A through 23F, the alignment keys 2305 on the top half 2301 protrude outward from the top half 2301 and have shapes that are complementary with, i.e., fit conformally into, the alignment keys 2305 on the bottom half 2303 which are formed as cavities/recesses within the bottom half 2303. In various embodiments, the alignment keys 2305 can have various cross-section shapes such as triangular, rectangular, circular, or another shape. The top half 2301 of the MT ferrule also includes one or more partial holes 2307, and the bottom half 2303 of the MT ferrule also includes one or more partial holes 2309. The partial holes 2307 and 2309 together form alignment holes to provide for alignment of the integrated MT ferrule with another mating MT ferrule or with another compatibly formed connector structure/device. In some embodiments, one or more tabs 2311 of the interposer device 1801C structure remain after the interposer device 1801C is formed to accommodate installation of the integrated MT ferrule. In some embodiments, the one or more tabs 2311 are eliminated.

Figure 23A:
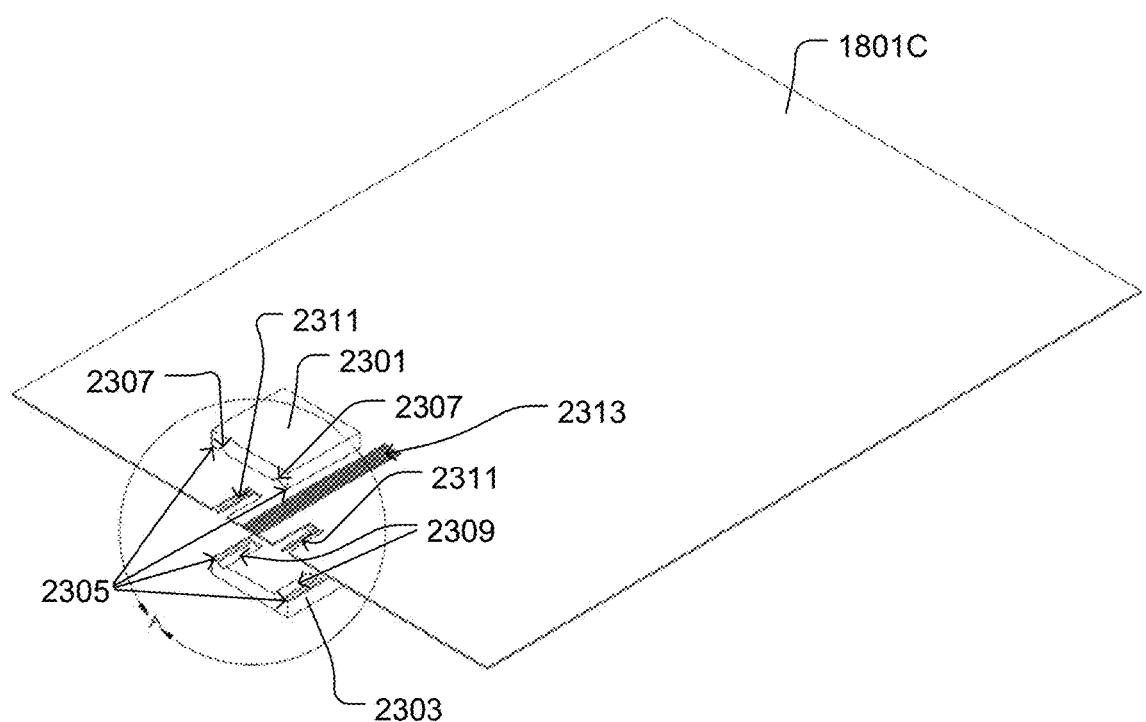
FIGS. 23A through 23F show an integrated MT ferrule for connection to an interposer device, in accordance with some embodiments of the present invention.
Figure 23B:
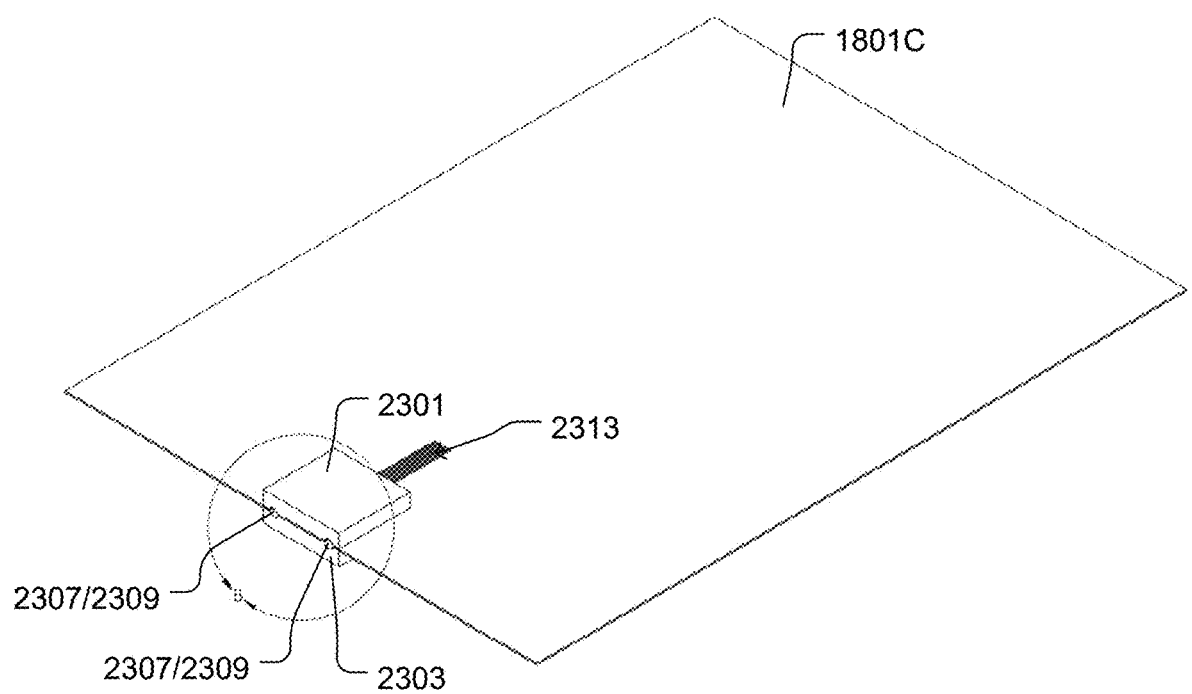
Figure 23C:
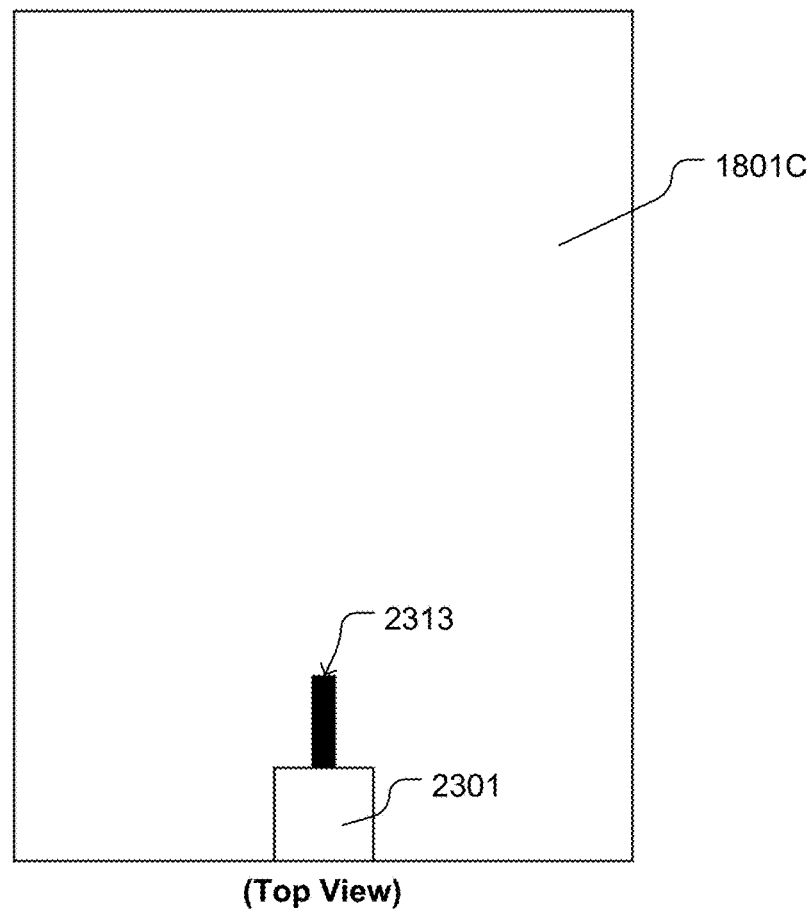
Figure 23D:
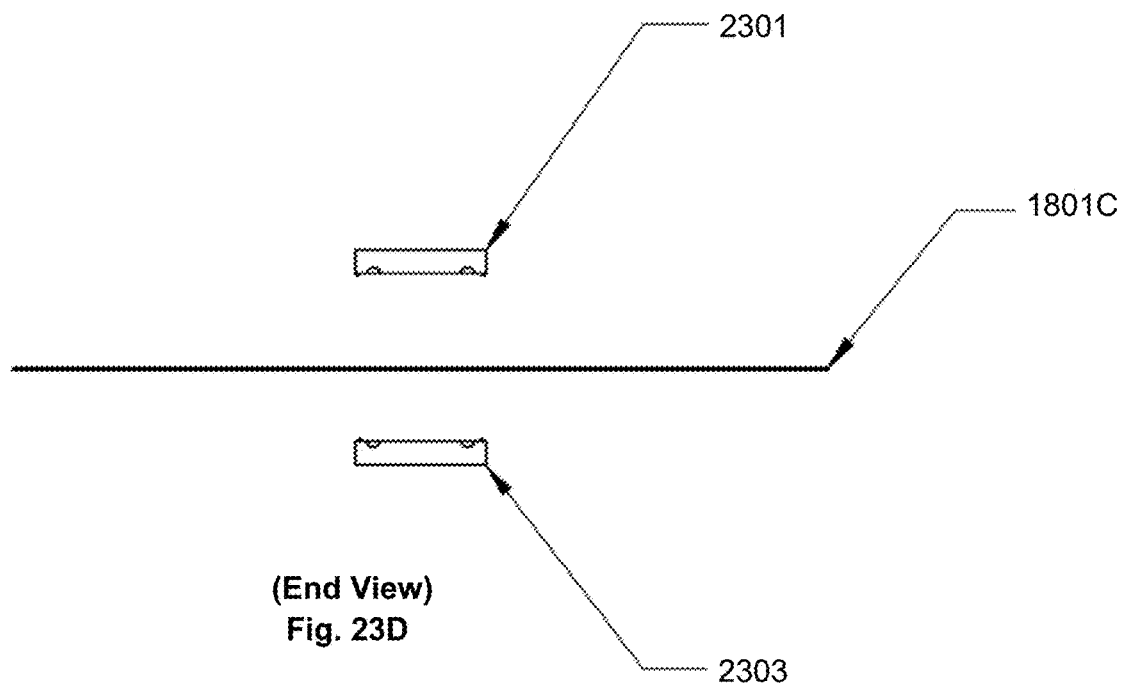
Figure 23E:
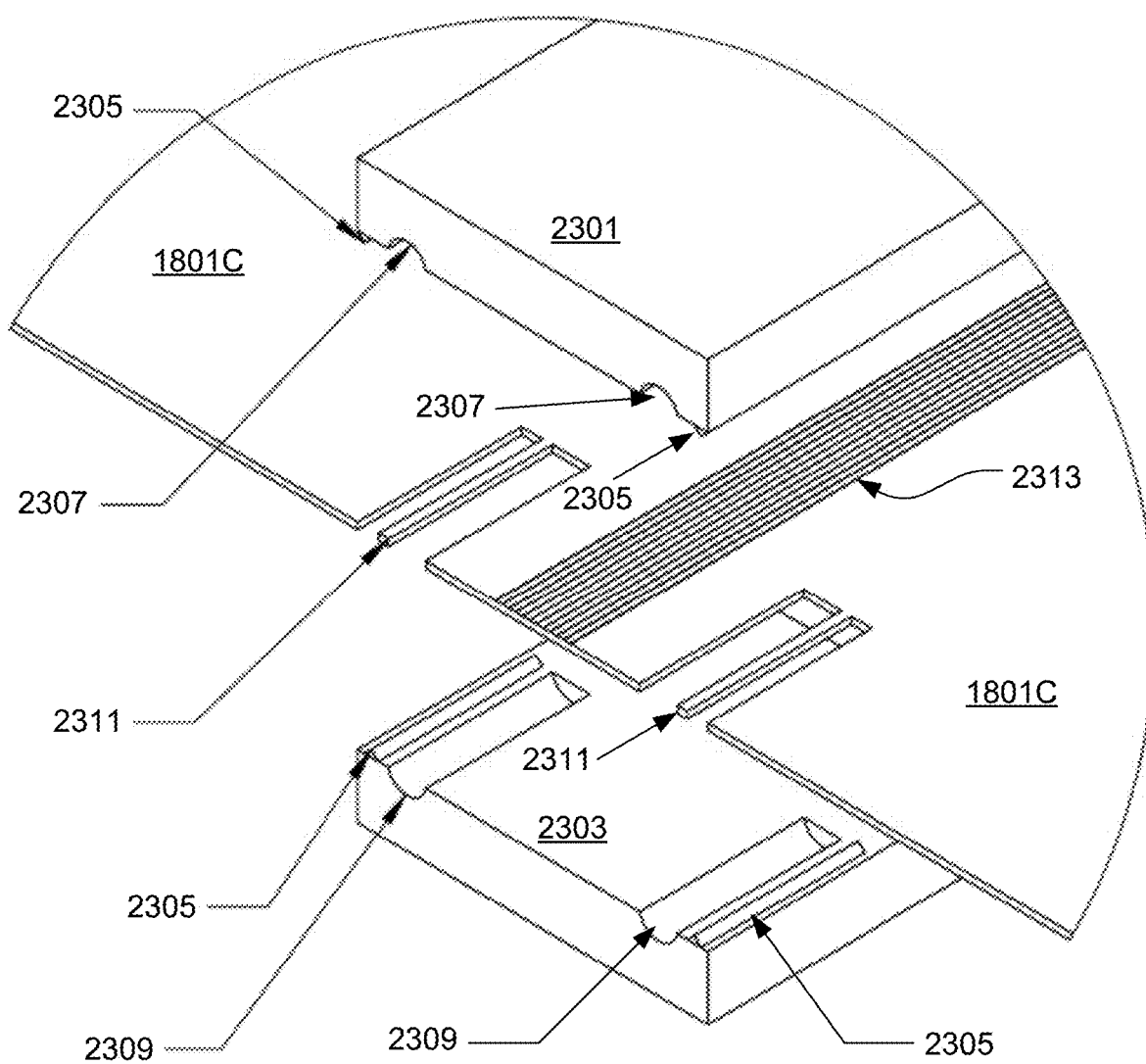
Figure 23F:
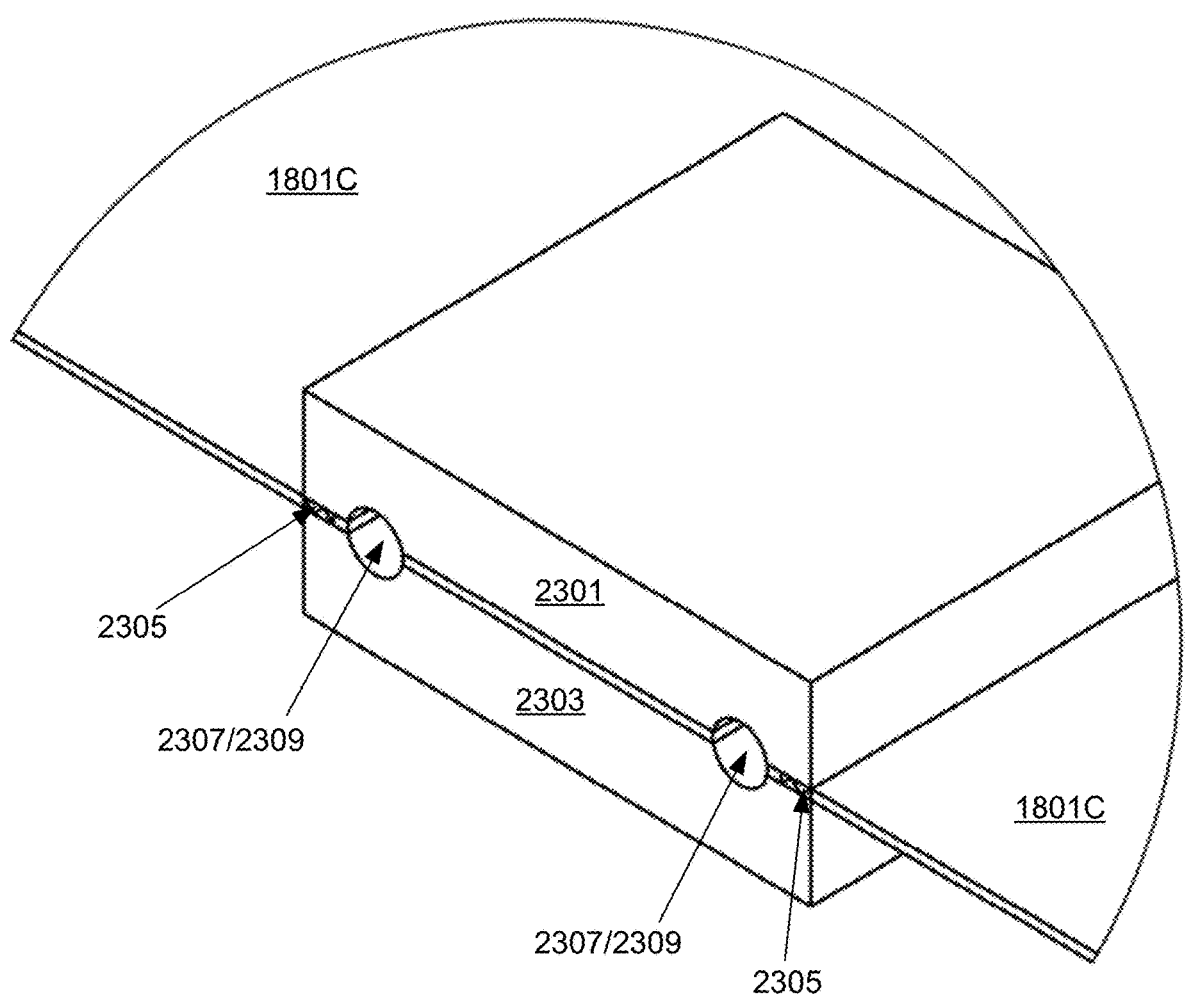

The top half 2301 and the bottom half 2303 are mounted to the interposer device 1801C to form the integrated MT ferrule, as shown in FIG. 23B. In various embodiments, the top half 2301 and the bottom half 2303 can be mounted to the interposer device 1801C using epoxy, glue, solder, or any other suitable adhesive. After the top half 2301 and the bottom half 2303 of the MT ferrule are mounted to the interposer device 1801C to form the integrated MT ferrule, the integrated MT ferrule has a structure that is compatible with another mating connector structure/device, such as with a standard MT ferrule, by way of example. It should be understood, however, that the integrated MT ferrule can be configured to be compatible with essentially any other form of mating connector structure/device, and is not limited to use with standard MT ferrules. The interposer device 1801C includes a number of optical waveguides 2313 that extend to the edge of the interposer device 1801C at a location between the top half 2301 and the bottom half 2303 of the integrated MT ferrule. In some embodiments, the optical waveguides 2313 are positioned in accordance with a same pitch as the optical fiber receptacles within a connector structure/device that is to mate with the integrated MT ferrule, such as the pitch as the optical fiber receptacles within a standard MT ferrule, by way of example. In some embodiment, the edge of the interposer device 1801C can be polished at the optical waveguide locations. Also, in some embodiments, the interposer device 1801C can include one or more spot size converters to work in conjunction with the integrated MT ferrule to improve optical coupling. For example, in some embodiments, such a spot size converter can be configured as an inverse taper of the optical waveguide.

Figure 24:
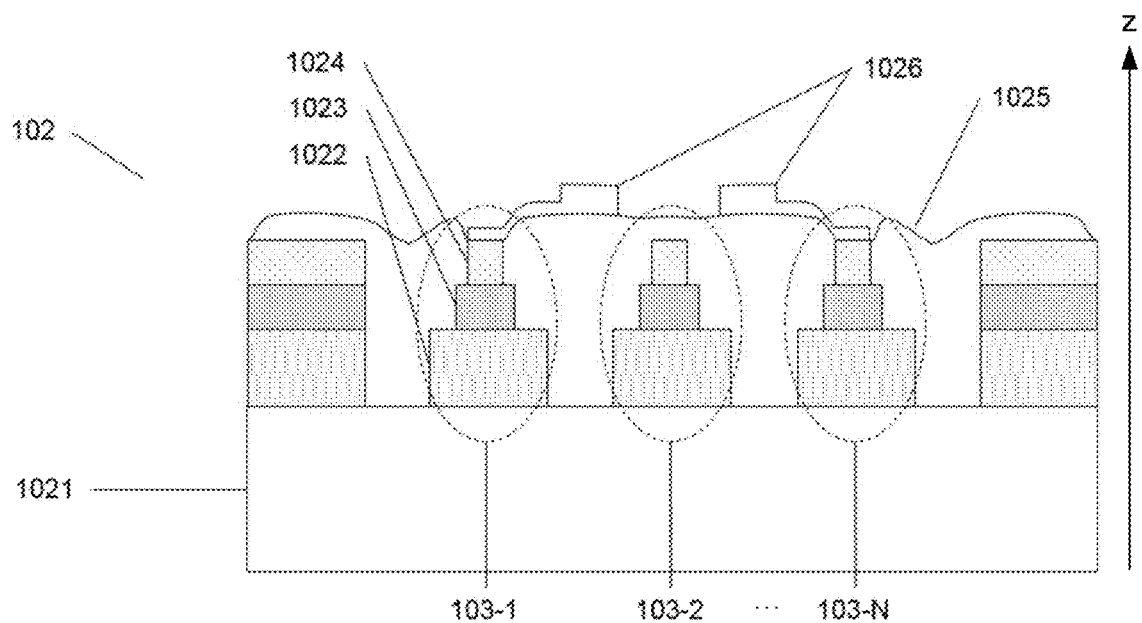
FIG. 24 shows an example vertical cross-section through the laser source, in accordance with some embodiments of the present invention.

FIG. 24 shows an example vertical cross-section through the laser source 102, in accordance with some embodiments of the present invention. It should be understood, however, that the principles described with regard to FIG. 24 can be applied to other electronic and/or photonic devices, such as the optical amplifying module 303 by way of example. For discussion purposes, the cross-section of FIG. 24 shows the plurality of lasers 103-1 to 103-N. It should be understood, however, that with other electronic and/or photonic devices, the plurality of lasers 103-1 to 103-N could be other components. For example, if the cross-section of FIG. 24 was of the optical amplifying module 303 instead of the laser source 102, the plurality of optical amplifiers 305-1 to 305-M could be substituted for the plurality of lasers 103-1 to 103-N. The vertical cross-section of FIG. 24 shows a substrate 1021 of the electronic and/or photonic device, e.g., of the laser source 102. In some embodiments, the substrate 1021 is formed of InP.

For III-V-based photonic devices, features can be defined using epitaxial growth (in the z-direction) of various epitaxial layers. Since the functioning of the device is dependent upon the characteristics of the epitaxial layers, such as composition and thickness, formation of the epitaxial layers is very well controlled. The vertical cross-section of FIG. 24 shows three example epitaxial layers 1022, 1023, and 1024. In some embodiments, the epitaxial layer 1022 is a first photonic layer formed by epitaxial growth. In some embodiments, the epitaxial layer 1022 is the N-type portion of a PIN diode. It should be understood that the PIN diode is a component of distributed feedback lasers (DFB) and semiconductor optical amplifiers (SOA). In some embodiments, the epitaxial layer 1023 is a second photonic layer formed by epitaxial growth. In some embodiments, the epitaxial layer 1023 is the intrinsic portion of the PIN diode. In some embodiments, the epitaxial layer 1024 is a third photonic layer formed by epitaxial growth. In some embodiments, the epitaxial layer 1024 is the p-type portion of the PIN diode.

The vertical cross-section of FIG. 24 also shows a planarization layer 1025. In various embodiments, the planarization layer 1025 can be formed of benzocyclobutene (BCB), or of spin on dielectric (SOD), or of one or more other material(s) used in semiconductor fabrication to form planarization layers. In some embodiments, the material of the planarization layer 1025 is spun on the wafer/substrate. The process of spinning the material of the planarization layer 1025 on the wafer/substrate can cause peaks and valleys to form, depending on the topology of the features over which the material of the planarization layer 1025 is being deposited. These peaks and valleys cause variation in thickness of the planarization layer 1025 across the wafer/substrate. Also, there can be variation in thickness of the planarization layer 1025 as a function of radial position across the wafer/substrate, e.g., wafer/substrate center-to-edge variation in thickness of the planarization layer 1025.

The vertical cross-section of FIG. 24 also shows an electrically conductive interconnect structure 1026 for the devices. In some example embodiments, electrically conductive interconnect structures, e.g., 1026, of III-V devices can be formed of one or more of Au, Ag, W, Ni, and other metals/alloys. In the example of FIG. 24, the electrically conductive interconnect structure 1026 provides for flip-chip connection of the laser source 102 to an interposer device. For example, the electrically conductive interconnect structure 1026 can be soldered to corresponding electrically conductive structures on the interposer device.

Figure 25:
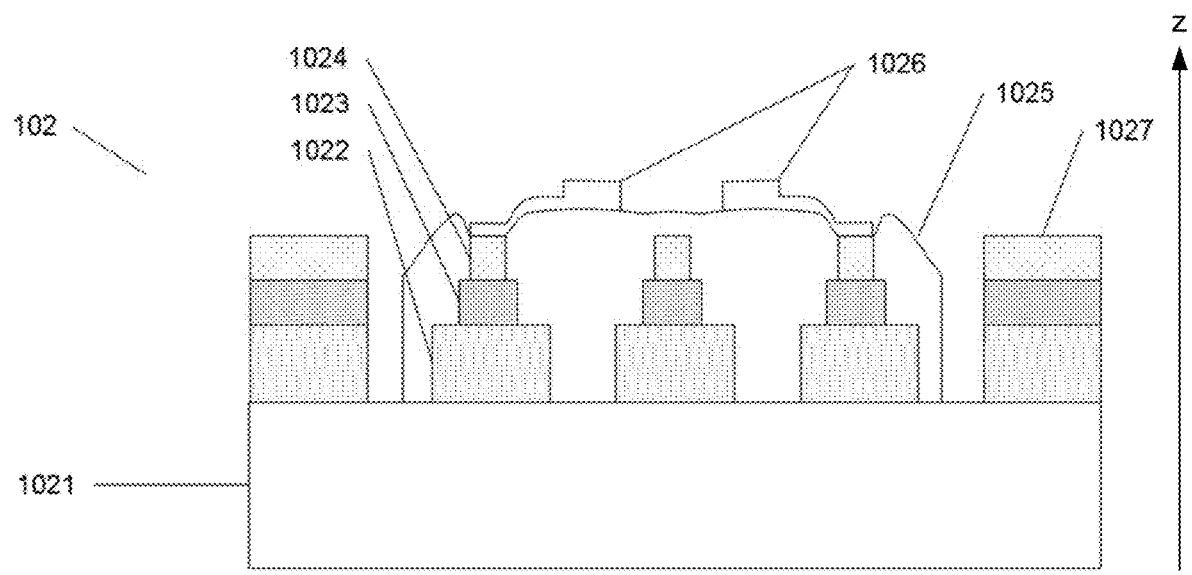
FIG. 25 shows the vertical cross-section of FIG. 24 after etching of the planarization layer to reveal portions of the epitaxial layer (the third photonic layer), in accordance with some embodiments of the present invention.

FIG. 25 shows the vertical cross-section of FIG. 24 after etching of the planarization layer 1025 to reveal portions 1027 of the epitaxial layer 1024 (the third photonic layer), in accordance with some embodiments of the present invention. The revealed portions 1027 of the epitaxial layer 1024 function as "bonding shoulders." After the planarization layer 1025 is etched to reveal the portions 1027, the z-direction position of the top surfaces of the portions 1027 of the epitaxial layer 1024 are the same as when the epitaxial growth of the epitaxial layer 1024 was completed. Because the epitaxial growth of the epitaxial layer 1024 is well-controlled in the z-direction (much more controlled than the z-direction thickness of the planarization layer 1025), the revealed portions 1027 of the epitaxial layer 1024 provide reference structures that can be used for accurate and improved z-direction control of a flip-chip operation. Also, it should be noted that optical waveguides formed on the laser source 102 can be formed from the epitaxial layers 1022, 1023, and 1024. Therefore, use of the revealed portions 1027 of the epitaxial layer 1024 as reference structures for z-direction control in the flip-chip connection operation enables more reliable optical coupling between optical waveguides of the laser source 102 and optical waveguides of the interposer device.

Figure 26:
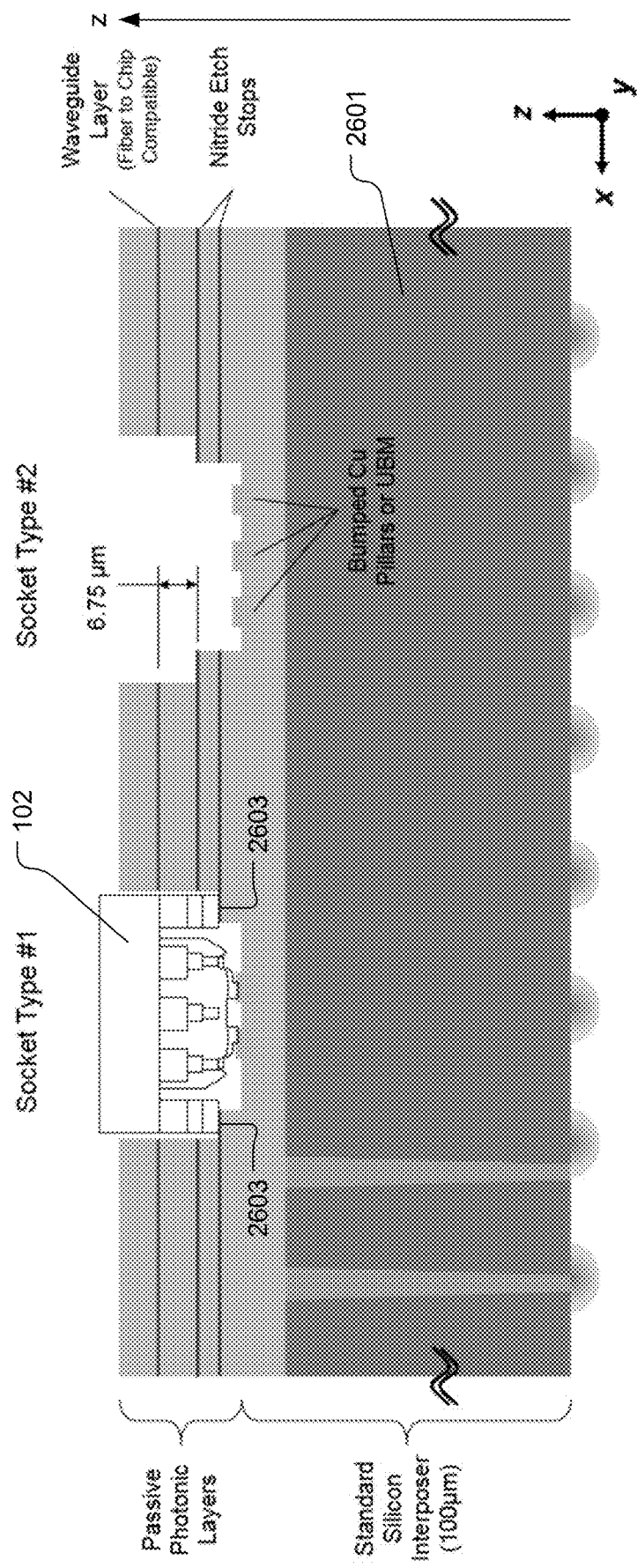
FIG. 26 shows a vertical cross-section of the laser source of FIG. 25 flip-chip connected to an interposer device, in accordance with some embodiments of the present invention.

FIG. 26 shows a vertical cross-section of the laser source 102 of FIG. 25 flip-chip connected to an interposer device 2601, in accordance with some embodiments of the present invention. In the example of FIG. 26, the revealed portions 1027 of the epitaxial layer 1024 are bonded to the nitride etch stops within a socket/cavity of the interposer device 2601, as shown at locations 2603. In the example of FIG. 26, the interposer device 2601 is a silicon interposer. The nitride etch stops, and the rest of the interlevel dielectric (ILD) layers of the interposer device 2601 can be formed by wafer-level deposition techniques, such as chemical vapor deposition (CVD) and/or atomic layer deposition (ALD), among others. Therefore, the accuracy and precision of the nitride etch stops and the other ILD layers within the interposer device 2601 is well-defined and well-controlled. This in turn leads to good control over the z-direction alignment between the laser source 102 and the interposer device 2601.

In some embodiments, the interposer device 1801/1801A/1801B/1801C is disclosed to include a substrate. The substrate includes a laser source chip interface region configured to receive the laser source chip 102. The substrate also includes a silicon photonics chip interface region configured to receive the silicon photonics chip 1803. The substrate also includes an optical amplifier module interface region configured to receive the optical amplifier module 303-1-303-N. A fiber-to-interposer connection region is formed within the substrate to include the fiber-to-interposer connection 1903. A first group of optical conveyance structures is formed within the substrate to optically connect the laser source chip 102 to the silicon photonics chip 1803 when the laser source chip 102 and the silicon photonics chip 1803 are interfaced to the substrate. A second group of optical conveyance structures is formed within the substrate to optically connect the silicon photonics chip 1803 to the optical amplifier module 303-1-303-N when the silicon photonics chip 1803 and the optical amplifier module 303-1-303-N are interfaced to the substrate. A third group of optical conveyance structures is formed within the substrate to optically connect the optical amplifier module 303-1-303-N to the fiber-to-interposer connection region when the optical amplifier module 303-1-303-N is interfaced to the substrate.

In some embodiments, the first group of optical conveyance structures includes an optical marshalling module formed within the substrate. The optical marshalling module is configured to receive a plurality of laser beams of different wavelengths from the laser source chip 102 and combine the plurality of laser beams into a multi-wavelength laser light supply and convey a portion of the multi-wavelength laser light supply to each of a number of locations at the silicon photonics chip interface region that align with a corresponding number of laser light optical inputs of the silicon photonics chip 1803 when the silicon photonics chip 1803 is interfaced to the substrate. In some embodiments, the optical marshalling module includes the N×1 phase-maintaining wavelength combiner 701 having an optical output optically connected to the optical input of a 1×M phase-maintaining broadband power splitter 705, where N is a number of the plurality of laser beams and M is the number of locations at the silicon photonics chip interface region that align with the corresponding number of laser light optical input ports of the silicon photonics chip 1803. In some embodiments, the optical marshalling module includes the arrayed waveguide 801 having a plurality of optical inputs configured to receive the plurality of laser beams and having an optical output optically connected to an optical input of the broadband power splitter 805. The broadband power splitter 805 has a number of optical outputs configured to transmit light to the number of locations at the silicon photonics chip interface region that align with the corresponding number of laser light optical input ports of the silicon photonics chip 1803.

In some embodiments, the optical marshalling module includes the Echelle grating 901 having a plurality of optical inputs configured to receive the plurality of laser beams. The Echelle grating 901 having an optical output optically connected to an optical input of the broadband power splitter 905. The broadband power splitter 905 has a number of optical outputs configured to transmit light to the number of locations at the silicon photonics chip interface region that align with the corresponding number of laser light optical input ports of the silicon photonics chip 1803. In some embodiments, the optical marshalling module includes the butterfly waveguide network 1001 having a plurality of optical inputs configured to receive the plurality of laser beams and having a number of optical outputs configured to transmit light to the number of locations at the silicon photonics chip interface region that align with the corresponding number of laser light optical input ports of the silicon photonics chip 1803. In some embodiments, the optical marshalling module includes the star coupler 1101 having a plurality of optical inputs configured to receive the plurality of laser beams and having a number of optical outputs configured to transmit light to the number of locations at the silicon photonics chip interface region that align with the corresponding number of laser light optical input ports of the silicon photonics chip 1803. In some embodiments, the optical marshalling module includes a resonator ring array 1201 having a plurality of optical inputs configured to receive the plurality of laser beams and having a number of optical outputs configured to transmit light to the number of locations at the silicon photonics chip interface region that align with the corresponding number of laser light optical input ports of the silicon photonics chip 1803.

In some embodiments, the interposer device 1801/1801A/1801B/1801C includes local metal routing structures and conductive via structures formed within the substrate to provide electrical connectivity between the silicon photonics chip 1803 and another electronic device that interfaces with the substrate. In some embodiments, the silicon photonics chip interface region is configured to provide for flip-chip connection of conductive structures within the silicon photonics chip 1803 to corresponding conductive structures within the substrate. In some embodiments, the silicon photonics chip interface region is configured to provide for wire bond connection of conductive structures within the silicon photonics chip 1803 to corresponding conductive structures within the substrate. In some embodiments, the silicon photonics chip interface region is configured to provide for edge coupling of the first group of optical conveyance structures to corresponding optical inputs of the silicon photonics chip 1803 when the silicon photonics chip 1803 is interfaced to the substrate. And, the silicon photonics chip interface region is configured to provide for edge coupling of the second group of optical conveyance structures to corresponding optical outputs of the silicon photonics chip 1803 when the silicon photonics chip is interfaced to the substrate. In some embodiments, the silicon photonics chip interface region is configured to provide for vertical coupling of the first group of optical conveyance structures to corresponding optical inputs of the silicon photonics chip 1803 when the silicon photonics chip 1803 is interfaced to the substrate. And, the silicon photonics chip interface region is configured to provide for vertical coupling of the second group of optical conveyance structures to corresponding optical outputs of the silicon photonics chip 1803 when the silicon photonics chip 1803 is interfaced to the substrate.

In some embodiments, the optical amplifier module interface region is configured to provide for edge coupling of the second group of optical conveyance structures to corresponding optical inputs and/or outputs of the optical amplifier module 303-1-303-N when the optical amplifier module 303-1-303-N is interfaced to the substrate. And, the optical amplifier module interface region is configured to provide for edge coupling of the third group of optical conveyance structures to corresponding optical outputs and/or inputs of the optical amplifier module 303-1-303-N when the optical amplifier module 303-1-303-N is interfaced to the substrate. In some embodiments, the optical amplifier module interface region is configured to provide for vertical coupling of the second group of optical conveyance structures to corresponding optical inputs and/or outputs of the optical amplifier module 303-1-303-N when the optical amplifier module 303-1-303-N is interfaced to the substrate. And, the optical amplifier module interface region is configured to provide for vertical coupling of the third group of optical conveyance structures to corresponding optical outputs and/or inputs of the optical amplifier module 303-1-303-N when the optical amplifier module 303-1-303-N is interfaced to the substrate.

In some embodiments, the substrate is formed of one or more of silicon, glass, ceramic, epoxy composite, and polymer. In some embodiments, the first group of optical conveyance structures is formed of one or more of silicon, oxide, polymer, and silicon nitride, and the second group of optical conveyance structures is formed of one or more of silicon, oxide, polymer, and silicon nitride, and the third group of optical conveyance structures is formed of one or more of silicon, oxide, polymer, and silicon nitride. In some embodiments, the substrate includes multiple optical amplifier module interface regions configured to respectively receive multiple optical amplifier modules 303-1-303-N. And, the second group of optical conveyance structures is configured to optically connect the silicon photonics chip 1803 to the multiple optical amplifier modules 303-1-303-N when the silicon photonics chip 1803 and the multiple optical amplifier modules 303-1-303-N are interfaced to the substrate. And, the third group of optical conveyance structures is configured to optically connect the multiple optical amplifier modules 303-1-303-N to the fiber-to-interposer connection 1903 region.

In some embodiments, the laser source chip interface region, the silicon photonics chip interface region, and the optical amplifier module interface region are positioned in a substantially symmetrical configuration within the substrate. In some embodiments, the laser source chip interface region, the silicon photonics chip interface region, and the optical amplifier module interface region are positioned in a non-symmetrical configuration within the substrate. In some embodiments, the interposer device is integrated within a multi-chip module integrated product.

In some embodiments, a multi-chip module (MCM) is disclosed to include the interposer device 1801/1801A/1801B/1801C. The MCM also includes the laser source chip 102 connected to the interposer device 1801/1801A/1801B/1801C. The MCM also includes the silicon photonics chip 1803 connected to the interposer device 1801/1801A/1801B/1801C. In some embodiments, the silicon photonics chip 1803 is a CMOS driver chip configured to interact with silicon photonics devices formed within the interposer device 1801/1801A/1801B/1801C. The MCM also includes the optical amplifier module 303-1-303-N connected to the interposer device 1801/1801A/1801B/1801C. The interposer device 1801/1801A/1801B/1801C includes a first group of optical conveyance structures (e.g., optical waveguides 1905, 1907, and/or optical marshalling module) configured to optically connect the laser source chip 102 to the silicon photonics chip 1803. The interposer device 1801/1801A/1801B/1801C also includes a second group of optical conveyance structures (e.g., optical waveguides 1909-1-1909-N) configured to optically connect the silicon photonics chip 1803 to the optical amplifier module 303-1-303-N. The interposer device 1801/1801A/1801B/1801C also includes a third group of optical conveyance structures (e.g., optical waveguides 1915-1-1915-N, 1911, 1913, and/or polarization rotator 1901) configured to optically connect the optical amplifier module 303-1-303-N to the fiber-to-interposer connection 1903 region formed within the interposer device 1801/1801A/1801B/1801C. The fiber-to-interposer connection 1903 is configured to enable optical coupling of cores of a number of optical fibers to corresponding optical waveguides of the third group of optical conveyance structures. In some embodiments, the mechanical transfer ferrule 2301/2303 is connected to the interposer device 1801/1801A/1801B/1801C. The mechanical transfer ferrule 2301/2303 is configured to frame the fiber-to-interposer connection 1903 region and index the fiber-to-interposer connection 1903 region to the number of optical fibers.

In some embodiments, the laser source chip 102 is connected to the interposer device 1801/1801A/1801B/1801C by either flip-chip connection or wire bond connection. In some embodiments, the laser source chip 102 is configured to generate and output a plurality of laser beams of different wavelengths. In some embodiments, the first group of optical conveyance structures includes an optical marshalling module configured to receive the plurality of laser beams from the laser source chip 102 and combine the plurality of laser beams into a multi-wavelength laser light supply and convey a portion of the multi-wavelength laser light supply to each of a number of laser light optical inputs of the silicon photonics chip 1803. In some embodiments, the optical marshalling module includes the N×1 phase-maintaining wavelength combiner 701 having an optical output optically connected to an optical input of the 1×M phase-maintaining broadband power splitter 705, where N is a number of the plurality of laser beams and M is the number of laser light optical input ports of the silicon photonics chip 1803. In some embodiments, the optical marshalling module includes the arrayed waveguide 801 having a plurality of optical inputs configured to receive the plurality of laser beams and having an optical output optically connected to an optical input of the broadband power splitter 805. The broadband power splitter 805 has a number of optical outputs configured to transmit light to the number of laser light optical input ports of the silicon photonics chip 1803.

In some embodiments, the optical marshalling module includes the Echelle grating 901 having a plurality of optical inputs configured to receive the plurality of laser beams and having an optical output optically connected to an optical input of the broadband power splitter 905. The broadband power splitter 905 has a number of optical outputs configured to transmit light to the number of laser light optical input ports of the silicon photonics chip 1803. In some embodiments, the optical marshalling module includes the butterfly waveguide network 1001 having a plurality of optical inputs configured to receive the plurality of laser beams and having a number of optical outputs configured to transmit light to the number of laser light optical input ports of the silicon photonics chip 1803. In some embodiments, the optical marshalling module includes the star coupler 1101 having a plurality of optical inputs configured to receive the plurality of laser beams and having a number of optical outputs configured to transmit light to the number of laser light optical input ports of the silicon photonics chip 1803. In some embodiments, the optical marshalling module includes the resonator ring array having a plurality of optical inputs configured to receive the plurality of laser beams and having a number of optical outputs configured to transmit light to the number of laser light optical input ports of the silicon photonics chip 1803.

In some embodiments, the optical amplifier module 303-1-303-N is connected to the interposer device 1801/1801A/1801B/1801C by either flip-chip connection or wire bond connection. In some embodiments, the optical amplifier module 303-1-303-N includes a number of optical amplifiers 305-1-305-M, such that each light signal for data reception is amplified by a corresponding optical amplifier 305-1-305-M and such that each light signal for data transmission is amplified by a corresponding optical amplifier 305-1-305-M. In some embodiments, the interposer device 1801/1801A/1801B/1801C includes integrated optical isolators configured to optically isolate optical waveguides from each other. In some embodiments, the MCM includes the polarization rotator 1901 configured to receive input light from the fiber-to-interposer connection 1903 region and split both TE and TM polarizations of the input light into TE polarization. The polarization rotator 1901 is optically connected to two corresponding optical waveguides 1913 configured to direct light from the polarization rotator 1901 to the optical amplifier module 303-1-303-N. In some embodiments, the polarization rotator 1901 is a discrete component interfaced to the interposer device 1801/1801A/1801B/1801C. In some embodiments, the polarization rotator 1901 is formed within the interposer device 1801/1801A/1801B/1801C.

In some embodiments, the interposer device 1801/1801A/1801B/1801C includes a recessed region into which the laser source chip 102 is disposed to enable optical edge coupling of optical waveguides within the laser source chip 102 to corresponding optical waveguides within the first group of optical conveyance structures within the interposer device 1801/1801A/1801B/1801C. In some embodiments, optical waveguides within the laser source chip 102 are positioned within 10 micrometers of corresponding optical waveguides within the first group of optical conveyance structures within the interposer device 1801/1801A/1801B/1801C. In some embodiments, the recessed region includes a side protrusion that forms a reservoir for an underfill material (e.g., epoxy) to enable capillary underfill of the laser source chip 102. In some embodiments, the laser source chip 102 is disposed on an outer surface of the interposer device 1801/1801A/1801B/1801C such that optical waveguides within the laser source chip 102 are vertically coupled to corresponding optical waveguides within the first group of optical conveyance structures within the interposer device 1801/1801A/1801B/1801C.

In some embodiments, the interposer device includes a recessed region into which the silicon photonics chip 1803 is disposed to enable optical edge coupling of optical waveguides within the silicon photonics chip 1803 to corresponding optical waveguides within the first group of optical conveyance structures and within the second group of optical conveyance structures that are formed within the interposer device 1801/1801A/1801B/1801C. In some embodiments, the recessed region includes a side protrusion that forms a reservoir for an underfill material (e.g., epoxy) to enable capillary underfill of the silicon photonics chip 1803. In some embodiments, optical waveguides within the silicon photonics chip 1803 are positioned within 10 micrometers of corresponding optical waveguides within the first group of optical conveyance structures and within the second group of optical conveyance structures that are formed within the interposer device 1801/1801A/1801B/1801C. In some embodiments, the silicon photonics chip 1803 is disposed on an outer surface of the interposer device 1801/1801A/1801B/1801C such that optical waveguides within the silicon photonics chip 1803 are vertically coupled to corresponding optical waveguides within the first group of optical conveyance structures and within the second group of optical conveyance structures that are formed within the interposer device 1801/1801A/1801B/1801C.

In some embodiments, the interposer device 1801/1801A/1801B/1801C includes a recessed region into which the optical amplifier module 303-1-303-N is disposed to enable optical edge coupling of optical waveguides within the optical amplifier module 303-1-303-N to corresponding optical waveguides within the second group of optical conveyance structures and within the third group of optical conveyance structures that are formed within the interposer device 1801/1801A/1801B/1801C. In some embodiments, the recessed region includes a side protrusion that forms a reservoir for an underfill material (e.g., epoxy) to enable capillary underfill of the optical amplifier module 303-1-303-N. In some embodiments, optical waveguides within the optical amplifier module 303-1-303-N are positioned within 10 micrometers of corresponding optical waveguides within the second group of optical conveyance structures and within the third group of optical conveyance structures that are formed within the interposer device 1801/1801A/1801B/1801C. In some embodiments, the optical amplifier module 303-1-303-N is disposed on an outer surface of the interposer device 1801/1801A/1801B/1801C such that optical waveguides within the optical amplifier module 303-1-303-N are vertically coupled to corresponding optical waveguides within the second group of optical conveyance structures and within the third group of optical conveyance structures that are formed within the interposer device 1801/1801A/1801B/1801C.

In some embodiments, a mechanical transfer (MT) ferrule is disclosed. The MT ferrule includes a top half member (2301) including a top alignment key (2305). The MT ferrule also includes a bottom half member (2303) including a bottom alignment key (2305). The top and bottom alignment keys (2305) are configured to fit together to provide for alignment and fitting of the top half member (2301) with the bottom half member (2303). Each of the top half member (2301) and the bottom half member (2303) is configured to receive a peripheral portion of the interposer device 1801/1801A/1801B/1801C between the top half member (2301) and the bottom half member (2303), such that optical waveguides exposed at an edge of the peripheral portion of the interposer device 1801/1801A/1801B/1801C are exposed at a location between the top half member (2301) and the bottom member (2303) when the top half member (2301) is fitted to the bottom half member (2303). In some embodiments, the top half member (2301) and the bottom half member (2303) are formed of silicon, glass, or plastic. In some embodiments, the top half member (2301) includes at least one top partial hole (2307) and the bottom half member (2303) includes at least one bottom partial hole (2309). The at least one top partial hole (2307) and the at least one bottom partial hole (2309) are configured to respectively form at least one complete alignment hole (see FIG. 23F) when the top half member (2301) is fitted with the bottom half member (2303) with the peripheral portion of the interposer device 1801/1801A/1801B/1801C between the top half member (2301) and the bottom half member (2303). The at least one alignment hole is configured to provide for alignment of the MT ferrule with another connector structure.

Figure 27:
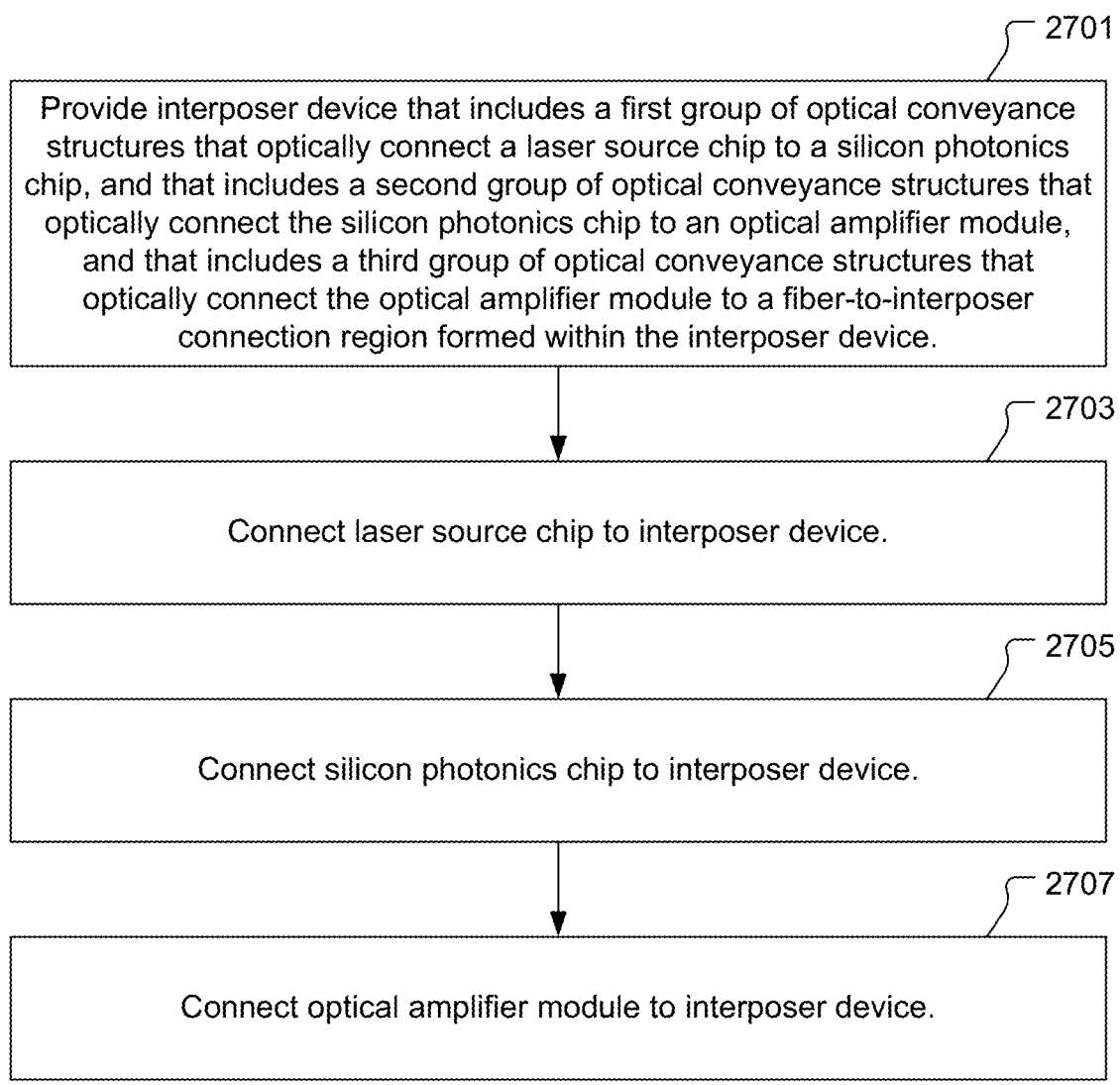
FIG. 27 shows a flowchart of a method for manufacturing a multi-chip module (MCM), in accordance with some embodiments of the present invention.

FIG. 27 shows a flowchart of a method for manufacturing a multi-chip module (MCM), in accordance with some embodiments of the present invention. The method includes an operation 2701 for providing an interposer device (1801/1801A/1801B/1801C). The method also includes an operation 2703 for connecting a laser source chip (102) to the interposer device (1801/1801A/1801B/1801C). The method also includes an operation 2705 for connecting a silicon photonics chip (1803) to the interposer device (1801/1801A/1801B/1801C). The method also includes 2707 for connecting an optical amplifier module (303-1-303-N) to the interposer device (1801/1801A/1801B/1801C). The interposer device (1801/1801A/1801B/1801C) includes a first group of optical conveyance structures that optically connect the laser source chip (102) to the silicon photonics chip (1803). The interposer device (1801/1801A/1801B/1801C) includes a second group of optical conveyance structures that optically connect the silicon photonics chip (1803) to the optical amplifier module (303-1-303-N). The interposer device (1801/1801A/1801B/1801C) includes a third group of optical conveyance structures that optically connect the optical amplifier module (303-1-303-N) to a fiber-to-interposer connection (1903) region formed within the interposer device (1801/1801A/1801B/1801C). In some embodiments, the method includes an operation for connecting a mechanical transfer ferrule (2301/2303) to the interposer device (1801/1801A/1801B/1801C) such that the mechanical transfer ferrule (2301/2303) frames the fiber-to-interposer connection (1903) region and indexes the fiber-to-interposer connection (1903) region for connection to a number of optical fibers.

In some embodiments, the method includes forming local metal routing structures and conductive via structures within the interposer device (1801/1801A/1801B/1801C) to provide electrical connectivity between the silicon photonics chip (1803) and another electronic device that interfaces with the interposer device (1801/1801A/1801B/1801C). In some embodiments, the laser source chip (102) is connected to the interposer device (1801/1801A/1801B/1801C) by either flip-chip connection or wire bond connection. In some embodiments, the silicon photonics chip (1803) is connected to the interposer device (1801/1801A/1801B/1801C) by either flip-chip connection or wire bond connection. In some embodiments, the optical amplifier module (303-1-303-N) is connected to the interposer device (1801/1801A/1801B/1801C) by either flip-chip connection or wire bond connection.

In some embodiments, the method includes forming the first group of optical conveyance structures to include an optical marshalling module configured to receive a plurality of laser beams from the laser source chip (102) and combine the plurality of laser beams into a multi-wavelength laser light supply and convey a portion of the multi-wavelength laser light supply to each of a number of laser light optical inputs of the silicon photonics chip (1803). In some embodiments, the method includes forming integrated optical isolators within the interposer device (1801/1801A/1801B/1801C) to optically isolate optical waveguides from each other within the interposer device (1801/1801A/1801B/1801C). In some embodiments, the method includes optically connecting a polarization rotator (1901) between the fiber-to-interposer connection (1903) region and the optical amplifier module (303-1-303-N). The polarization rotator (1901) is configured to receive input light from the fiber-to-interposer connection (1903) region and split both TE and TM polarizations of the input light into TE polarization. The polarization rotator (1901) is optically connected to two corresponding optical waveguides (1913) configured to direct light from the polarization rotator (1901) to the optical amplifier module (303-1-303-N). In some embodiments, the polarization rotator (1901) is a discrete component interfaced to the interposer device (1801/1801A/1801B/1801C). In some embodiments, the polarization rotator (1901) is formed within the interposer device (1801/1801A/1801B/1801C).

In some embodiments, the method includes forming a recessed region within the interposer device (1801/1801A/1801B/1801C) to receive the laser source chip (102). In some embodiments, the recessed region is configured to enable optical edge coupling of optical waveguides within the laser source chip (102) to corresponding optical waveguides within the first group of optical conveyance structures. In some embodiments, connecting the laser source chip (102) to the interposer device (1801/1801A/1801B/1801C) includes positioning the laser source chip (102) within 10 micrometers of corresponding optical waveguides within the first group of optical conveyance structures that are formed within the interposer device (1801/1801A/1801B/1801C). In some embodiments, the recessed region is formed to include a side protrusion that forms a reservoir for an underfill material (e.g., epoxy) to enable capillary underfill of the laser source chip (102). In some embodiments, connecting the laser source chip (102) to the interposer device (1801/1801A/1801B/1801C) includes positioning the laser source chip (102) on an outer surface of the interposer device (1801/1801A/1801B/1801C) such that optical waveguides within the laser source chip (102) are vertically coupled to corresponding optical waveguides within the first group of optical conveyance structures.

In some embodiments, the method includes forming a recessed region within the interposer device (1801/1801A/1801B/1801C) to receive the silicon photonics chip (1803). In some embodiments, the recessed region is configured to enable optical edge coupling of optical waveguides within the silicon photonics chip (1803) to corresponding optical waveguides within the first group of optical conveyance structures and within the second group of optical conveyance structures that are formed within the interposer device (1801/1801A/1801B/1801C). In some embodiments, connecting the silicon photonics chip (1803) to the interposer device (1801/1801A/1801B/1801C) includes positioning the silicon photonics chip (102) within 10 micrometers of corresponding optical waveguides within the first group of optical conveyance structures and within the second group of optical conveyance structures that are formed within the interposer device (1801/1801A/1801B/1801C). In some embodiments, the recessed region is formed to include a side protrusion that forms a reservoir for an underfill material (e.g., epoxy) to enable capillary underfill of the silicon photonics chip (1803). In some embodiments, connecting the silicon photonics chip (1803) to the interposer device (1801/1801A/1801B/1801C) includes positioning the silicon photonics chip (1803) on an outer surface of the interposer device (1801/1801A/1801B/1801C) such that optical waveguides within the silicon photonics chip (1803) are vertically coupled to corresponding optical waveguides within the first group of optical conveyance structures and within the second group of optical conveyance structures that are formed within the interposer device (1801/1801A/1801B/1801C).

In some embodiments, the method includes forming a recessed region within the interposer device (1801/1801A/1801B/1801C) to receive the optical amplifier module (303-1-303-N). In some embodiments, the recessed region is configured to enable optical edge coupling of optical waveguides within the optical amplifier module (303-1-303-N) to corresponding optical waveguides within the second group of optical conveyance structures and within the third group of optical conveyance structures that are formed within the interposer device (1801/1801A/1801B/1801C). In some embodiments, connecting the optical amplifier module (303-1-303-N) to the interposer device (1801/1801A/1801B/1801C) includes positioning the optical amplifier module (303-1-303-N) within 10 micrometers of corresponding optical waveguides within the second group of optical conveyance structures and within the third group of optical conveyance structures that are formed within the interposer device (1801/1801A/1801B/1801C). In some embodiments, the recessed region is formed to include a side protrusion that forms a reservoir for an underfill material (e.g., epoxy) to enable capillary underfill of the optical amplifier module (303-1-303-N). In some embodiments, connecting the optical amplifier module (303-1-303-N) to the interposer device (1801/1801A/1801B/1801C) includes positioning the optical amplifier module (303-1-303-N) on an outer surface of the interposer device (1801/1801A/1801B/1801C) such that optical waveguides within the optical amplifier module (303-1-303-N) are vertically coupled to corresponding optical waveguides within the second group of optical conveyance structures and within the third group of optical conveyance structures that are formed within the interposer device (1801/1801A/1801B/1801C).

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

Although the foregoing invention has been described in some detail for purposes of clarity of understanding, it will be apparent that certain changes and modifications can be practiced. Accordingly, the present embodiments are to be considered as illustrative and not restrictive, and the invention is not to be limited to the details given herein, but may be modified within the scope and equivalents of the described embodiments.

What is claimed is:
1. A multi-chip module, comprising:
a polarization rotator;
a silicon photonics chip, wherein the silicon photonics chip and the polarization rotator are formed as separate components; and
an interposer, the polarization rotator attached to the interposer, the silicon photonics chip attached to the interposer, the interposer including a fiber-to-interposer connection region, the interposer including a first set of optical waveguides configured to optically connect the fiber-to-interposer connection region to the polarization rotator, the interposer including a second set of optical waveguides configured to optically connect the polarization rotator to the silicon photonics chip.

2. The multi-chip module as recited in claim 1, wherein the polarization rotator is electrically connected to a first set of electrical conductors formed within the interposer.

3. The multi-chip module as recited in claim 2, wherein the polarization rotator is flip-chip bonded to the interposer.

4. The multi-chip module as recited in claim 2, wherein the silicon photonics chip is electrically connected to a second set of electrical conductors formed within the interposer.

5. The multi-chip module as recited in claim 4, wherein the silicon photonics chip is flip-chip bonded to the interposer.

6. The multi-chip module as recited in claim 1, wherein the polarization rotator is configured to receive incoming light from the first set of optical waveguides, the polarization rotator configured to split the incoming light into a first portion of light having a first polarization and a second portion of light having a second polarization, the polarization rotator configured to rotate the second portion of light from the second polarization to the first polarization, the polarization rotator optically connected to convey the first portion of light having the first polarization into a first optical waveguide of the second set of optical waveguides, the polarization rotator optically connected to convey the second portion of light having the first polarization into a second optical waveguide of the second set of optical waveguides.

7. The multi-chip module as recited in claim 1, wherein at least a portion of the polarization rotator is integrated within the interposer.

8. The multi-chip module as recited in claim 1, further comprising:
a set of optical amplifiers respectively optically coupled to the second set of optical waveguides, the set of optical amplifiers configured to amplify light signals traveling through the second set of optical waveguides.

9. The multi-chip module as recited in claim 1, wherein the silicon photonics chip is recessed into the interposer.

10. The multi-chip module as recited in claim 9, wherein the second set of optical waveguides is edge coupled to respective optical waveguides within the silicon photonics chip.

11. The multi-chip module as recited in claim 9, wherein a recess formed within the silicon photonics chip to receive the interposer is formed to have a side protrusion, such that the silicon photonics chip does not cover the side protrusion.

12. The multi-chip module as recited in claim 11, further comprising:
an epoxy material disposed within the side protrusion.

13. The multi-chip module as recited in claim 1, wherein the polarization rotator is recessed into the interposer.

14. The multi-chip module as recited in claim 13, wherein the first set of optical waveguides is edge coupled to respective optical waveguides within the polarization rotator, or the second set of optical waveguides is edge coupled to respective optical waveguides within the polarization rotator, or both the first set of optical waveguides and the second set of optical waveguides are edge coupled to respective optical waveguides within the polarization rotator.

15. The multi-chip module as recited in claim 13, wherein a recess formed within the silicon photonics chip to receive the polarization rotator is formed to have a side protrusion, such that the polarization rotator does not cover the side protrusion.

16. The multi-chip module as recited in claim 15, further comprising:
an epoxy material disposed within the side protrusion.

17. The multi-chip module as recited in claim 1, wherein the interposer includes a third set of optical waveguides configured to optically connect the fiber-to-interposer connection region to the silicon photonics chip.

18. The multi-chip module as recited in claim 17, further comprising:
a set of optical amplifiers respectively optically coupled to the third set of optical waveguides, the set of optical amplifiers configured to amplify light signals traveling through the third set of optical waveguides.

19. The multi-chip module as recited in claim 1, further comprising:
an electronic device attached to the interposer, wherein the interposer includes at least one through-glass-via configured to provide electrical connectivity between the silicon photonics chip and the electronic device.

20. The multi-chip module as recited in claim 19, wherein the electronic device and the silicon photonics chip are attached to opposite sides of the interposer.

* * * * *